(12) United States Patent
Moustakas et al.

(10) Patent No.: US 8,035,113 B2
(45) Date of Patent: Oct. 11, 2011

(54) OPTICAL DEVICES FEATURING TEXTURED SEMICONDUCTOR LAYERS

(75) Inventors: Theodore D. Moustakas, Dover, MA (US); Jasper S. Cabalu, Cary, NC (US)

(73) Assignee: The Trustees of Boston University, Boston, MA (US)

( * ) Notice: Subject to any disclaimer, the term of this patent is extended or adjusted under 35 U.S.C. 154(b) by 312 days.

(21) Appl. No.: 11/590,687

(22) Filed: Oct. 31, 2006

(65) Prior Publication Data

US 2007/0120141 A1   May 31, 2007

Related U.S. Application Data

(63) Continuation-in-part of application No. 11/107,150, filed on Apr. 15, 2005, and a continuation-in-part of application No. PCT/US2005/012849, filed on Apr. 15, 2005.

(60) Provisional application No. 60/732,034, filed on Oct. 31, 2005, provisional application No. 60/562,489, filed on Apr. 15, 2004, provisional application No. 60/615,047, filed on Oct. 1, 2004, provisional application No. 60/645,704, filed on Jan. 21, 2005.

(51) Int. Cl.
*H01L 27/15* (2006.01)

(52) U.S. Cl. ............... 257/79; 257/82; 257/98; 257/99; 257/103; 257/E33.012

(58) Field of Classification Search ............... 257/79, 257/103, 99, E33.012, 98, 82
See application file for complete search history.

(56) References Cited

U.S. PATENT DOCUMENTS

| | | | |
|---|---|---|---|
| 4,147,564 A | 4/1979 | Magee et al. | 148/1.5 |
| 4,342,944 A | 8/1982 | SpringThorpe | 313/499 |
| 4,664,748 A | 5/1987 | Ueno et al. | 156/659.1 |
| 5,040,044 A | 8/1991 | Noguchi et al. | 357/52 |
| 5,248,621 A | 9/1993 | Sano | 437/3 |
| 5,309,001 A | 5/1994 | Watanabe et al. | 257/99 |
| 5,456,762 A | 10/1995 | Kariya et al. | |
| 5,684,309 A | 11/1997 | McIntosh et al. | 257/191 |
| 5,779,924 A | 7/1998 | Krames et al. | 216/24 |
| 5,814,839 A * | 9/1998 | Hosoba | 257/96 |

(Continued)

FOREIGN PATENT DOCUMENTS

JP     60173829    9/1985

(Continued)

OTHER PUBLICATIONS

Sharma et al., "Outlook for High Efficiency Solar Cells to Be Used With and Without Concentration", Energy Conyers. Mgmt. vol. 36 (4), 1995 Elsevier Science Ltd., pp. 239-255.

(Continued)

*Primary Examiner* — David Vu
*Assistant Examiner* — Brandon Fox
(74) *Attorney, Agent, or Firm* — Weingarten, Schurgin, Gagnebin & Lebovici LLP

(57) ABSTRACT

A semiconductor sensor, solar cell or emitter, or a precursor therefor, has a substrate and one or more textured semiconductor layers deposited onto the substrate. The textured layers enhance light extraction or absorption. Texturing in the region of multiple quantum wells greatly enhances internal quantum efficiency if the semiconductor is polar and the quantum wells are grown along the polar direction. Electroluminescence of LEDs of the invention is dichromatic, and results in variable color LEDs, including white LEDs, without the use of phosphor.

36 Claims, 53 Drawing Sheets

U.S. PATENT DOCUMENTS

| | | | |
|---|---|---|---|
| 5,891,264 A | 4/1999 | Shinohara et al. | 136/261 |
| 5,977,477 A | 11/1999 | Shiozaki | 136/256 |
| 5,986,204 A | 11/1999 | Iwasaki et al. | 136/256 |
| 5,990,496 A | 11/1999 | Kunisato et al. | |
| 6,091,083 A * | 7/2000 | Hata et al. | 257/79 |
| 6,099,970 A | 8/2000 | Bruno et al. | 428/432 |
| 6,133,589 A | 10/2000 | Krames et al. | 257/103 |
| 6,163,038 A * | 12/2000 | Chen et al. | 257/103 |
| 6,229,151 B1 * | 5/2001 | Takeuchi et al. | 257/14 |
| 6,252,261 B1 | 6/2001 | Usui et al. | |
| 6,258,618 B1 | 7/2001 | Lester | 438/46 |
| 6,285,698 B1 | 9/2001 | Romano et al. | 372/46 |
| 6,291,839 B1 | 9/2001 | Lester | 257/91 |
| 6,294,440 B1 | 9/2001 | Tsuda et al. | |
| 6,328,456 B1 | 12/2001 | Mize | 362/311 |
| 6,376,864 B1 | 4/2002 | Wang | 257/98 |
| 6,468,347 B1 | 10/2002 | Motoki et al. | |
| 6,469,324 B1 | 10/2002 | Wang | 257/98 |
| 6,486,499 B1 | 11/2002 | Krames et al. | 257/81 |
| 6,495,862 B1 | 12/2002 | Okazaki et al. | 257/103 |
| 6,518,598 B1 | 2/2003 | Chen | 257/91 |
| 6,534,336 B1 | 3/2003 | Iwane et al. | 438/71 |
| 6,628,249 B1 * | 9/2003 | Kamikawa et al. | 345/44 |
| 6,649,943 B2 * | 11/2003 | Shibata et al. | 257/189 |
| 6,733,591 B2 | 5/2004 | Anderson | |
| 6,870,191 B2 | 3/2005 | Niki et al. | |
| 7,348,600 B2 * | 3/2008 | Narukawa et al. | 257/79 |
| 2001/0000209 A1 | 4/2001 | Krames et al. | 257/94 |
| 2002/0046693 A1 | 4/2002 | Kiyoku et al. | |
| 2002/0070386 A1 | 6/2002 | Krames et al. | 257/94 |
| 2002/0074552 A1 | 6/2002 | Weeks, Jr. et al. | |
| 2002/0123163 A1 | 9/2002 | Fujii | 438/26 |
| 2002/0127751 A1 | 9/2002 | Gardner et al. | 438/22 |
| 2002/0134985 A1 | 9/2002 | Chen et al. | 257/79 |
| 2002/0145148 A1 * | 10/2002 | Okuyama et al. | 257/88 |
| 2002/0180351 A1 | 12/2002 | McNulty et al. | 313/512 |
| 2002/0197764 A1 * | 12/2002 | Uemura et al. | 438/79 |
| 2003/0057444 A1 | 3/2003 | Niki et al. | 257/200 |
| 2003/0075723 A1 | 4/2003 | Heremans et al. | 257/98 |
| 2003/0085411 A1 | 5/2003 | Shibata et al. | |
| 2003/0178702 A1 * | 9/2003 | Sawaki et al. | 257/622 |
| 2003/0183827 A1 | 10/2003 | Kawaguchi et al. | |
| 2004/0113163 A1 | 6/2004 | Steigerwald et al. | |
| 2004/0113167 A1 | 6/2004 | Bader et al. | |
| 2005/0095768 A1 | 5/2005 | Tsuda et al. | |
| 2005/0185419 A1 * | 8/2005 | Holman et al. | 362/561 |
| 2006/0054905 A1 | 3/2006 | Schwach et al. | 257/89 |
| 2006/0175624 A1 | 8/2006 | Sharma et al. | 257/94 |

FOREIGN PATENT DOCUMENTS

| | | |
|---|---|---|
| JP | 11-274568 | 10/1999 |
| WO | WO 02/065553 | 8/2002 |
| WO | WO 2005/064666 | 7/2005 |

OTHER PUBLICATIONS

Sun et al., "Enhancement of light extraction of GaN-based light-emitting diodes with a microstructure array", XP-002453008, *Opt. Eng.* 43 (8) (Aug. 2004), pp. 1700-1701.

Pan et al., "Improvement of InGaN-GaN Light-Emitting Diodes With Surface-Textured Indium-Tin-Oxide Transparent Ohmic Contacts", XP-002453009, *IEEE Photonics Technology Letters*, vol. 15 (5), May 2003, pp. 649-651.

Deckman et al; "Molecular-Scale Microporous Superlattices", *MRS Bulletin*, 1987, pp. 24-26.

Yamada et al.; "InGaN-Based Near-Ultraviolet and Blue-Light-Emitting Diodes with High External Quantum Efficiency Using a Patterned Sapphire Substrate and a Mesh Electrode", *The Japan Society of Applied Physics*, 41 (2002), pp. L1431-L1433.

Tadatomo et al., "High Output Power InGaN Ultraviolet Light-Emitting Diodes Fabricated on Patterned Substrates Using Metalorganic Vapor Phase Epitaxy", *The Japan Society of Applied Physics*, 40 (2001), pp. L583-L585.

Schnitzer et al., "30% external quantum efficiency from surface textured, thin-film light-emitting diodes", *Appl. Phys. Lett.*, 63, (16), 1993, pp. 2174-2176.

Windisch et al., "Light-Extraction Mechanisms in High-Efficiency Surface-Textured Light-Emitting Diodes", *IEEE Journal on Selected Topics in Quantum Electronics*, 8 (2), 2002, pp. 248-255.

* cited by examiner

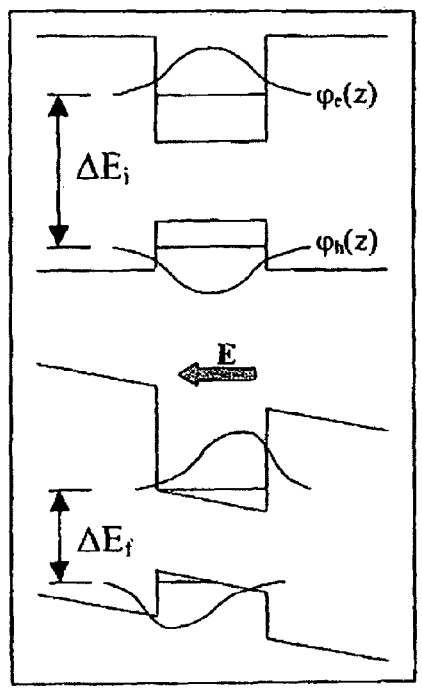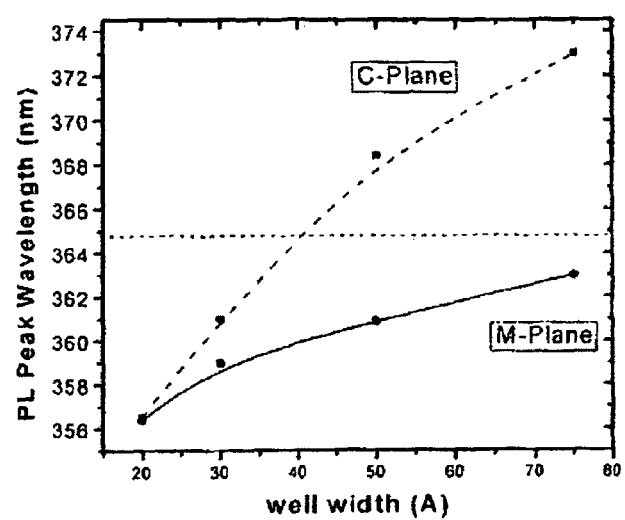
*FIG. 40a*  *FIG. 40b*

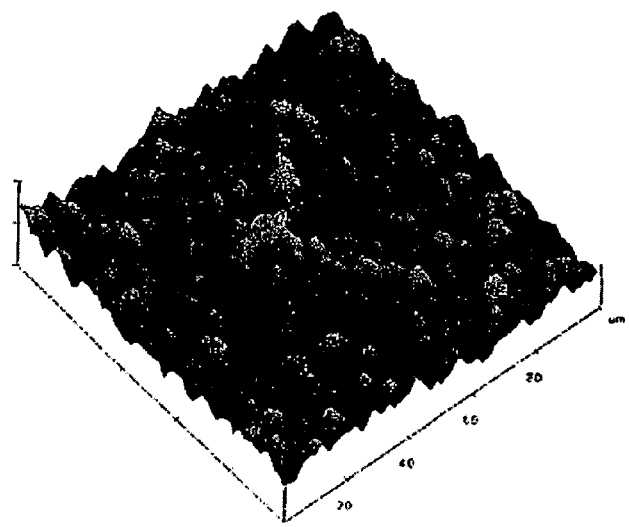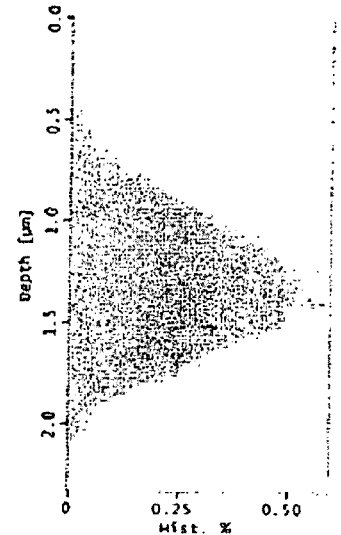
*FIG. 41a*  *FIG. 41b*
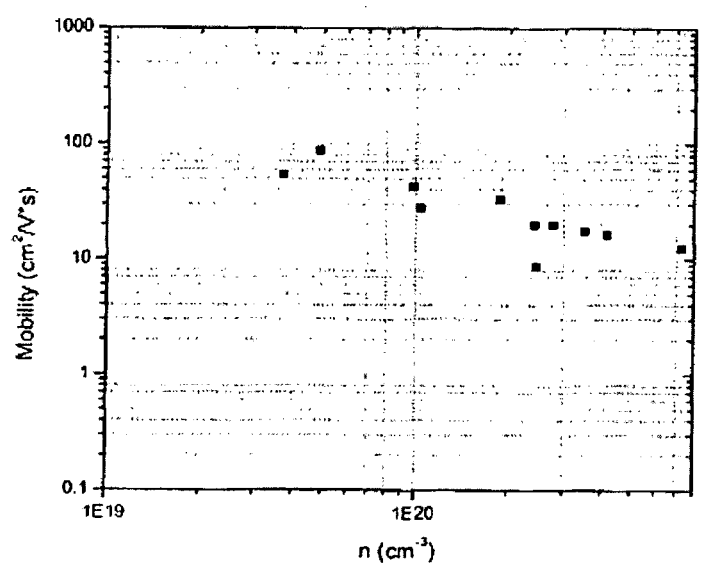
*FIG. 42*

US 8,035,113 B2

OPTICAL DEVICES FEATURING TEXTURED SEMICONDUCTOR LAYERS

CROSS REFERENCE TO RELATED APPLICATIONS

This application claims the priority of U.S. Provisional Application No. 60/732,034 filed Oct. 31, 2005 and entitled, OPTICAL DEVICES FEATURING TEXTURED SEMMICONDUCTOR LAYERS. This application is also a continuation-in-part of pending U.S. application Ser. No. 11/107,150 filed Apr. 15, 2005 and entitled OPTICAL DEVICES FEATURING TEXTURED SEMICONDUCTOR LAYERS, which claims the priority of U.S. Provisional Application No. 60/562,489 filed Apr. 15, 2004 and entitled, FORMATION OF TEXTURED III-NITRIDE TEMPLATES FOR THE FABRICATION OF EFFICIENT OPTICAL DEVICES, U.S. Provisional Application No. 60/615,047 filed Oct. 1, 2004 and entitled, FORMATION OF TEXTURED III-NITRIDE TEMPLATES FOR THE FABRICATION OF EFFICIENT OPTICAL DEVICES, and U.S. Provisional Application No. 60/645,704 filed Jan. 21, 2005 and entitled, NITRIDE LEDS BASED ON FLAT AND WRINKLED QUANTUM WELLS. Further, this application is a continuation-in-part of PCT/US/2005/012849 filed Apr. 15, 2005 and entitled OPTICAL DEVICES FEATURING TEXTURED SEMMICONDUCTOR LAYERS. Each of the above listed earlier applications is hereby incorporated by reference herein.

STATEMENT REGARDING FEDERALLY SPONSORED RESEARCH OR DEVELOPMENT

Part of the work leading to this invention was carried out with United States Government support provided under Contract No. DAAD19-00-2-0004 awarded by United States Army Research Office and Grant No DE-FC26-04NT42275 from the United States Department of Energy. Thus, the United States Government has certain rights in this invention.

BACKGROUND OF THE INVENTION

A light emitting diode (LED) is a semiconductor optical device capable of producing light in the infrared, visible or ultraviolet (UV) region. LEDs emitting in the visible and ultraviolet are made using gallium nitride (GaN) and its alloys with indium nitride (InN) and aluminum nitride (AlN). These devices generally consist of p and n-type semiconductor layers arranged into a p-n junction. In a standard LED device, semiconductor layers are evenly grown onto a polished substrate such as GaAs or sapphire. A typical semiconductor layer is composed of gallium nitride (GaN) that has been doped to be a p or n-type layer.

Important figures of merit for an LED are its internal quantum efficiency (IQE) and light extraction efficiency. For a typical LED the IQE depends on many factors, such as the concentration of point defect, Auger processes and device design. In the case of nitride LEDs grown along polar (0001) and (000-1) directions the internal efficiency is also reduced due to the distortion of the quantum wells between the n- and p-doped layers caused by the internal electric fields. The light extraction efficiency of standard LEDs based on GaN is determined from Snell's law to be 4% per surface. An LED commonly includes several quantum wells made of a small energy gap semiconductor (well) and a wider bandgap semiconductor (barrier). Visible LEDs employ indium gallium nitride (InGaN) as the well and GaN as the barrier. Ultraviolet LEDs employ AlGaN of different compositions as both wells and barriers. The IQE of an LED device based on nitride semiconductors grown along polar direction is reduced by electric fields across its quantum wells. This phenomenon is referred to as the quantum confined Stark effect (QCSE). The QCSE affects LED light emission by red shifting the emission wavelength and reducing photoluminescence intensity. The rather small value of light extraction efficiency in the standard LED is the result of the high refraction index of the semiconductor layer at the exit interface.

A number of approaches have been proposed to enhance the extraction of light from LEDs. For example, in GaAs LEDs, the extraction of light is affected by the absorption of the emitted light in the GaAs substrate. To mitigate this problem, one can use epitaxial lift-off and wafer bonding methods to transfer the GaAs LED structure to transparent substrates. Another approach involving the optimization of LED surface geometry (such as the truncated inverted pyramid), combined with the use of substrate mirrors, has pushed the extraction limit to 30%. Other approaches involve the use of a continuously variable refraction index transparent material to reduce the back-reflection at the interface. Some of these approaches have some manufacturing limitations and the last one suffers from fast index-material degradation with time.

An approach that is recently becoming increasingly attractive is photon extraction from randomly micro-textured thin film surfaces. It has significantly improved extraction efficiency, with record external quantum efficiencies of 44% demonstrated at room temperature for GaAs based LEDs (Windish et al., 2000). In this reference, the textured surface was formed after the growth of the LED using lithographic methods. It turns out that, even in that case, most of the photons are still extracted from within the emission cone inside the critical angle corresponding to a flat surface. Consequently there is still a wide room for improving extraction well beyond the present values.

Visible and UV LEDs based on GaN and other III-nitride materials are used widely for full color displays, automotive lighting, consumer electronics backlighting, traffic lights, and white LEDs for solid state lighting. A variety of approaches are used towards formation of white LEDs. One approach is the utilization of three-color LEDs (RGB) and an alternative approach using hybrid methods such as UV LEDs in combination with a tri-color phosphor or blue and blue/red LEDs with two or one color phosphor. Current white LED performance has reached 30 lm/W, while efficiency more than 200 lm/W is required for commercially attractive semiconductor lighting.

The current IQE for electron-hole pair conversion to photons of nitride LEDs is ~21% (Tsao, 2002). Thus the IQE needs to be increased to 60%-70% for applications related to solid-state lighting. To accomplish this, a number of improvements in the current state of the art are required. For example, band-gap engineering (quantum wells, quantum dots) must be involved to optimize carrier-to-photon conversion. Also, improvements in the various layers of an LED structure are required to reduce the defect density and thus improve carrier transport to the active region. Such improvements reduce parasitic heating and lead to device longevity, enhanced color stability, and reduced consumer cost over lifetime.

SUMMARY OF THE INVENTION

The present invention provides a device for use as a light emitter or sensor or as a solar cell. For an emitter of the invention based on polar semiconductors such as III-nitrides, the IQE and light extraction efficiency is improved over conventional devices. For a sensor or solar cell, the efficiency of coupling light into the device is also improved. In one embodiment, the semiconductor material is deposited in layers, starting with as grown textured initial semiconductor layer deposited onto a substrate. In one embodiment, the layer is randomly textured as grown on the substrate so as to have a textured surface morphology. The substrate and textured layer can be used as a template for the growth of multiple semiconductor layers. For example, a device may comprise a second layer deposited onto the first textured layer. These layers can be deposited with p and n dopants to form a p-n junction LED. The textured emitting layer enhances light escape. The initial semiconductor layer preferably serves as a barrier layer onto which a quantum well layer is grown. Each of the semiconductor layers conforms to the texture of the first grown layer and thus the external surface of the LED from where the light is extracted has approximately the same texture as the initial semiconductor layer.

Preferably, multiple quantum wells comprising a plurality of barrier and quantum well layers are deposited on one another as alternating semiconductor layers each replicating the original texture. The texturing replicated through the barrier and well layers repositions the quantum wells so that their surfaces are not perpendicular to the [0001] polar direction. Thus the quantum wells maintain almost their square well shape, since they are not distorted by internal fields due to polarization. As a result the hole and electron wavefunctions overlap, leading to efficient recombination and thus drastically improving the IQE.

Devices of the invention can comprise substrates such as silicon (Si), gallium arsenide (GaAs), gallium nitride (GaN), aluminum nitride (AlN), indium nitride (InN), aluminum gallium nitride (AlGaN), indium gallium nitride, indium aluminum nitride, indium gallium aluminum nitride (InAlGaN), silicon carbide, zinc oxide, sapphire, and glass. The sapphire substrate may also undergo nitridation before a layer is deposited thereon.

Semiconductor layers grown on the GaN template, or on another layer in the total growth process, can be deposited by any suitable process. Examples of such deposition processes include hydride vapor phase epitaxy (HVPE), molecular beam epitaxy (MBE), metal-organic chemical vapor deposition (MOCVD), liquid phase epitaxy and laser ablation. A layer of a semiconductor device may comprise III-nitride materials such as GaN, AlN InN or any combination of these materials. The substrate may be textured before layer growth or by choosing appropriate conditions of growth such that the first semiconductor layer on the substrate has a textured surface.

The semiconductor layer can comprise a dopant so that the layer is p or n-type. Exemplary dopants include beryllium, selenium, germanium, magnesium, zinc, calcium, Si, sulfur, oxygen or a combination of these dopants. A layer may also be a mono or poly crystalline layer. A device of the invention also can include several p and n-type layers and one or more buffer layers, which generally aid layer growth. An exemplary buffer layer is a GaN semiconductor layer. A buffer layer may be deposited onto a substrate or between semiconductor layers.

The semiconductor layer for a device of the invention may be deposited to be from about 10 angstroms (Å) to 100 microns (µm) thick. The texturing of a GaN template and the deposited layers have an average peak-to-valley distance of about 100 nanometers (nm) to 5 µm.

The present invention also provides a method of fabricating a semiconductor device of the invention. The method comprises providing a substrate and growing a first semiconductor layer on the surface of the substrate. The first layer can be randomly textured spontaneously as grown or randomly textured by a textured substrate surface. The substrate or first layer can then be used as a template to deposit other semiconductor layers having the same texture as the template. In a preferred embodiment, a fabrication method includes growing several quantum wells. The multiple quantum wells are textured by the first layer, substrate or a combination thereof.

DESCRIPTION OF THE DRAWINGS

Other features and advantages of the present invention will be apparent from the detailed description of the invention that follows, taken in conjunction with the accompanying drawings of which:

FIG. 9 is a comparison of photoluminescence between a conventional GaN layer and the textured template of FIG. 8a;

FIG. 10a is an atomic force microscope (AFM) image of the textured template of FIG. 8a.

FIGS. 11 and 12 show photoluminescence spectra of conventional, smooth quantum wells (FIG. 11) and textured quantum wells (FIG. 12) grown on the textured template of FIG. 8a;

FIG. 13 is an electroluminescence spectrum of a p-n junction LED device comprising the textured template of FIG. 8a;

FIG. 25b is a roughness analysis of the textured template in FIG. 25a;

FIG. 26a shows depth analysis of the textured template in FIG. 25a; FIG. 26b shows spectral density analysis of the textured template in FIG. 25a;

FIG. 27b is a roughness analysis of the textured template in FIG. 27a;

FIG. 28a shows depth analysis of the textured template in FIG. 27a; FIG. 28b shows spectral density analysis of the textured template in FIG. 27a;

FIG. 29b is a roughness analysis of the textured template in FIG. 29a;

FIG. 30a shows depth analysis of the textured template in FIG. 29a; FIG. 30b shows spectral density analysis of the textured template in FIG. 29a;

FIG. 31b is a roughness analysis of the textured template in FIG. 31a;

FIG. 32a shows depth analysis of the textured template in FIG. 32a; FIG. 32b shows spectral density analysis of the textured template in FIG. 31a;

FIG. 34 shows the peak intensity versus rms roughness for the textured templates in FIGS. 25a, 27a, 29a, and 31a;

FIG. 40a shows the effect of quantum well distortion; FIG. 40b shows photoluminescence peak position of AlGaN/GaN MQWs grown along the non-polar (M-plane) and the polar (C-plane) direction;

FIG. 41a shows an AFM scan of a textured template surface; FIG. 41b shows depth analysis of the AFM data from FIG. 41a;

FIG. 42 shows a plot of electron mobility versus electron concentration for textured GaN templates;

DETAILED DESCRIPTION OF THE INVENTION

An LED or photodetector of the present invention has improvement in one or both of light external extraction efficiency and IQE. Light extraction efficiency is improved with a textured emitting surface which is typically replicated through the process of applying layers from an initial semiconductor substrate layer. Further, an LED of the invention has a dichromatic electroluminescence spectrum whose color is controlled by the bias current through the LED.

Control over growth rate and use of appropriate deposition procedures will form a textured surface layer on the initial substrate. This texture is replicated through subsequent layers as they are applied resulting in an emitting layer that has greatly improved light extraction efficiency. Final surface texturing can also be achieved by separately texturing the underlying substrate or using an unpolished substrate which is decorated with deep groves since the wafers are usually cut from an ingot using a saw.

Improvement in IQE of an LED is achieved through the incorporation of multiple quantum wells (MQWs), in the p-n junction. This results in better confinement of injected electrons and holes from the n- and p-sides respectively and thus more efficient recombination.

When a semiconductor device containing quantum wells is grown on a polar orientation the quantum wells resulting are distorted, resulting in separation of the holes and electrons. This places the electron-hole regions farther apart, reducing the efficiency of hole-electron recombination for the generation of light. The LED of the invention overcomes this deficiency by growing the quantum wells on a textured surface. This way the quantum wells are not distorted, and thus the electrons and holes in the wells recombine more efficiently.

Figure 1:
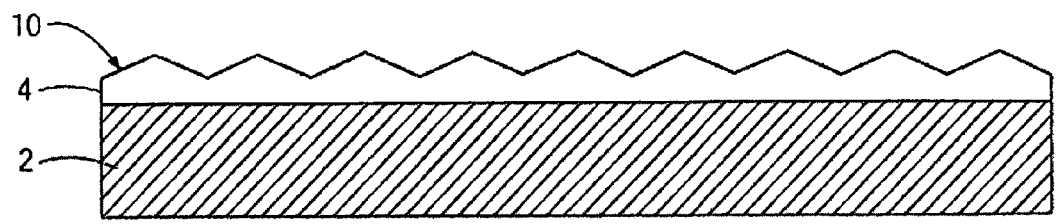
FIG. 1 is a partial representation of a textured template of the invention.
Figure 2A:
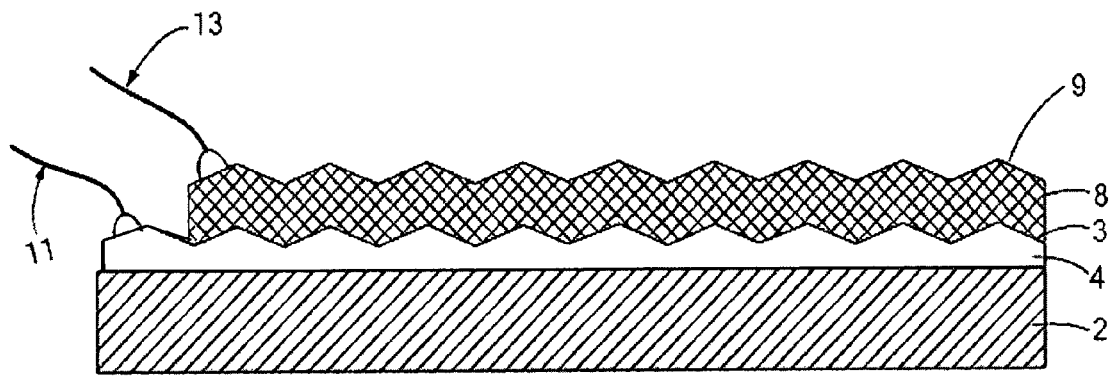
FIGS. 2a and 2b are partial representations of a semiconductor layer deposited onto the textured template of FIG. 1 to form a p-n junction.
Figure 2B:
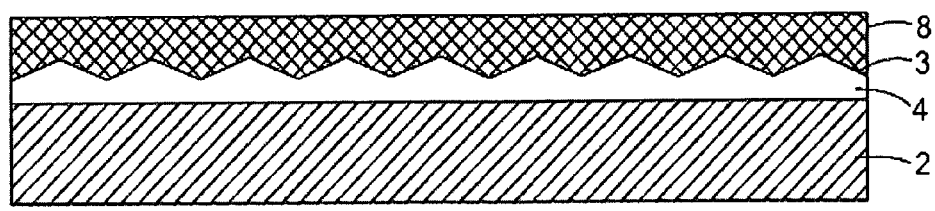

In one embodiment of the LED according to the present invention the LED is formed on a substrate 2 with a textured semiconductor layer 4 deposited onto the substrate as shown in FIG. 1 and FIGS. 2a and 2b, more fully discussed below. The layer is textured as grown on the substrate so as to have a textured surface topology (or morphology) 10. The substrate and textured layer can be used as a template for the growth of multiple semiconductor layers to form the LED. Such textured AlN templates may also be used to produce UV LEDs. For example, a device may comprise a second layer deposited onto the first textured layer. These layers can be doped to form a p-n junction for an LED. Appropriate dopants can include selenium, germanium, zinc, magnesium, beryllium, calcium, Si, sulfur, oxygen or any combination thereof. Each of the semiconductor layers can be textured by replication from the first grown layer and its textured surface to have a textured emitting surface of improved extraction efficiency.

Figure 3A:
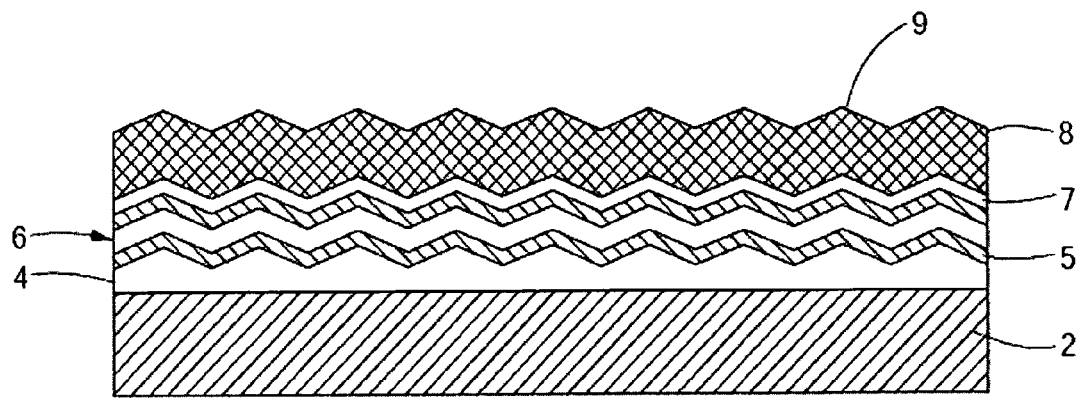
FIGS. 3a and 3b are partial representations of multiple quantum wells and a semiconductor layer deposited onto the textured template of FIG. 1.

In another embodiment, as shown in FIGS. 3a, b, FIGS. 4a, b, and FIGS. 5a, b, more fully discussed below, multiple quantum wells comprising a plurality of barrier and quantum well layers are deposited on one another as alternating semiconductor layers between the n- and p-doped layers of the device. As used herein, the term "quantum well" refers to a quantum well layer together with an adjacent barrier layer. The multiple quantum wells are textured by replication from the textured surface of the first layer as they are grown thereon.

In most cases a cladding layer of n-doped AlGaN of variable thickness is grown between the textured layer and the quantum wells.

Suitable substrates that can be used for growth of the first layer are known in the art. Exemplary substrates include sapphire, gallium arsenide (GaAs), gallium nitride (GaN), aluminum nitride (AlN), silicon carbide, zinc oxide silicon (Si) and glass. For example, a preferred substrate can include (0001) zinc oxide, (111) Si, (111) GaAs, (0001) GaN, (0001) AlN. (0001) sapphire, (11-20) sapphire and (0001) silicon carbide.

A substrate for a device of the invention can be prepared for semiconductor layer growth by chemically cleaning a growth surface. Optionally, a growth surface of the substrate may be polished. The substrate may also be thermally out-gassed prior to layer growth. The surface of the substrate can be optionally exposed to nitridation such as disclosed in U.S. Pat. No. 6,953,703, which is incorporated by reference herein. Growth on an unpolished, raw, as cut substrate facilitates growing a textured surface on it.

A semiconductor layer may be grown by processes such as hydride vapor phase epitaxy (HVPE), an alternative name for which is halide vapor phase epitaxy, MOCVD or MBE, liquid phase epitaxy (LPE), laser ablation and variations of these methods. Typical growth processes have been disclosed in U.S. Pat. Nos. 5,725,674, 6,123,768, 5,847,397 and 5,385,862, which are incorporated by reference herein. The semiconductor layer can also be grown in the presence of nitrogen to yield a nitride layer. Examples of a nitride layer are GaN, InN, AlN and their alloys.

FIG. 1 shows a partial representation of a semiconductor device of the invention. In a preferred embodiment, the device is textured and comprises a substrate 2 and first layer 4 textured as grown thereon. The substrate 2 can be textured or polished smooth initially. The first layer 4 is textured as grown on the substrate 2 to have a textured surface topology 10. Preferably, the first layer is grown by a modified HVPE deposition process to create the textured surface 10. The modified HVPE process yields a textured as grown first layer in part by etching defective areas of the layer with an increased hydrochloric acid (HCl) concentration. The HCl concentration of the modified HVPE process is substantially higher than that of typical deposition processes as exemplified below.

In one embodiment, the first layer 4 can be a semiconductor layer comprising a group III nitride layer. The layer 4 is preferably a p or n-type semiconductor layer by suitable doping during deposition or it can be an insulating layer as for example AlN or both as shown below. A layer 4 can optionally be grown on a buffer layer deposited onto the substrate such as described in U.S. Pat. No. 5,686,738, which is incorporated by reference herein.

The thickness of the substrate 2 and layer 4 can cover a broad range, although the thickness of the layer 4 may influence the extent of texturing replicated at its surface. For example, a 100 μm thick layer can have a peak-to-valley texture distance of about 100 nm to 5 μm. The texturing of the semiconductor layer affects its light extraction characteristics of LED layers grown thereon that replicate the texture. The semiconductor layer 4 is typically randomly textured as grown. Layer 4 may be single or poly crystalline material.

FIG. 2a shows a second layer 8 grown onto the device of FIG. 1. The layer 8 can be grown by any suitable deposition process. The second layer is grown on the textured surface 10 of the first layer 4. The second layer 8 is preferably not so thick so as to bury the textured surface topology 10 of the first layer 4 as shown in FIG. 2b. Preferably, the second layer 8 can have an upper surface 9 that is textured by replication by the layer 4 as shown in FIG. 2a.

Preferably, the layer 8 is a semiconductor layer comprising a group III nitride. The second layer 8 is typically a p or n-type semiconductor layer opposite to the doping of layer 4. The second layer 8 may be a single or poly crystalline semiconductor layer. In one embodiment, the first and second layers 4 and 8 doping forms a p-n junction 3 for use as a photosensor or emitter. These devices can be used for electronic displays, solid state lights, computers or solar panels. Electrodes 11 and 13 connect to the layers 4 and 8 as is know in the art for such use.

Figure 3B:
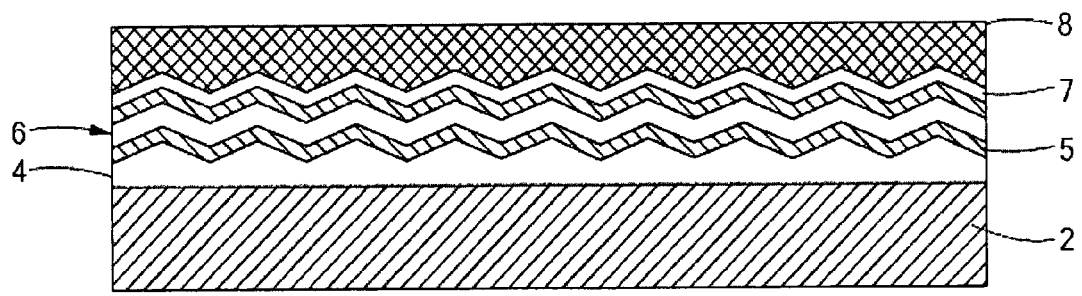

FIGS. 3a and 3b are partial representations of an LED having multiple quantum wells 6 grown onto the device of FIG. 1. The quantum wells 6 are textured by the surface topology of the first layer 4. As described above, the first layer 4 can be textured as grown onto the substrate 2. In one embodiment, the multiple quantum wells 6 can comprise one or more barrier layers 5 and alternating quantum well layers 7.

Several barrier layers 5 and quantum well layers 7 can be grown as alternating semiconductor layers each replicating the textured first layer 4. For example, quantum wells can be formed by a barrier layer 5 grown on the first layer 2. A quantum well layer 7 is then grown onto the barrier layer 5. A second barrier layer 5 is then grown on the quantum well layer 7 followed by a second quantum well layer. In one embodiment, the composition of quantum well layer 7 and first layer 4 are matched in composition. A barrier layer 5 can have a composition that differs from both the first 4 and quantum well layer 7.

The barrier layer 5 may comprise one or more group III-V nitride compounds. In one embodiment, one or more barrier layers 5 are AlGaN. Similarly, one or more quantum well layers 7 are a group III Nitride such as GaN, or another III-V compound. The layers can also be grown by any suitable deposition process. The layers may be single or poly crystalline layers.

The thickness of each of the layers is typically thin enough for texturing of the layer beneath to replicate to the surface above. The extent of texturing with the layers can affect IQE and light extraction efficiency. Preferably, a device of the invention comprises from one to twenty quantum wells that comprise a plurality of barrier layers 5 and quantum well layers 7.

FIGS. 3a and 3b also show an upper semiconductor layer 8 grown on the multiple textured quantum wells 6. The layer 8 can be grown by a known deposition process and may be a textured layer 9 (FIG. 3a) or be so thick so as to bury the textured surface topology of the first layer 4 (FIG. 3b) or have it polished off.

Preferably, the layer 8 is a semiconductor layer comprising a group III nitride. The upper layer 8 may also be a p or n-type semiconductor layer, opposite to the layer 4 so as to form a p-n junction. The p-n junction allows functioning as a semiconductor device such as an LED or photodetector. The upper layer 8 can be a single or poly crystalline semiconductor layer. The multiple quantum wells 6 can also comprise textured as grown barrier layers 5 and quantum well layers 7. For example, layers 5 and 7 may be grown by a deposition process such as HVPE, MBE, or MOCVD.

The device structure shown in FIG. 3a can exhibit internal quantum efficiencies and external light extraction efficiencies that are significantly higher than the efficiencies of a conventional device. The FIG. 3b device possesses IQE increases overall.

A device of the invention can have a light extraction efficiency approaching one-hundred (100) percent. Similarly, such a device may have an IQE in the range of fifty to sixty percent or more.

Figure 4A:
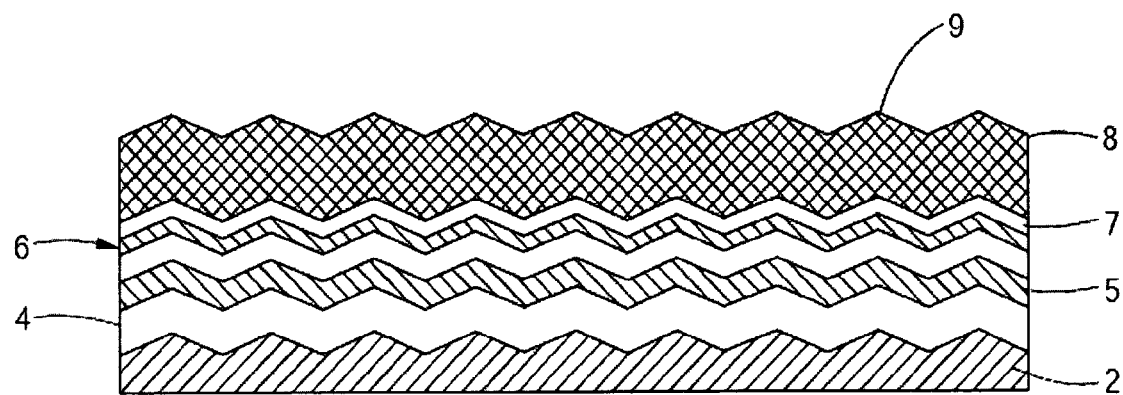
FIGS. 4a and 4b are partial representations of a substrate having a textured surface that textures semiconductor layers including multiple quantum wells deposited thereon.
Figure 4B:
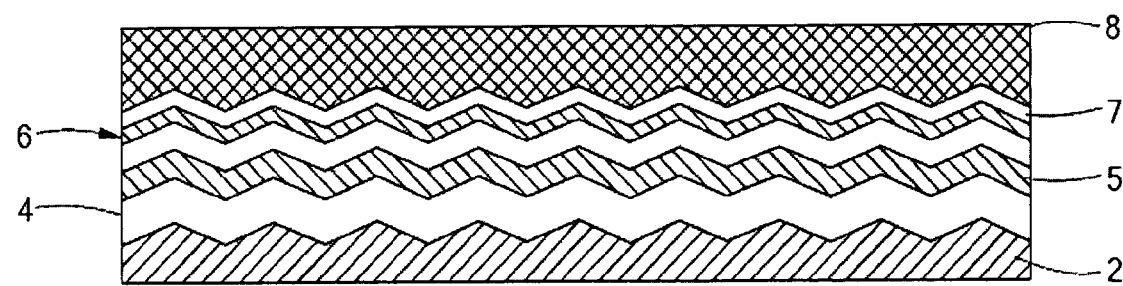

FIGS. 4a and 4b show a device with a substrate having an initial textured surface. Subsequent layers from the first layer 4 can be deposited on the textured substrate 2 such that the upper surfaces are textured by replication.

The device of FIG. 4a includes a texture surface 9 on layer 8 or in FIG. 4b, an untextured layer in that embodiment.

Figure 5A:
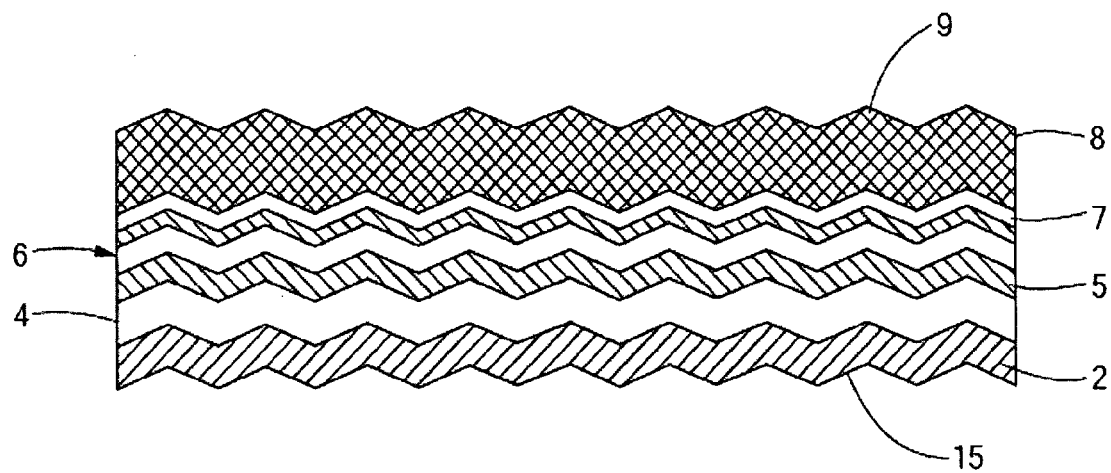
FIGS. 5a, 5b and 5c are partial representations of a substrate having textured surfaces with textured semiconductor layers including multiple quantum wells deposited thereon.
Figure 5B:
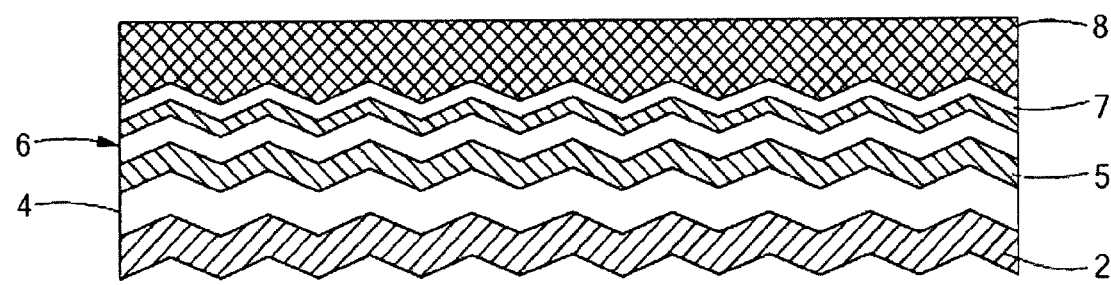

In an alternative embodiment, the substrate can comprise both upper and lower textured surfaces 9 and 15, as shown, for example, in FIG. 5a using substantially the same procedures as described above. In FIG. 5b, only bottom layer 2, surface 15 is textured and can function as an emitting surface.

Figure 5C:
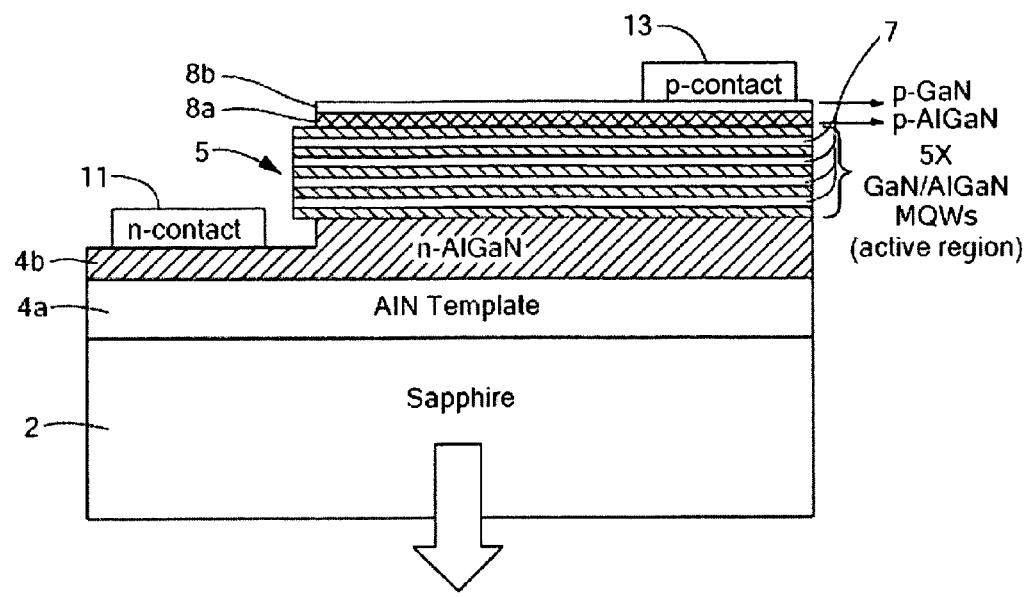

For example, FIG. 5c is an LED using a smooth AlN template 4a on a sapphire substrate 2. Between the AlN template and the quantum well and barrier layers 7 and 5 there is a thick AlGaN layer 4b known as cladding or contact layer. This layer can be used with other forms of the invention described herein. Over those are p-doped layers layers 8a and 8b of AlGaN and GaN respectively. Layers 4b and 8b receive electrical connections 11 and 13 with light extraction downward through sapphire substrate 2. Layer 8a can be used with other forms of the invention described herein and functions as an electron blocking layer preventing the loss of electrons. Layers 5 and 7 while shown smooth for clarity are to be understood to be wrinkled as desired.

The present invention also provides a method of fabricating a semiconductor device of the invention. The method comprises providing a substrate and growing a first semiconductor layer on the surface of the substrate. The first layer can be randomly textured as grown, textured lithographically post-growth, or randomly textured by a textured substrate surface as described below. The substrate or first layer can then be used as a template to deposit and texture other semiconductor layers. Such a template can be sold at this stage of production, allowing others to complete the layering replicating the texture up to the emitting layer.

In a preferred embodiment, a fabrication method includes growing several quantum wells in which the wells comprise both barrier and quantum well layers that can be deposited as alternating semiconductor layers. The multiple quantum wells are textured by the first layer, substrate or a combination thereof.

This invention describes a method of forming on a substrate thick GaN and other III-nitride films (templates) having a particular texture. Such spontaneously formed textured nitride templates are used as substrates for the growth of high efficiency devices such as III-Nitride light emitting diodes (LEDs), solar cells and photodetectors. The high efficiency of such devices is due to two effects; (a) efficient light extraction for LEDs and efficient coupling of light into the material for the case of solar cells and photodetectors and (b) improvements in IQE of LEDs based on textured III-Nitride MQWs due to suppression of polarization effects.

This invention relates to a method of preparing textured Group III-nitride templates during growth of the nitride films by HVPE, MOCVD, and MBE. Furthermore, such textured nitride templates are used as substrates for the growth and fabrication of LED structures with improved IQE as well as more efficient extraction efficiency. Besides LEDs, other devices such as solar cells and photodetectors, fabricated on such textured templates are going to have improved efficiency as well. Reference is made to commonly owned U.S. Pat. Nos. 5,385,862; 5,633,192; 5,686,738; 6,123,768; 5,725,674 incorporated herein by reference.

While the internal efficiency of an LED is an inherent material and device design property, the external efficiency of such a device is a measure of light extraction efficiency from the semiconductor. The large contrast between the GaN index of refraction and the surrounding material (usually air) causes total internal reflection for most of the light produced inside the active material. For the index of refraction of GaN (n=2.5), the escape cone for internal light is limited by Snell's law within a critical angle of $\sin \theta = 1/n$, or $\theta = 23.5°$. That limits the total extracted radiation to a solid angle:

$$\Omega = 2\pi(1 - \cos \theta)$$

Thus the total fraction of light that can escape from the semiconductor can be calculated by dividing the previous expression by $4\pi$:

$$\Omega/4\pi = \frac{1}{2}(1 - \cos \theta)$$

According to this expression, only 4% of the incident radiation is extracted in a GaN based LED. Thus, in LEDs, most of the internally reflected radiation is re-absorbed, since in an LED that operates below lasing threshold, the per-pass stimulated gain is less than per-pass absorption losses.

The formation of III-nitride templates and epitaxial growth of nitride devices on such templates can be developed, for example, using three different epitaxial methods, which are described below.

The HVPE method is used for the development of GaN or AlN quasi-substrates (templates). This deposition method employs HCl to transport the Ga to the substrate in the form of GaCl. Growth of GaN in the presence of HCl has also a number of additional advantages. HCl etches excess Ga from the surface of the growing film, and this enables high growth rates (100-200~μ/hr). It also etches defective GaN occurring primarily at the boundaries of the hexagonal domains due to incomplete coalescence of such domains. Finally, another advantage is the leaching of metallic impurities, which tend to contribute recombination centers in most semiconductors. Thus this method leads to very high quality GaN films.

A textured GaN template according to the invention is grown by a modified HVPE process. The GaN template can be grown via a modified HVPE reactor. In the reactor, the group III precursor can be GaCl gas, which is synthesized upstream by flowing HCl on a quartz-boat containing Ga at temperatures from about 500° C. to 1000° C. GaCl gas then mixes with ammonia ($NH_3$) downstream near the surface of the substrate wafer to form GaN at temperatures between about 900° C. to 1200° C. A GaN or AlN or AlGaN template of the invention can be grown along polar and non-polar directions. The templates can also grow in their cubic structure by choosing a substrate having cubic symmetry such as for example (100) Si (001) GaAs. In this case the subsequent nitride layers grown on it will have cubic symmetry as well.

The modified reactor is generally divided into four zones in which each zone temperature can be individually controlled. The reactor also has three separate delivery tubes for the reactant gases and diluents. Nitrogen or hydrogen is used as a diluent and carrier gases to $NH_3$ and HCl. Nitrogen is sent through the middle tube where it acts as a downstream gas sheath to prevent the premixing of the GaCl and $NH_3$ before the gases contact the substrate surface. The texturing of the GaN layer can be attributed to the etching effects of HCl. For example, texturing occurs as HCl etches Ga from the surface of the growing layer. HCl also etches defective GaN at the boundary domains of the first layer. The HCl concentration of the modified HVPE process is substantially higher than that of typical deposition processes where texturing is avoided.

The textured GaN templates can be grown under high growth rate conditions ranging from about 30 to 200 μm per hr that is controlled by the flow ratio of $NH_3$ to the group III precursor. The flow ratio is typically about 300 to 10. The template's growth is performed by pretreatment of the substrate with GaCl gas or by exposing the sapphire surface to ammonia for a short time (nitridation) at 1000° C. followed by the growth of a thin GaN buffer layer from 550° C. to 650° C. The growth area can then be ramped to about 1070° C. for high temperature epilayer growth of GaN. The substrate can also be pretreated prior to growth with sputtered zinc oxide. The usual thickness of the zinc oxide is from about 500 Å to 1500 Å. Growth of the template is then performed by heating the chamber to the growth temperature and flowing the reactant gases in order to initiate growth.

MOCVD is the method currently used by industry for the growth of GaN-based LEDs. This method produces nitrides by the reaction of Group III-alkyls (e.g. (CH3) 3Ga or (C2H5) 3Ga) with NH3. One problem with this method is the cost associated with the high consumption of NH3. Growth of GaN films at 1 μ/hr requires 5 to 10 lpm of NH3.

The MBE method forms III-nitrides by the reaction of Group III elements with molecular nitrogen activated by various forms of RF or microwave plasmas. An alternative approach is the reaction of Group III elements with ammonia on a heated substrate. The Group III elements can be either evaporated from effusion cells or provided in the form of Group III alkyls. It is generally believed that products produced by the MBE method are more expensive due to throughput issues. However, in the growth of nitrides, a significant part of the cost is determined by the consumption of nitrogen precursors. During MBE growth of nitride devices, one employs approximately 1 to 50 sccm of nitrogen or ammonia, which is several orders of magnitude less than what is employed during MOCVD growth. This together with the fact that MBE production equipment employs multi-wafer deposition systems makes the MBE method attractive for the development of inexpensive nitride devices. InGaN-based laser diodes have recently been produce by the MBE method [Hooper et al., Electronics Letters, Vol. 40, 8 Jan. 2004].

In one aspect of the invention, the surface of a GaN template is randomly textured. Appropriate random surface texture can be produced by any suitable mechanical or chemical techniques, including modified HVPE. In modified HVPE, the surface texture of the GaN template can be controlled by varying the group-III to group-V ratio. For example, using a molar ratio of $NH_3$ to HCl of 5:1 to 10:1 yields randomly textured GaN templates by modified HVPE, whereas conventional HVPE using higher ratios such as 20:1 to 50:1 or higher yields smooth templates. Other methods to produce randomly textured GaN templates include incomplete nitridation of a substrate such as a sapphire wafer, or using an extremely thin GaN buffer. Growth of GaN at high temperatures under nitrogen rich conditions can also yield randomly textured GaN templates by the MBE method. For example, using a molar ratio of Ga/N of less than 1 produces randomly textured GaN templates. Using a molar ratio of Ga/N of more than 1 results in smooth GaN templates.

Surface texture can be investigated using available techniques such as atomic force microscopy (AFM) and scanning electron microscopy (SEM). The degree of randomness can be ascertained by evaluating the distribution of surface depth; a randomly textured surface shows an approximately Gaussian distribution of surface depth. In order to obtain optimal light extraction from an emitter, the average surface depth is preferably in the range of the wavelength of light emitted. For example, for a visible light LED, an average surface depth in the range of 200 nm to 1.5 μm is preferred.

Textured III-nitride templates can be formed either along polar or non-polar directions.

The majority of the work on III-nitrides reported in the literature involves the heteroepitaxial growth of these materials on either (0001) sapphire or 6H—SiC substrates by various deposition methods. Materials and devices grown on these substrates contain a high density of threading defects (dislocations and inversion domain boundaries). Furthermore, the [0001] orientation is a polar direction in the non-centrosymmetric wurtzite structure, which gives rise to internal electric fields in heterostructures due to spontaneous and piezoelectric polarizations. While such polarization effects may be desirable in some type of devices (e.g. piezoelectric doping in FETs), they may be undesirable for emitters based on multiple quantum well (MQW) structures due to the QCSE. This effect causes a red-shift in QW emission due to the distortion of the quantum wells, and also results in a reduced quantum efficiency because the electron and hole wave functions are separated in space.

Recently it has been demonstrated that growth of GaN/AlGaN MQWs on the R-plane sapphire (10-12) leads to films along the (11-20) direction (Iyer et al., 2003). The (11-20) direction has the polarization vector in the plane of the MQWs, and this eliminates internal fields perpendicular to the quantum wells. Therefore, emission from such quantum wells is not red-shifted and the luminescence efficiency is not reduced.

Textured nitride templates along polar direction can be grown on (0001) sapphire, (11-20) sapphire, 6H—SiC, (0001) ZnO, (111) Si, and (111) GaAs. Textured nitride templates along non-polar directions can be grown on the R-plane (19-12) and the M-plane (19-10) sapphire substrates and corresponding planes of 6H—SiC and ZnO. Such textured templates can be grown by the three deposition methods as discussed previously.

The textured nitride templates can be used as substrates for the growth of highly efficient LEDs. By the virtue that the surface is spontaneously textured to some degree during growth, the gradual changing of the index of refraction from the bulk of the semiconductor to air effectively increases the light escape cone and reduces loss of light via internal reflections. Thus light emitted from the semiconductor is extracted more efficiently, thereby increasing the external quantum efficiency of the device. In the same argument, photodetectors and solar cells grown on such templates would absorb the light more efficiently and they would not require additional anti-reflection coatings.

Furthermore, textured nitride surfaces can also increase the IQE of LEDs based III-Nitride semiconductor MQWs due to partial suppression of the polarization effects.

GaN templates can be grown by the HVPE method with variable surface texture. These templates can be characterized by studying their surface morphology, reflectivity, transport and photoluminescence properties. The luminescence extraction efficiency can be approximately 100%. GaN/AlGaN MQWs can be grown on both smooth and textured GaN templates. The photoluminescence measurements on the "wrinkle" QWs indicate a significant improvement in the IQE compared to that from the smooth QWs, a result attributed to the reduction of the quantum confined Stark-effect (QCSE) since the QWs are not perpendicular to the [0001] polar direction. Nitride-LED structures incorporating "wrinkled" QWs have significantly higher external quantum efficiency than those employing smooth quantum wells.

The textured boundary between a GaN layer ("top layer") and air (or other material) increases the extraction efficiency with respect to photon trajectories across the boundary by reducing the amount of total internal reflection within the top layer. The surface features of the textured surface can have feature dimensions as small as about one wavelength; however larger texture features are acceptable. The top layer can be grown conformally over a lower layer, such as a textured template. The top layer can, but need not, be as much as several thousand Å thick.

The boundary between the GaN layer and air (or other material) can be textured by growing or depositing the GaN layer directly on a textured template, such as an n-type GaN layer, or on intervening layers, such as quantum wells (QWs) or MQWs, that have been conformally grown or deposited on the textured template. Alternatively, a smooth GaN layer can be grown and subsequently its surface can be roughened, such as by lithography, even if the GaN layer is not grown on a textured surface. Such post-growth roughening can damage the surface of the GaN layer. For example, "point defects" can be created. However, this damage can be remediated, such as by annealing.

MQWs can be grown on the n-GaN layer before a p-GaN layer is grown on the MQWs. For example, the MQW layers can be grown by MBE or MOCVD. In one embodiment, ten pairs of GaN wells and AlGaN barriers are grown, each well and each barrier layer being about 78 Å thick. In another embodiment, the layers are 50 Å thick each. However, a wide range (including less than 50 Å and greater than 78 Å) of thicknesses of the well and of the barrier layers is acceptable. The total thickness of the MQWs can be as much as or more than 1,000 Å. Furthermore, the well and the barrier layers need not be of equal thicknesses. For example, 70 Å (each) well layers can be combined with 80 Å (each) barrier layers.

As noted, the textured MQWs between the n-type and the p-type GaN layers increase the IQE of the P-N junction, thereby increasing the amount of light produced by the P-N junction (or the amount of external light that is detected in the junction in the case of a photodetector). Embodiments can include the textured junction alone, the textured top layer alone or a combination of the textured junction and the textured top layer. In addition, any of these embodiments can include or alternatively omit the textured QWs or MQWs.

A textured P-N junction (with or without QWs or MQWs) has more surface (contact) area in the junction than a smooth P-N junction, given a constant diameter or other outer dimension of an LED or other semiconductor device. This increased surface area can increase the efficiency of the device.

To register lithographic masks or the like with integrated circuit wafers, such as for subsequent process steps involving the wafer, an operator typically observes the wafer through a microscope while a light source illuminates the wafer through the microscope. The light illuminates the top surface of the wafer, making registration marks on the wafer visible to the operator. However, little light is reflected from a device that includes one or more of the characteristics described above. Consequently, observing the registration marks on the surface of a wafer constructed according to one or more aspects of the present invention using an optical microscope can be difficult. This observational difficulty can lead to difficulty registering lithographic masks used in subsequent processing steps. To overcome this difficulty, in accordance with another embodiment of the present invention, a light source illuminates the edge (side) of the wafer, thereby making the registration marks and the like on the wafer visible to the operator. Light is transmitted from the surface of the wafer, through the microscope, to the operator, rather than being reflected from the surface, as in the prior art. The light source can, but need not, be external to the microscope.

The invention also provides a novel type of white LED. An LED based on textured InGaN/GaN MQWs grown on textured GaN templates produced by HVPE produces dichromatic electroluminescence, resulting in white light. For example, the color temperature of a white LED according to the invention can be in the range of about 2500° K to about 7500° K, and can be varied by altering the DC injection current. A first peak of electroluminescence is typically in the range of about 390-450 nm, and a second peak is in the range of about 500-600 nm. The color of the combined dichromatic emission depends on the bias or injection current used to drive electroluminescence. The overall color is blue-shifted with increasing injection current, due to an increase in the overall contribution from the peak in the 390-450 nm range. The dichromatic emission of LEDs according to the invention is believed to result from the emission of light from two or more distinct regions of randomly textured MQWs. Quantum well layers in randomly textured MQWs have at least two distinct thicknesses, since the deposition process results in somewhat thicker well layers in flat regions and somewhat thinner well layers on inclined regions. Thinner well layers emit at higher energies and therefore produce an emission peak which is blue-shifted compared to thicker well layers.

In one embodiment, an LED according to the invention is combined with one or more conventional LEDs to yield an altered or full spectrum combination LED device. In another embodiment, two or more LEDS according to the invention, each having distinct electroluminescence properties, such as color temperature, are combined to yield an altered or full spectrum combination LED device.

In addition to the bias current effect on LED color, the entire electroluminescence spectrum of LEDs of the invention can be altered by varying the In content. In can be present in amounts varying from at least 10% to 100% of any given III-nitride layer of the device. Increasing the In content results in a red-shift of the electroluminescence spectrum.

The variable color feature of LEDs according to the invention has numerous applications, including use to fabricate variable color indicators and displays, color image displays to show still pictures or photographs as well as video images, and projection devices for both still images and video. Techniques and devices for arranging and controlling LEDs according to the invention to produce color image displays are well known in the art. For example, conventional and digital drivers for LED image displays are disclosed in U.S. Pat. No. 7,109,957, which is hereby incorporated by reference. Such control devices can be modified to control the bias current of the present LEDs so as to modify their color to produce a color image. Similarly, technology including control circuitry, software, and optics for producing projectors using LED arrays is well known, and can be adapted for use with the LEDs according to the invention. For example, U.S. Pat. No. 6,224,216 describes such LED projectors, and is incorporated by reference in its entirety.

The examples herein are provided to illustrate advantages of the present invention. The examples can include or incorporate any of the variations or embodiments of the invention described above. The embodiments described above may also each include or incorporate the variations of any or all other embodiments of the invention. The following examples are not intended in any way to limit the scope of the invention.

EXAMPLE I

Growth of Textured GaN Templates by HVPE

Figure 7:
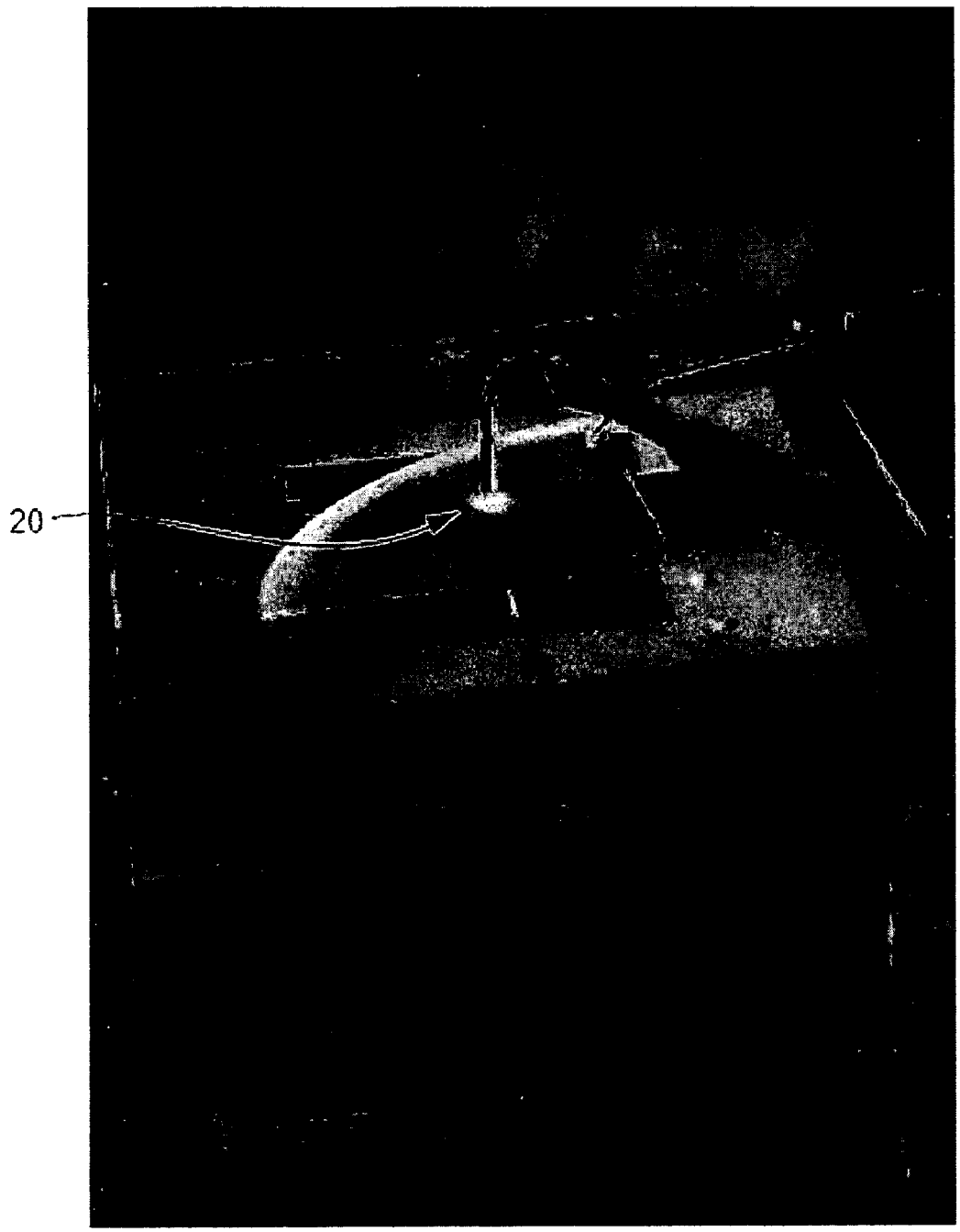
FIG. 7 is a radiating electrically pumped GaN wafer level LED having InGaN MQWs.

Textured GaN templates were fabricated by the modified HVPE process described above. FIG. 7 shows an electrically excited wafer level LED radiating at p contact 20. This blue LED structure was made on an unpolished (0001) sapphire substrate. On this substrate was grown 3 microns of heavily doped n-type GaN, followed by 10 MQWs consisting of InGaN with 13% indium as the wells and GaN as the barriers. The growth of the MQWs is followed by a thin (about 10 nm) electron blocking layer consisting of AlGaN with 30% Al doped p-type with magnesium, and this is followed by 200 nm of heavily p-type doped GaN with magnesium. The free surface from where the light is emitted has replicated the morphology of the unpolished sapphire substrate.

Figure 8A:
FIG. 8a is a scanning electron microscope (SEM) image of a gallium nitride (GaN) textured template of the invention.

FIG. 8a shows a scanning electron microscope (SEM) image of a GaN template randomly textured as grown via the modified HVPE process. The image was captured with the sample tilted about thirty degrees with respect to the electron beam. Growth of the GaN layer occurred on a (0001) sapphire substrate. The growth was performed via a process using 25 standard cubic centimeters per minute (sccm) of HCl during pretreatment at 1000° C. The process also employed a ratio of ammonia to the group III precursor of 150 during growth of the buffer layer at about 590° C. The stage of high temperature growth at 1070° C. then used an ammonia to group III ratio of 60. The extent or degree of texturing of the template was determined to be dependent upon the amount of GaCl arriving at the growth front. Such an amount of GaCl can also control the growth rate.

Figure 8B:
FIG. 8b is an SEM image of a conventional, smooth GaN semiconductor layer.

In comparison to FIG. 8a, FIG. 8b shows an SEM image of a standard GaN layer that is atomically smooth. As shown, the surface topology of the conventional GaN layer is untextured despite a few surface defects. The image was captured with the sample tilted about thirty degrees with respect to the electron beam. Photoluminescence of the conventional GaN layer having an atomically smooth surface was compared to that of a randomly textured gallium nitride template of the invention. Both layer samples were measured at conditions that were identical using a 10 milliwatt (mW) helium cadmium laser as the excitation source.

Figure 9:
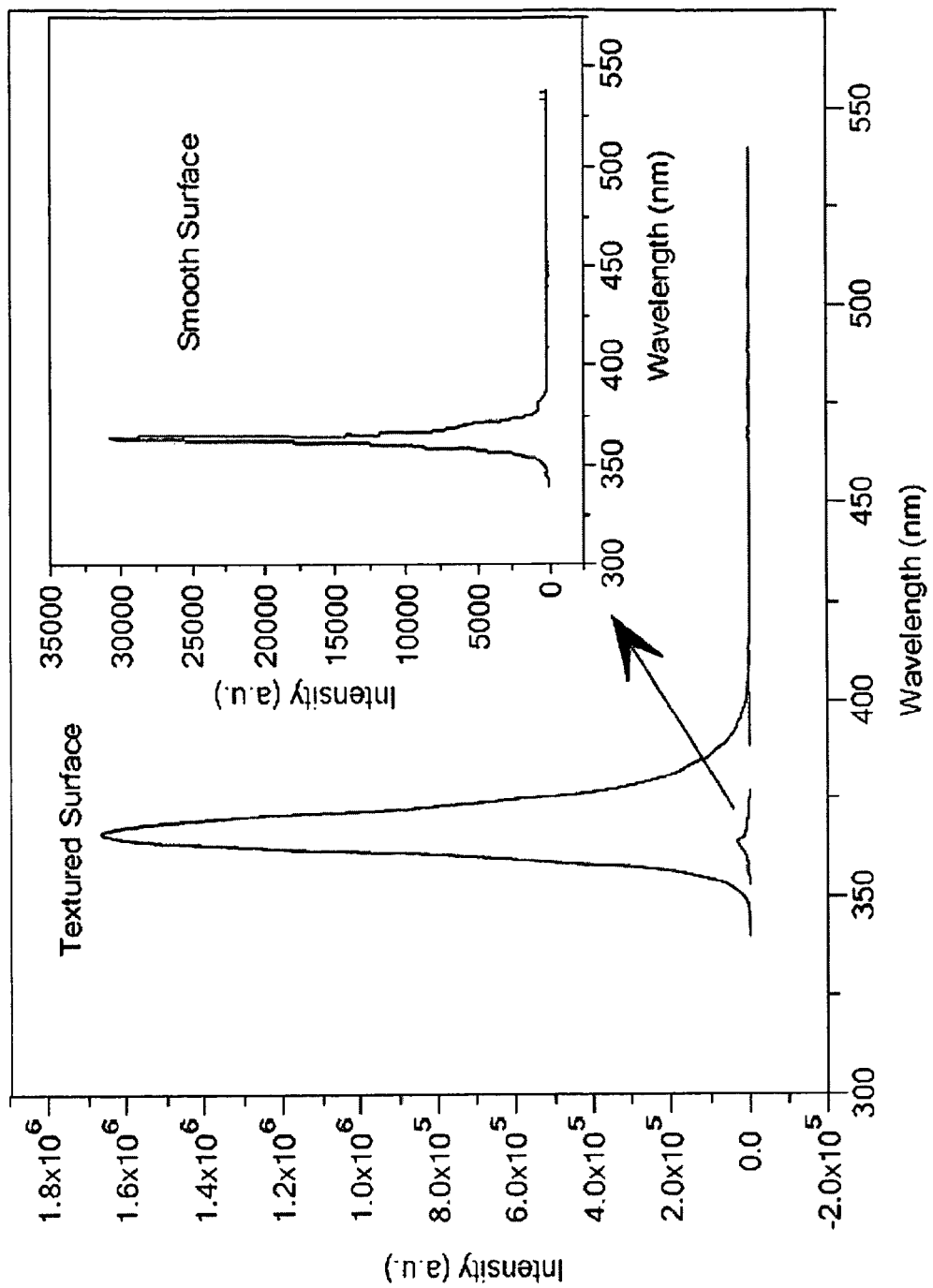

The results of the comparison are shown by FIG. 9 in which the photoluminescence intensity of the textured template is more than fifty times greater than the intensity of the smooth GaN layer. Enhanced light extraction occurs through a surface that is textured particularly with the high index of refraction of such semiconductor layers. The textured surface provides an increase in the escape cone of a single photon compared to the limited escape cone by a high index of refraction change between a GaN layer and air.

Figure 10B:
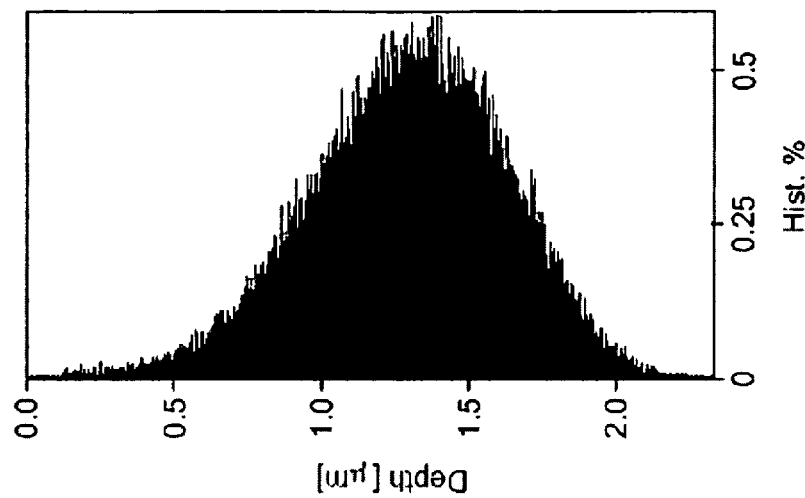
FIG. 10b shows a depth analysis plot of the imaged area.
Figure 10A:
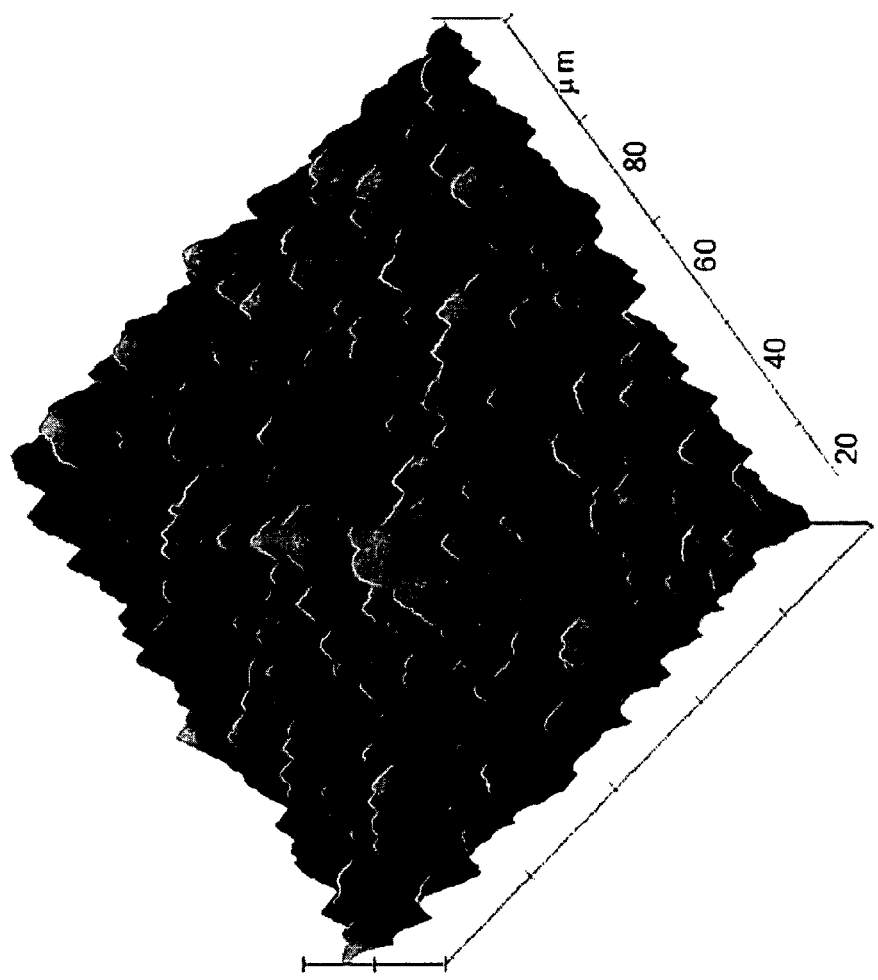

The randomness of texturing of a group III layer template of the invention is illustrated in FIGS. 10a and 10b. FIG. 10a is an atomic force microscope image of a GaN template of the invention with a depth analysis plot of the imaged area in FIG. 10b. The plot shows the Gaussian distribution of the surface topology for the template, characteristic of randomness. The average peak-to-valley surface topology is approximately 1.3 microns.

EXAMPLE II

Growth of Multiple Wrinkled Quantum Wells on a Textured Template

Figure 6:
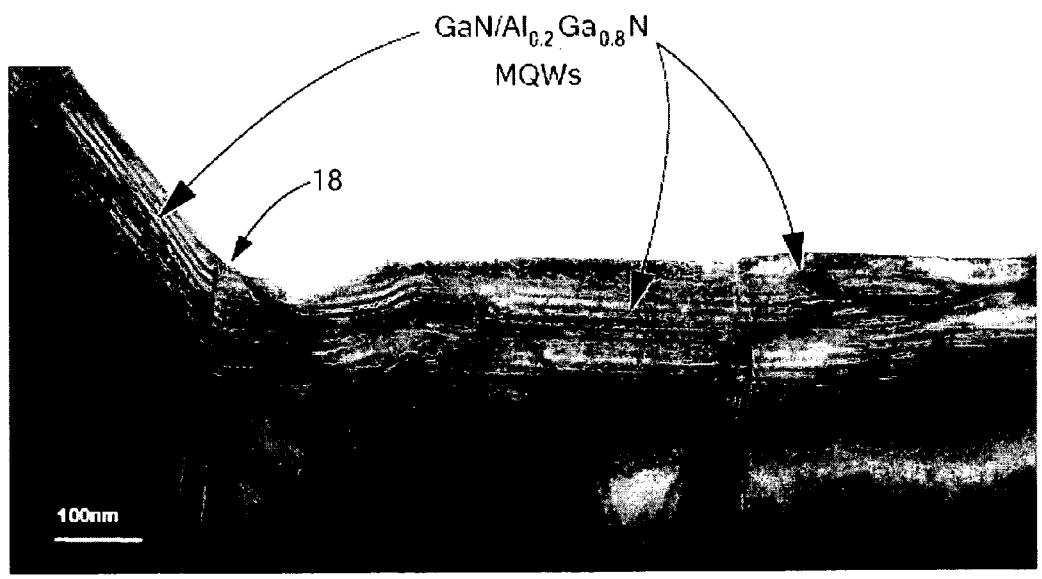
FIG. 6 is a transmission electron microscope (TEM) view of textured GaN/AlGaN multiple quantum wells grown on a textured GaN template.

FIG. 6 is a transmission electron microscope image showing multiple quantum wells on a textured surface (wrinkled quantum wells). The quantum wells comprise ten pairs of AlGaN and GaN layers. An individual GaN layer may comprise a textured quantum well layer with the AlGaN layer serving as the barrier layer. The composition of the AlGaN layer, for example, is $Al_{0.2}Ga_{0.8}N$. Generally, that is $Al_xGa_{1-x}N$. The multiple quantum wells can also be made by any combination of small gap III-V nitride films (wells) and large gap III-V nitride films (barriers). The composition of the MQW determines the emission energy of light from about 0.7 eV of pure InN to 6 eV from pure AlN. The plurality of quantum well layers are grown by any suitable deposition process. A MBE process involves the reaction of a group III material with nitrogen that has been activated by radio frequency or microwave plasma. An alternative approach would be to react group III materials with ammonia on a heated substrate.

The group III materials for semiconductor growth through a growth process can be evaporated from effusion cells or may be provided in the form of group III alkyls. During semiconductor growth in an MBE or plasma-assisted MBE process, nitrogen or ammonia gas is typically used from about 1 to 100 sccm. As the quantum wells are grown, the layers of quantum wells replicate the texture of the template. Such MBE processes are known in the art. The invention also contemplates other typical approaches for semiconductor layer growth that may be employed by a person of ordinary skill within the art.

The ten pairs of AlGaN and GaN textured quantum wells had a well thickness of about 7 nanometers (nm) and a corresponding barrier layer thickness of about 8 nm. The plurality of quantum wells were grown with the substrate at a temperature of about 750° C. An AlGaN barrier layer is first grown upon a group III-V textured template of the invention. The barrier layer is then a surface for deposition of a quantum well, GaN layer. The GaN layer then serves as a growth surface for the next barrier layer. This growth pattern can be continued until multiple quantum well layers are formed. The wells replicate the surface topology of the underlying textured template. The thicknesses of the well and barrier layers can, for example, also be from 10 Å to more than 500 Å.

Figure 11:
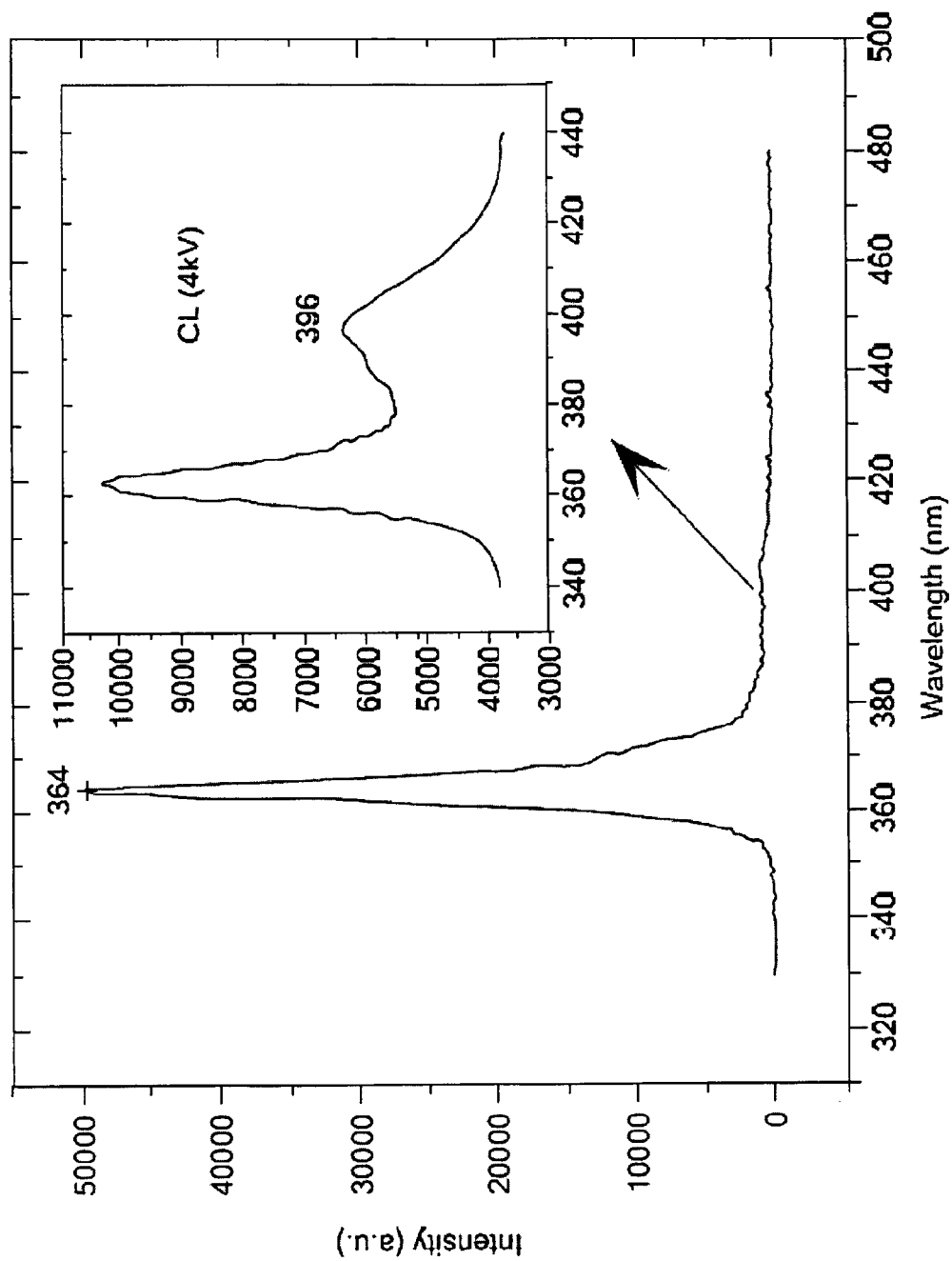
Figure 12:
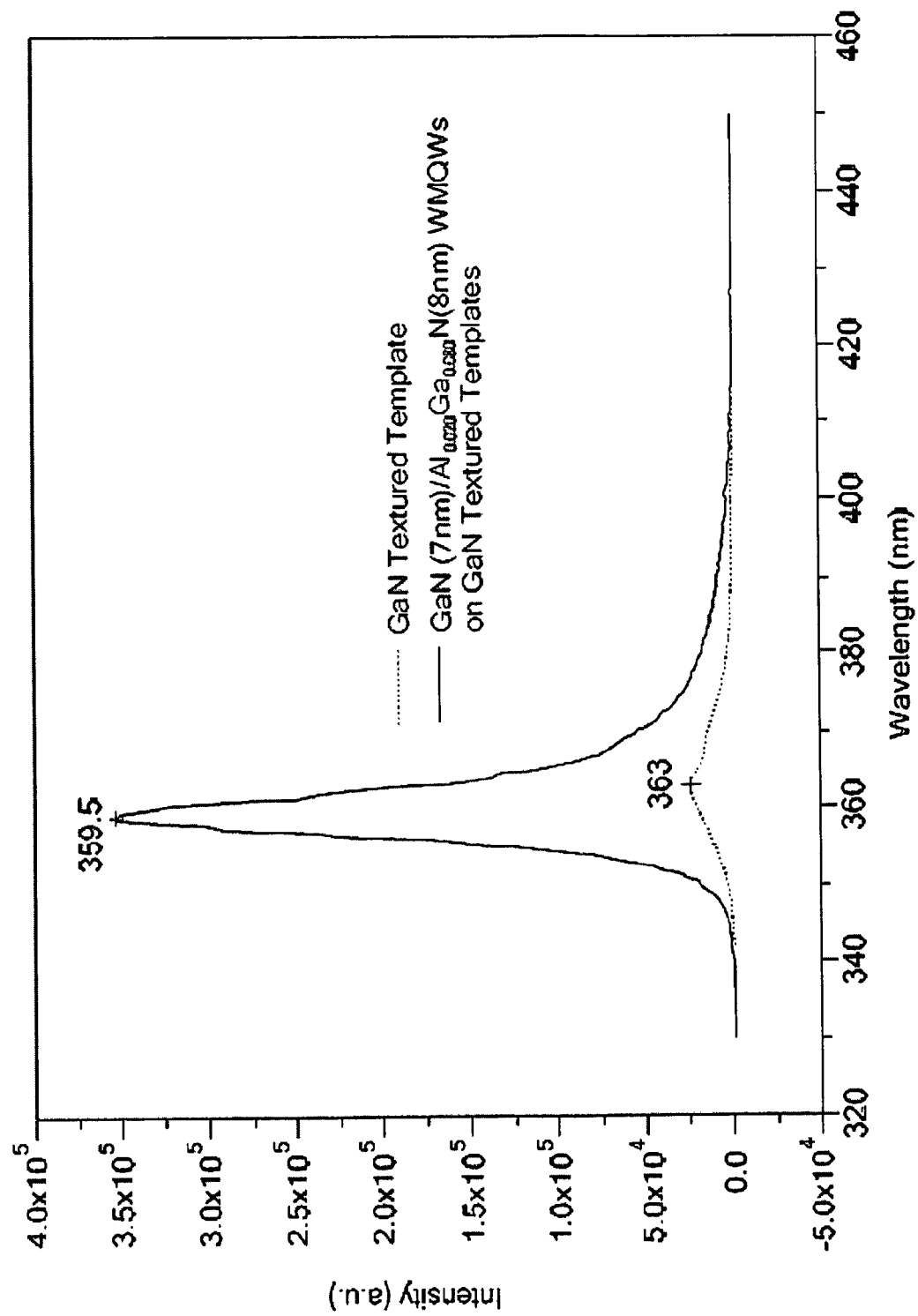
Figure 13:
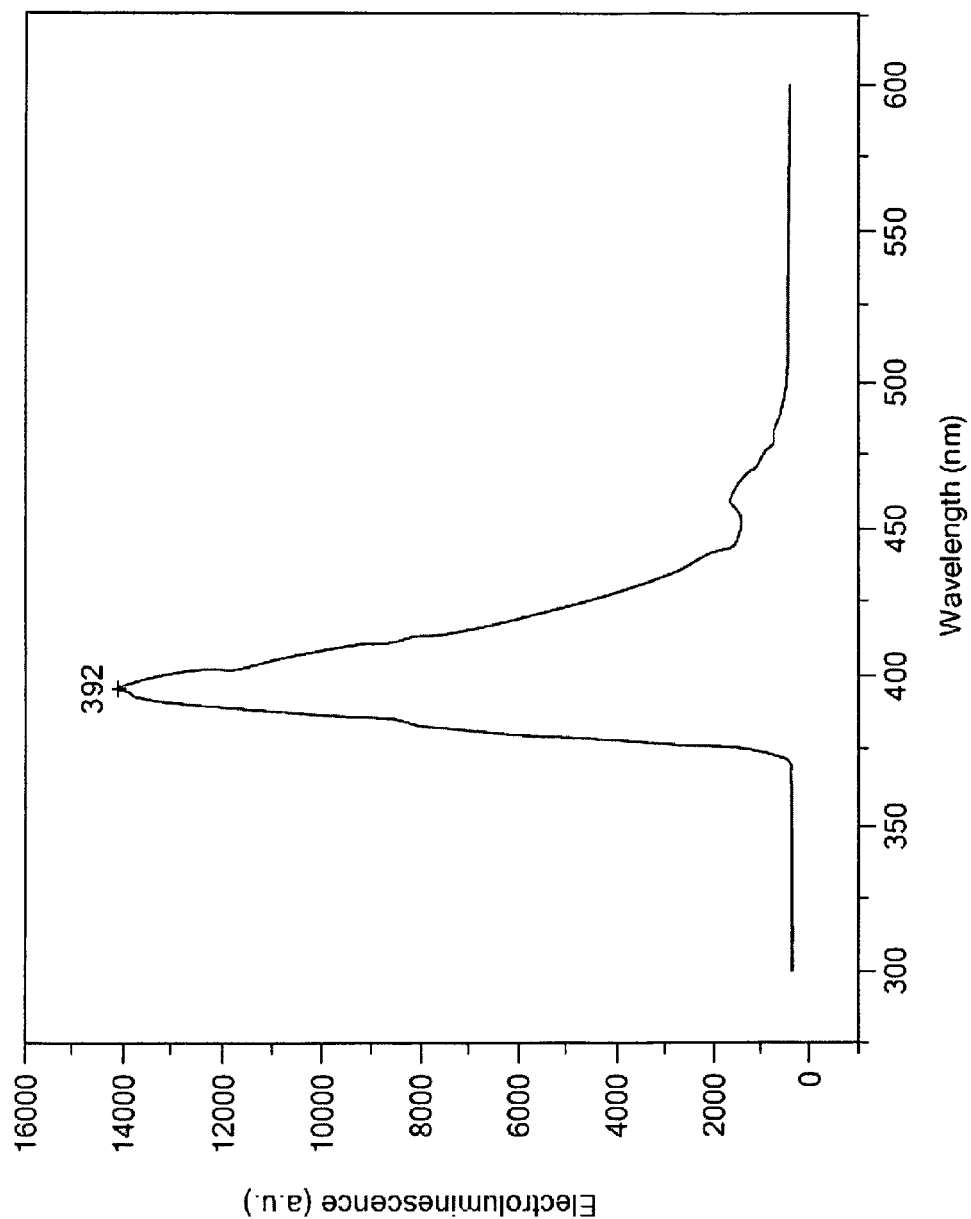

FIGS. 11 and 12 show photoluminescence spectra of conventional quantum wells and textured quantum wells grown on a textured template of the invention respectively. The photoluminescence spectrum from the quantum wells grown onto a conventional smooth GaN layer exhibits a high intensity peak at 364 nm, which is due primarily to the smooth bulk GaN layer underneath the MQWs. The extremely low and broad luminescence peak at about 396 nm was assumed to be due to the smooth wells. A cathodoluminescence spectrum of the smooth well sample was used to verify the assumption. The spectrum was performed using low acceleration voltage of about 4 kV in order to probe the quantum wells. The results are shown by the inset of FIG. 11. The results confirm that the broad peak occurring at 396 nm corresponds to the conventional quantum wells.

Thus, the luminescence observed from the smooth quantum wells is shown to be greatly reduced in magnitude and red-shifted with respect to the bulk. These results are consistent with the QCSE.

In comparison to typical quantum wells, the photoluminescence spectra of those wells that are textured by a textured template of the invention are blue-shifted with respect to the luminescence spectra of the bulk GaN layer. The plurality of textured quantum wells also exhibits substantially increased luminescence as compared to the template on which the wells are grown.

These results indicate that wrinkled wells formed on a textured group III-nitride template are not distorted by the internal fields associated with polarization. FIG. 12 also shows that the peak photoluminescence for the textured quantum wells is more than about seven hundred times higher than those grown on a conventional smooth GaN layer. The difference is due to both enhanced light extraction through the textured surface and the enhanced spontaneous emission rate of the quantum wells due to elimination of the QCSE.

EXAMPLE III

Textured Surface Made by Etching of a Masked Template

In this example, a textured substrate is created with a textured surface on which additional layers are grown, while replicating the textured features. The additional layers may be grown so as to form a textured template, a p-n junction or an optical device of the invention. The additional layer(s) may also comprise multiple quantum wells formed by a plurality of well and barrier layers. The surface of the substrate to be textured may be smooth or previously textured. The surface of the substrate can also be unaltered or otherwise natural.

A mask structure comprising a monolayer of monodisperse spherical colloidal particles is coated onto the surface of the substrate. The substrate can include silicon, silicon carbide, sapphire, gallium arsenide, gallium nitride, aluminum nitride, zinc oxide, or glass. Spherical monodisperse colloidal particles can be commercially obtained in sizes ranging from 0.02 to 10 microns. The packing of the particles onto the surface of the substrate may be either periodic or random depending on the technique used for coating. Coating of the mask structure over a one to five inch diameter portion of a substrate requires several minutes. Such a coated area can define $10^8$ to $10^{12}$ submicron features on the substrate.

The masked surface may then be etched by, for example, ion beam etching. The etching forms the individual particles into pillars on the substrate surface. The aspect ratio and shape of the pillars is determined by the relative mask etch rates and the underlying substrate material. To minimize the aspect ratio of the pillars, both physical and chemically assisted ion beam etching can be employed. The surface of the substrate can then be etched by a liquid or gas such as hydrogen fluoride Chlorine, boron tri-chloride or argon. The etching of the substrate due to the liquid or gas is less significant in some areas than others as the pillars tend to retard or prevent portions of the substrate surface from being etched.

After etching, the pillars on the surface of the substrate can be removed by a solvent. The solvent dissolves the pillars to yield the substrate with a textured surface. The surface of the substrate can then be used to grow additional layers that replicate the textured features. This technique for etching and texturing the surface of a substrate has also been described in greater detail by Deckman et al., "Molecular-scale microporous superlattices," MRS Bulletin, pp. 24-26 (1987).

EXAMPLE IV

Figure 19:
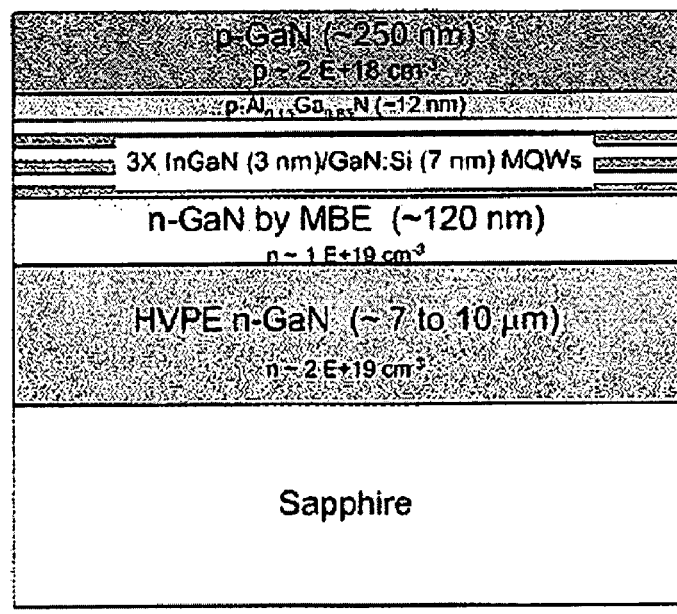
FIG. 19 is a schematic of the cross-section of certain LED embodiments.

Fabrication and Characterization of LED Structures on Textured GaN Templates LED structures were fabricated on HVPE grown templates having different textures. The device structure is shown schematically in FIG. 19. 800 µ×800 µ mesas were formed by ICP etching. Metal contacts were deposited by beam evaporation to n-GaN: Ti (10 nm)/Al (120 nm)/Ni (20 nm)/Au (80 nm) and to p-GaN: Ni (5 nm)/Au (20 nm). The Au metal on the top of the mesa was quite thick and transmitted only a small fraction of the light generated within the LED structure. The spectral dependence of two devices having different surface texture is shown as a function of injection current in FIG. 17. These data indicate that by increasing the injection current the emitted light filled the entire region of the visible spectrum and thus produced white light. By visual inspection of the emission, the blue and the green emissions were observed to originate from different parts of the mesa. This is evidence that the broad green spectrum is not related to defects, but to emission from planar QWs which are approximately perpendicular to the polarization direction. This emission is red shifted due to the QCSE. This interpretation is consistent with the second LED having a flatter surface.

EXAMPLE V

Fabrication of Thick n-GaN Templates by the HVPE Method on c-Plane Sapphire Substrates The growth conditions in this method were adjusted to lead to n-type GaN templates with various degrees of surface morphology from atomically smooth to completely random texture. These GaN templates were characterized by studying their reflectivity in the UV and visible parts of the spectrum as well as their photoluminescence (PL) excited with a He—Cd laser. The reflectivity was suppressed from approximately 20% for smooth surfaces to approximately 1% to 2% for the randomly texture surfaces in the entire spectral region. The photoluminescence intensity from the textured GaN templates was found to be significantly higher compared to that from identically produced and similarly doped GaN templates having atomically smooth surfaces. Specifically, the ratio between the integrated photoluminescence from the GaN textured template and the GaN template with a smooth surface, measured under identical conditions, was about 55. This significant enhancement of the photoluminescence from the randomly textured GaN template is attributed partly to enhanced light extraction through the textured surface, which is expected to be only 4% from the smooth surface, and partly to enhancement in spontaneous emission rate due to exciton localization at the textured surface.

Identical GaN/AlGaN MQWs, with well and barrier widths of 7 nm, were grown on both the textured and the smooth GaN templates by plasma-assisted MBE and their optical properties were evaluated by photoluminescence (PL) and cathodoluminescence (CL) measurements. The photoluminescence spectra of the smooth and "wrinkled" QWs had significant differences. The photoluminescence from the smooth quantum wells had a single peak at 396 nm, consistent with the expected red-shift from the photoluminescence spectra of the bulk GaN films due to the QCSE. The photoluminescence peak from the wrinkled QWs occurred at 358 nm, which is blue-shifted with respect to the photoluminescence spectra of the bulk GaN films, a result consistent with QWs having a square configuration. Furthermore, the integrated photoluminescence intensity from the multiple "wrinkled" quantum wells was about 700 times higher than that of the smooth MQWs.

The significant enhancement of the photoluminescence from the "wrinkled" QWs is attributed partly to enhancement in light extraction through the textured surface and partly to enhanced spontaneous emission rate. The increase in the IQE is believed to be due to the reduction of the QCSE, since the quantum wells are not perpendicular to the polar [0001] direction. Further enhancement in IQE is believed to be due to quantum carrier confinement from "wedge" electronic eigenmodes. The latter has its origin to the transition in the carrier behavior from 2D to 1D due the V-shaped intersecting planes of the quantum wells, and thus the "wedges" behave as quantum wires, which cause localization and trapping of excitons.

EXAMPLE VI

Formation of III-Nitride Textured Surfaces Along Polar [0001] Directions

Figure 20:
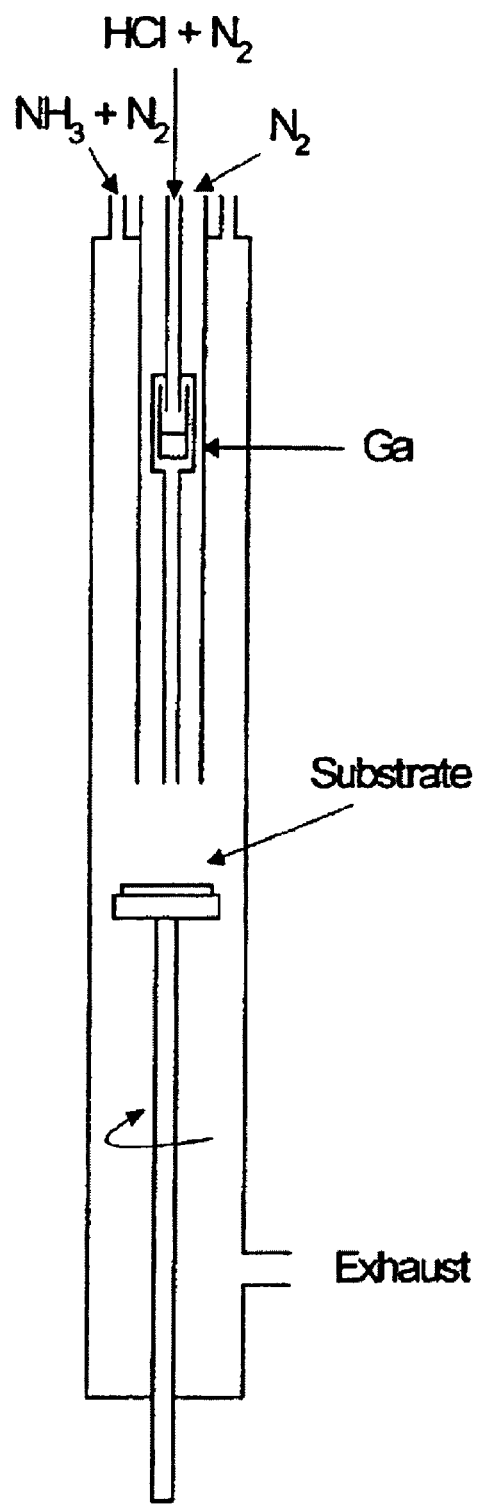
FIG. 20 is a schematic of an HVPE reactor.

GaN textured templates were prepared by the HVPE method. The GaN textured templates were grown on a custom built HVPE reactor (see FIG. 20). In this reactor, the Group III precursor, GaCl(g), was synthesized upstream by flowing hydrogen chloride (HCl) onto a quartz boat containing Ga at temperatures between 500° C. to 1000° C. GaCl(g) then mixes with ammonia (NH3) downstream near the surface of the sapphire wafer to form GaN at temperatures between 900° C. to 1200° C. as shown in FIG. 20. The reactor was divided into four zones, wherein each zone temperature was controlled individually. It had three separate delivery tubes for the reactant gasses and diluents. Nitrogen and/or hydrogen were used as diluents and carrier gasses to both NH3 and HCl. Nitrogen was also sent through the middle tube where it acted as a gas curtain or sheath downstream to prevent the premixing of the GaCl and NH3 before they hit the substrate surface.

The GaN templates (both with smooth and randomly textured surfaces) were grown under high growth rate conditions ranging from 30-200 μm/hr that was controlled by the NH3/Group III precursors flow ratios of 10 to 300. The templates were grown using a variety of techniques. One of these was a three-step growth method employing a substrate surface pretreatment with GaCl(g) or nitridation of the sapphire substrate at 1000° C., followed by a thin GaN buffer layer growth at 590° C. The growth zone was then ramped-up to 1070° C. for the high temperature GaN growth. Another method employed an external pretreatment of the sapphire surface prior to growth with sputtered ZnO. The usual thickness of the ZnO was from 500 Å to 1500 Å. Growth of the GaN templates was then carried out by directly heating up the chamber up to the growth temperature and flowing the reactant gases to initiate the growth.

FIG. 8a shows an SEM image of a GaN template with random texture grown via the HVPE method. The growth was carried out with a three-step growth technique using 25 sccm of HCl during the pretreatment at 1000° C., an NH3/Group III ratio of 150 during the buffer layer growth at 590° C. and an NH3/Group III ratio of 60 during the high temperature growth at 1070° C. The degree of texture was found to depend on the amount of GaCl arriving at the growth front which also controls the growth rate.

Figure 21:
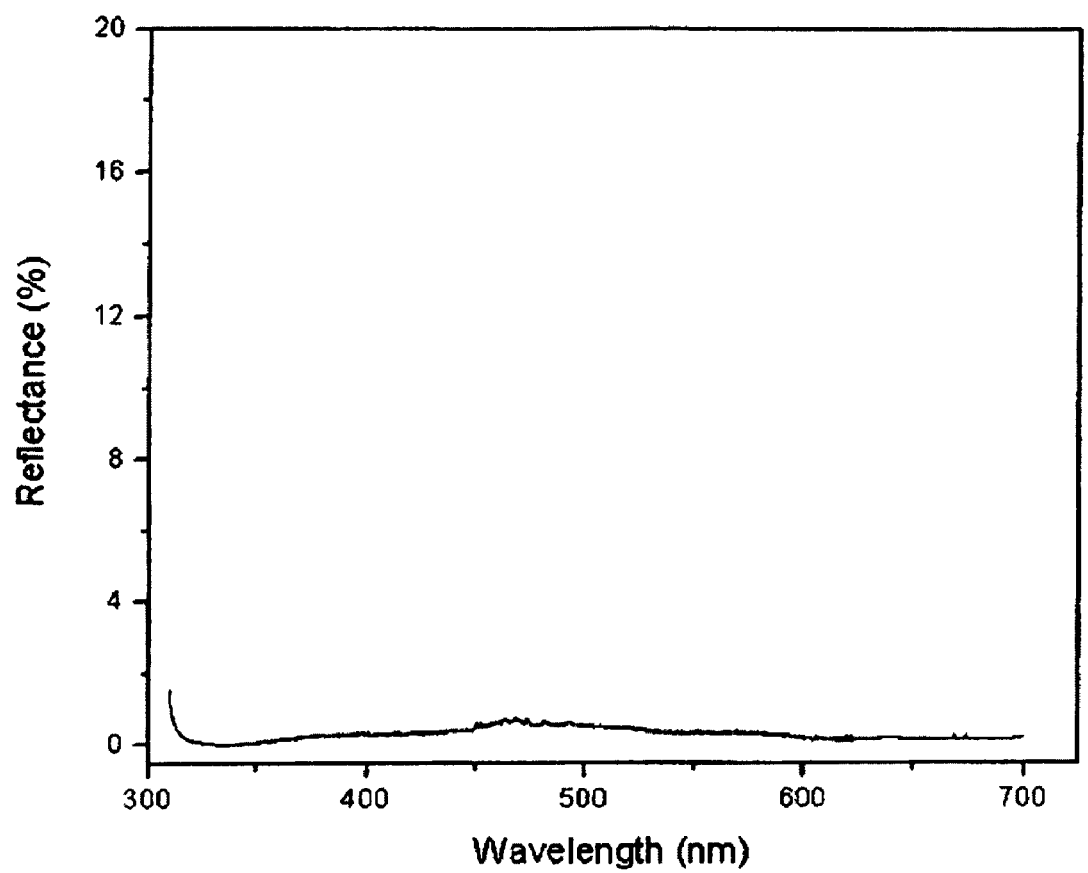
FIG. 21 is a reflectance spectrum of a randomly textured GaN template grown via HVPE.

The reflectivity of the textured surface, described in FIG. 8a, is shown in FIG. 21. As can be seen from this figure, the reflectivity was below 1% between 325 nm and 700 nm. This should be contrasted with the reflectivity of a smooth film, which is about 18%.

The room temperature photoluminescence (PL) from two GaN films grown by the HVPE method, one with atomically smooth surface and the other with a randomly textured surface, is shown in FIG. 9. The two films were measured under identical conditions using a 10 mW HeCd laser. From these data we see that the photoluminescence intensity of the sample with the textured surface was 55 times larger than the photoluminescence intensity of the smooth film.

EXAMPLE VII

Photoluminescence of GaN Templates with Different Surface Roughness

GaN templates with various surface textures were grown and their photoluminescence spectra were measured using an Argon-ion laser emitting at 244 nm and at output power of 20 mW. These templates were characterized first by atomic force microscopy (AFM). FIGS. 25 to 32 show the AFM surface morphologies for the GaN textured templates VH092403-81 (VH81), VH082504-129 (VH129), VH061603-63 (VH63) and VH080604-119 (VH119). The rms roughness of these templates varies from 627 nm to 238 nm. Other information from these data is listed in the figure captions.

The luminescence spectra for the GaN textured templates described in FIGS. 25 to 32 are shown in FIG. 33. Listed in the inset are the rms roughness of the various templates as well as the full width at half maximum (FWHM).

Figure 34:
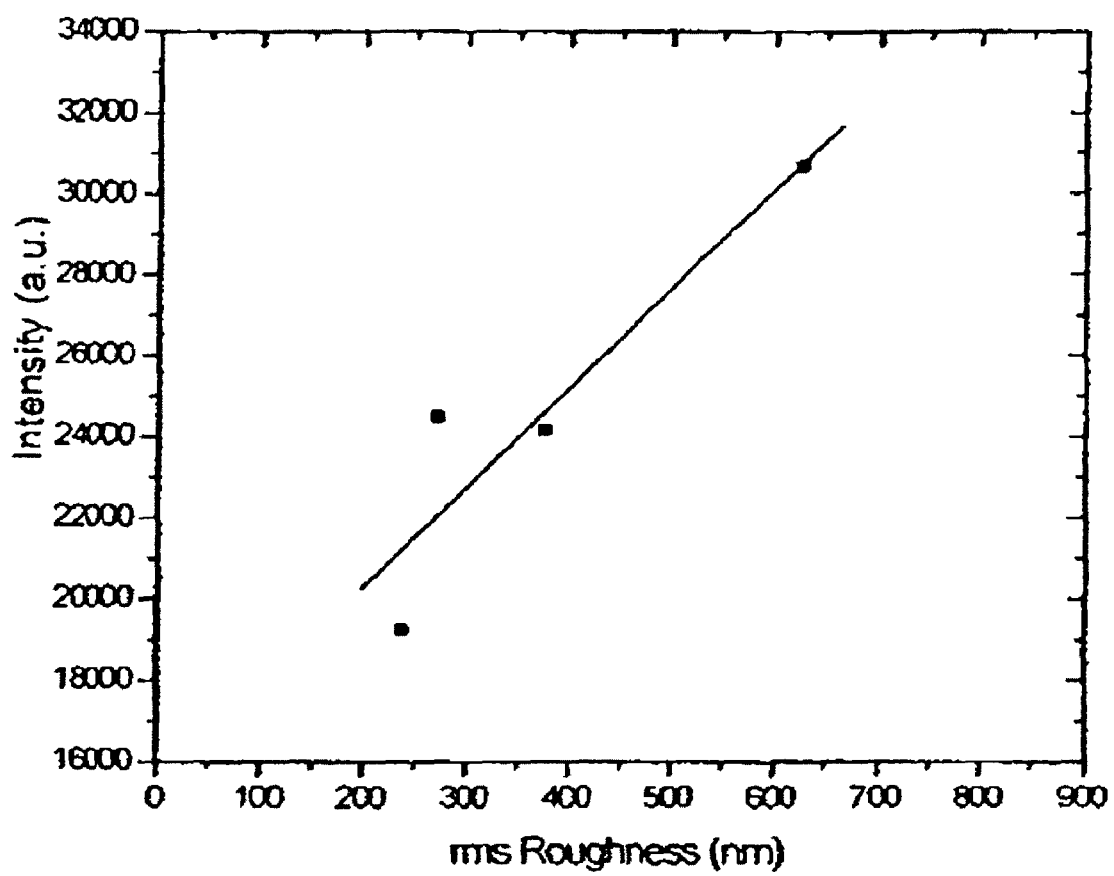

The peak intensity versus the rms roughness is shown in FIG. 34. It is apparent from these data that the luminescence intensity increases with rms roughness.

Figure 22A:
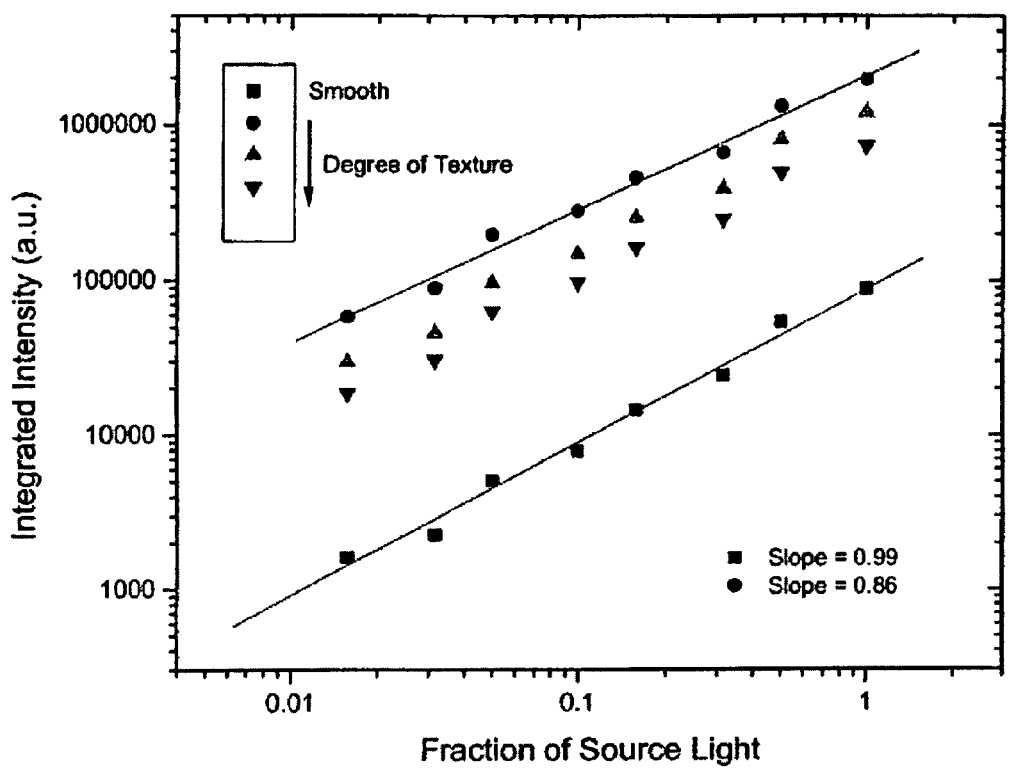
FIG. 22a shows the photoluminescence efficiency of several GaN templates with smooth and varying degrees of textured surface.
Figure 22B:
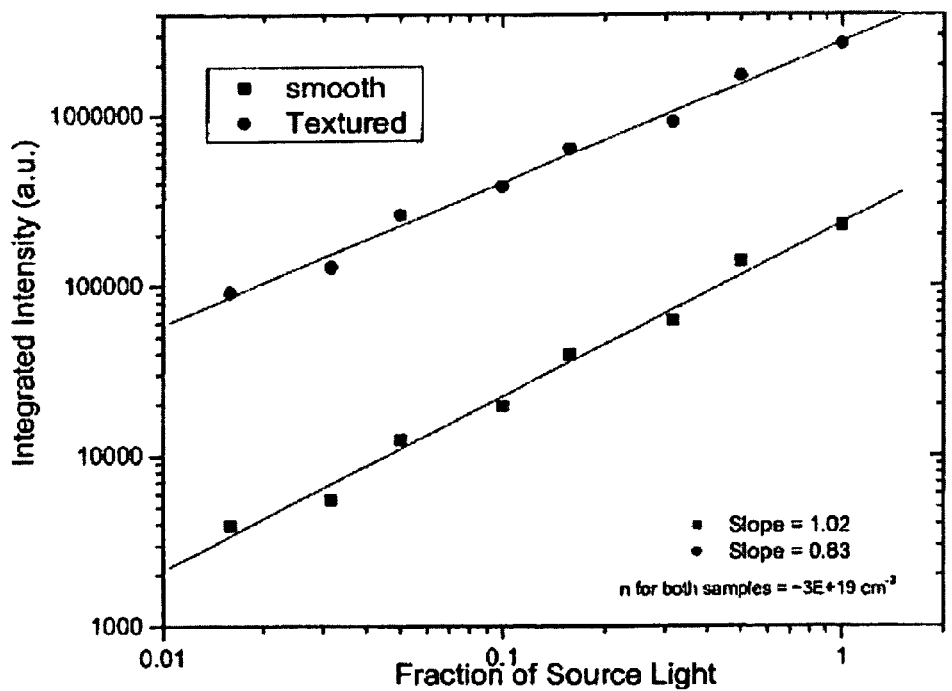
FIG. 22b shows the photoluminescence efficiency of two GaN templates with smooth or textured surface, and having the same concentration of carrier.

To further test the efficiency of the GaN textured template in light extraction, excitation intensity-dependent photoluminescence measurements were done. FIG. 22(a) shows a comparison of the efficiency between several templates with different degree of texturing, including a GaN with a smooth surface, while FIG. 22(b) shows measurements done on a smooth film and a textured template with the same carrier concentration. From the figure, it is evident that the high photoluminescence intensity is not due to high n-doping concentration.

EXAMPLE VIII

Formation of III-Nitride Textured Surfaces Along Non-Polar Directions

Figure 23:
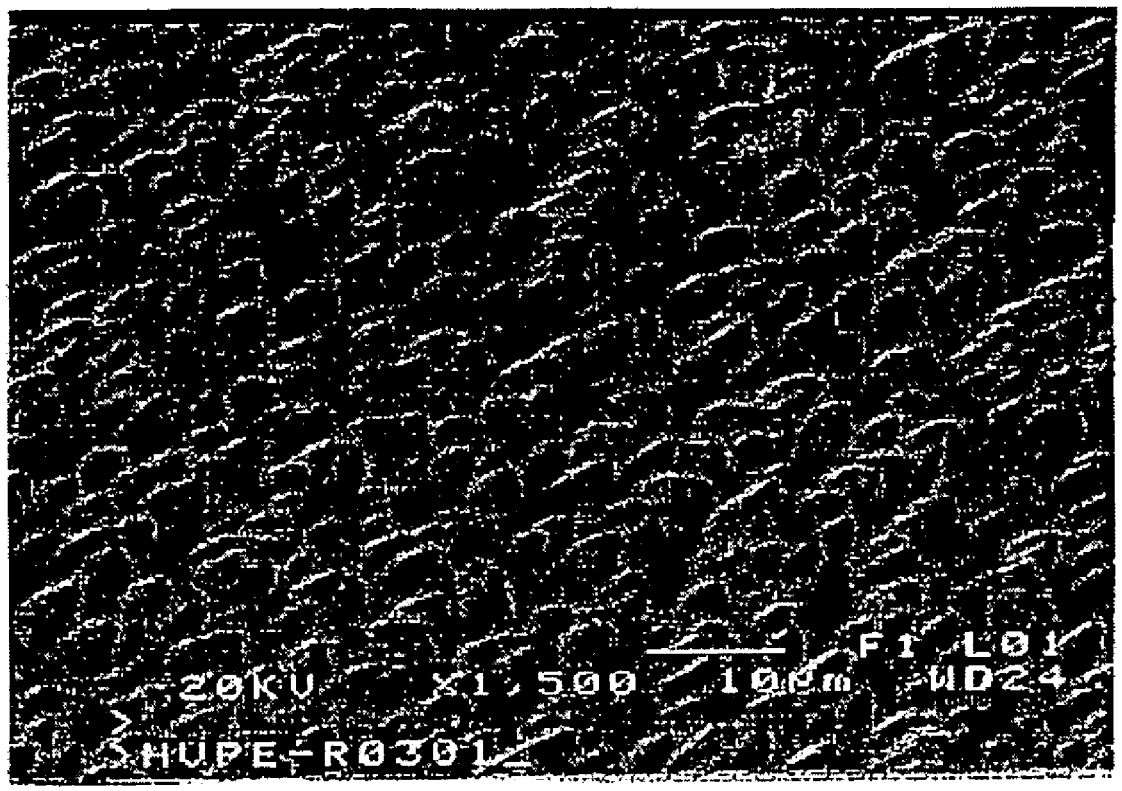
FIG. 23 shows the surface texture obtained in GaN films grown on the R-plane of sapphire (1-102) by HVPE.

FIG. 23 shows the type of surface texture obtained in GaN films grown on the R-plane sapphire (1-102) by HVPE. This template was also grown by the three-step process as described in Example VII.

Figure 24:
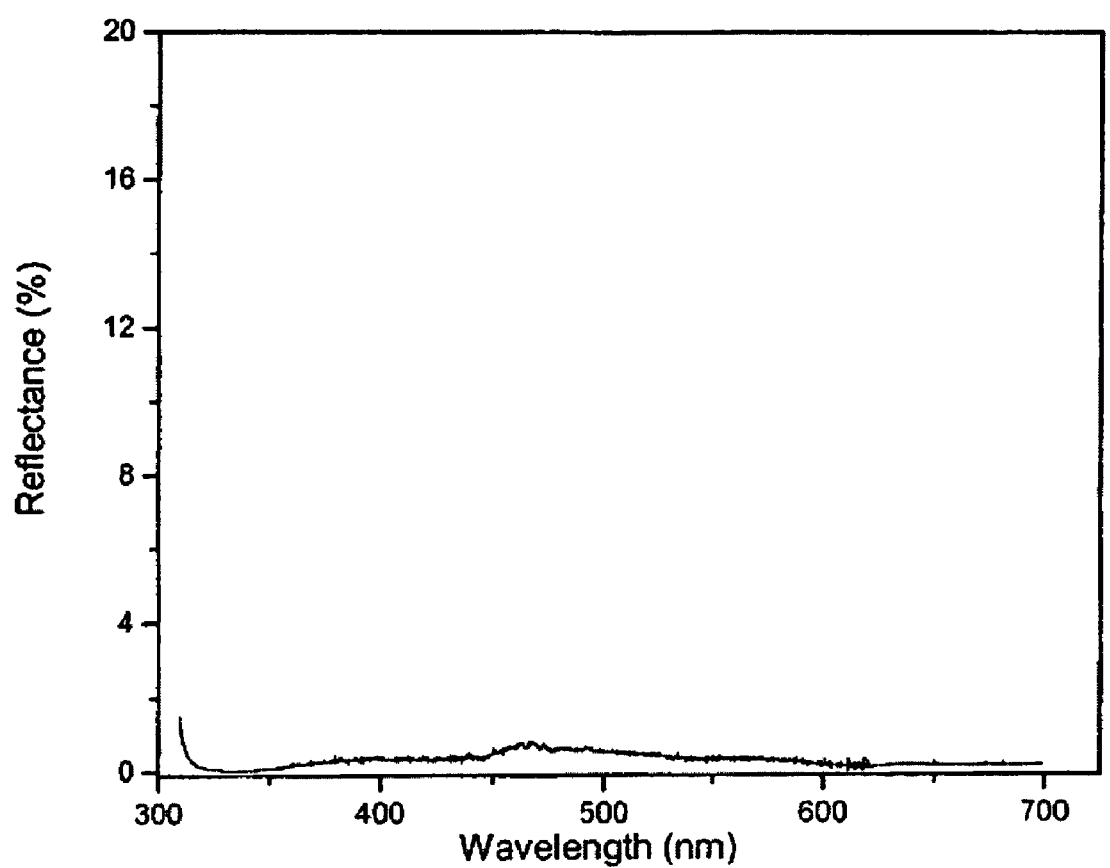
FIG. 24 shows the reflectivity of the textured surface described in FIG. 23.
Figure 25A:
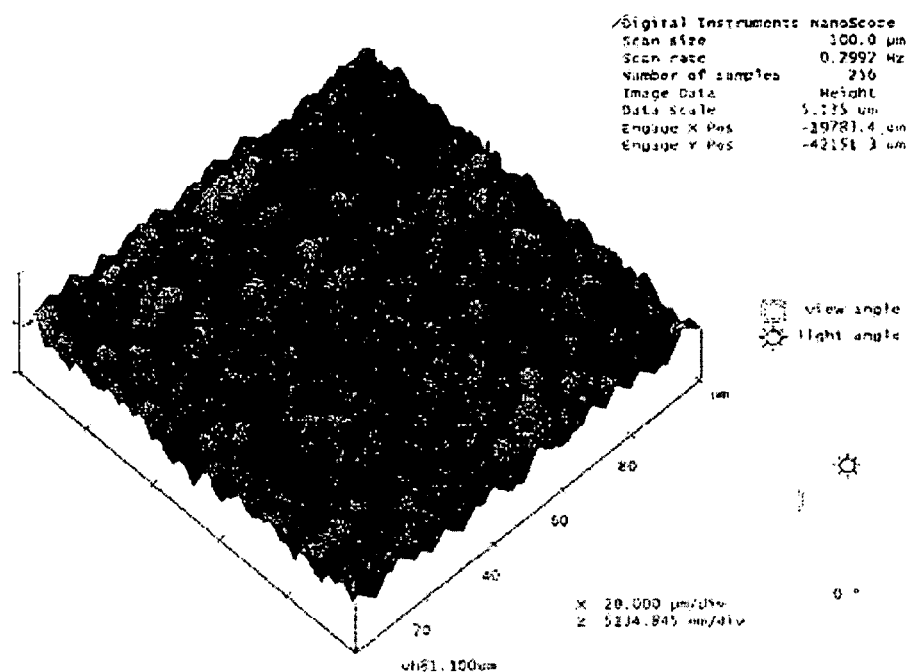
FIG. 25a shows the surface morphology of a textured GaN template (VH81) by AFM.
Figure 25B:
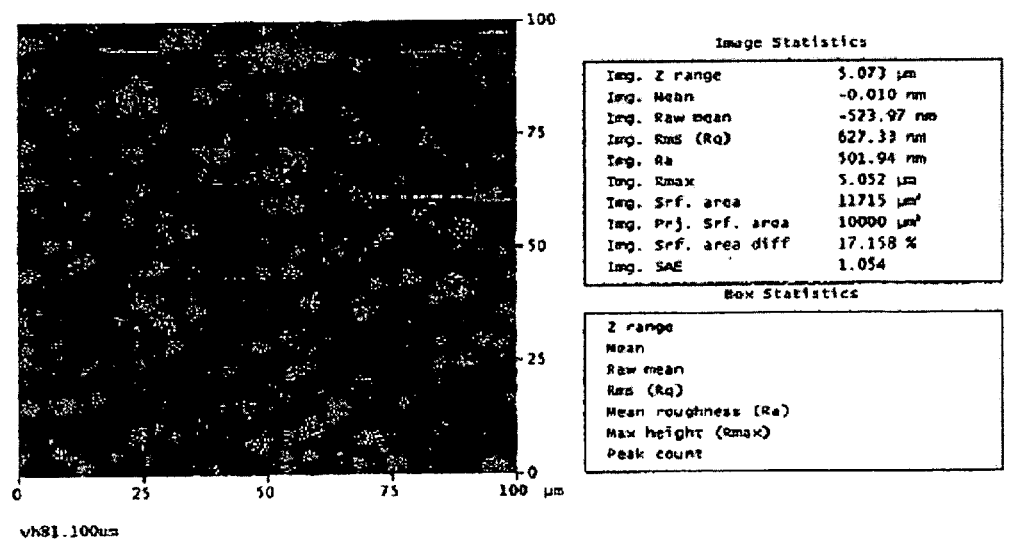
Figure 26A:
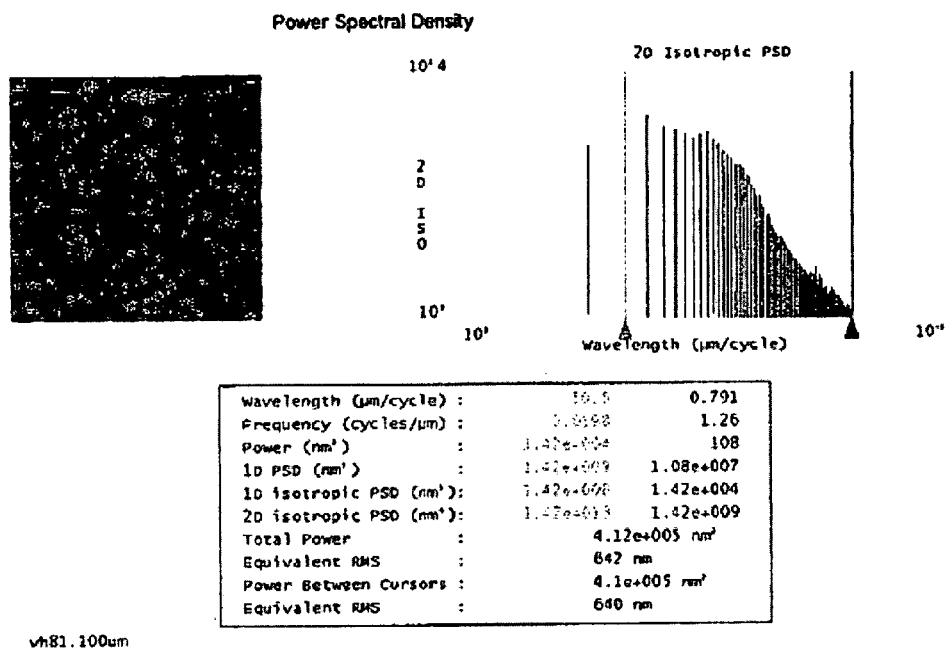
Figure 26B:
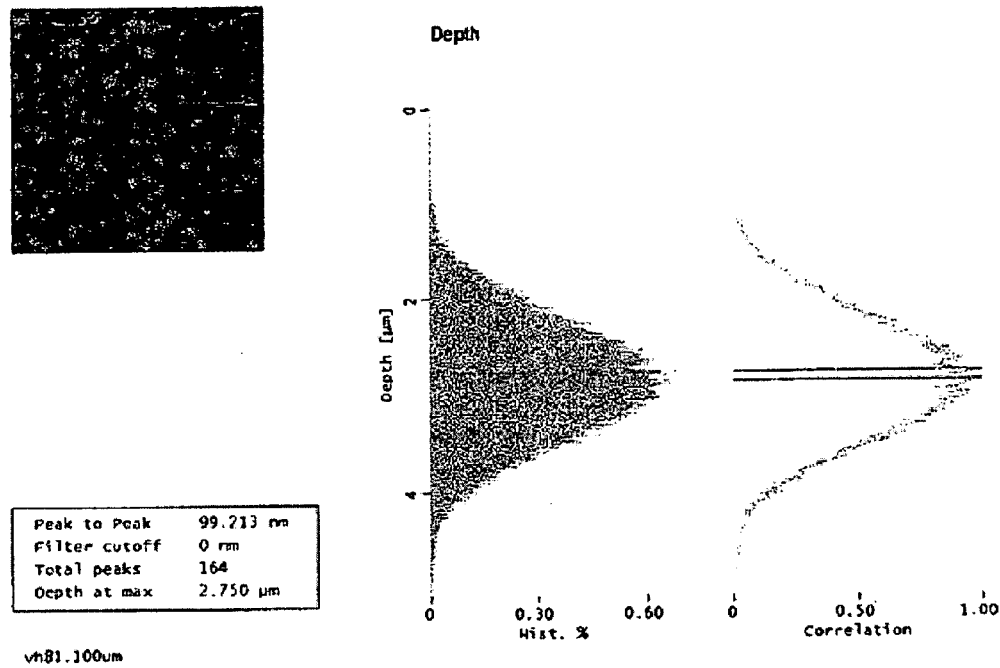
Figure 27A:
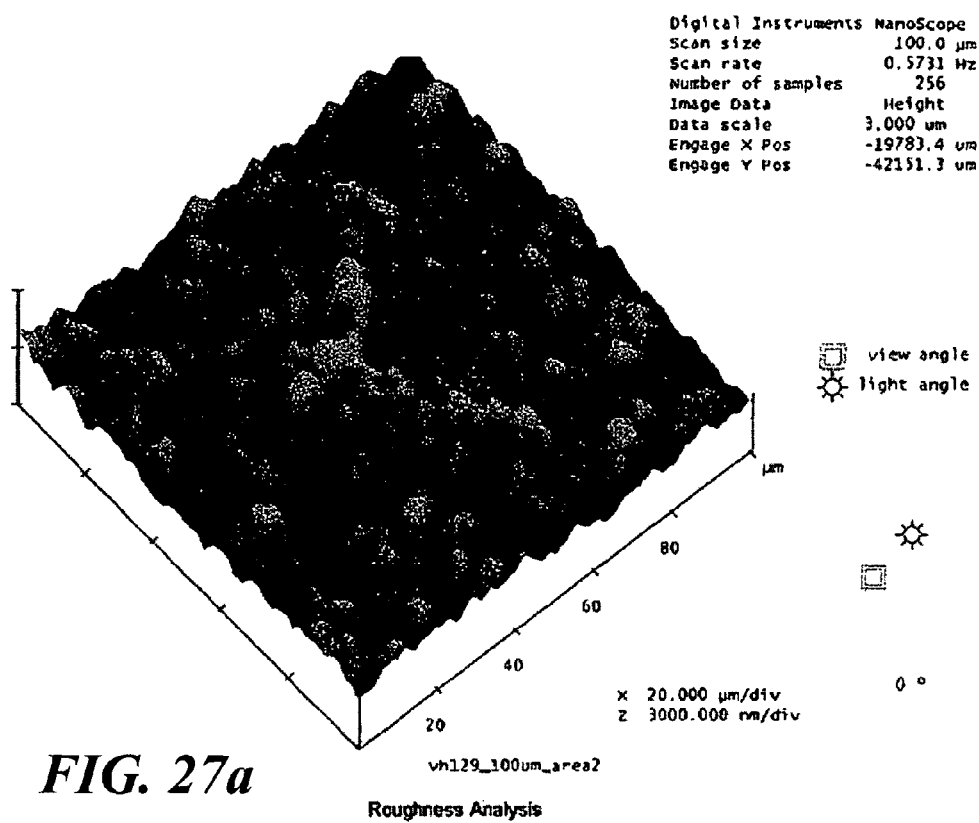
FIG. 27a shows the surface morphology of a textured GaN template (VH129) by AFM.
Figure 27B:
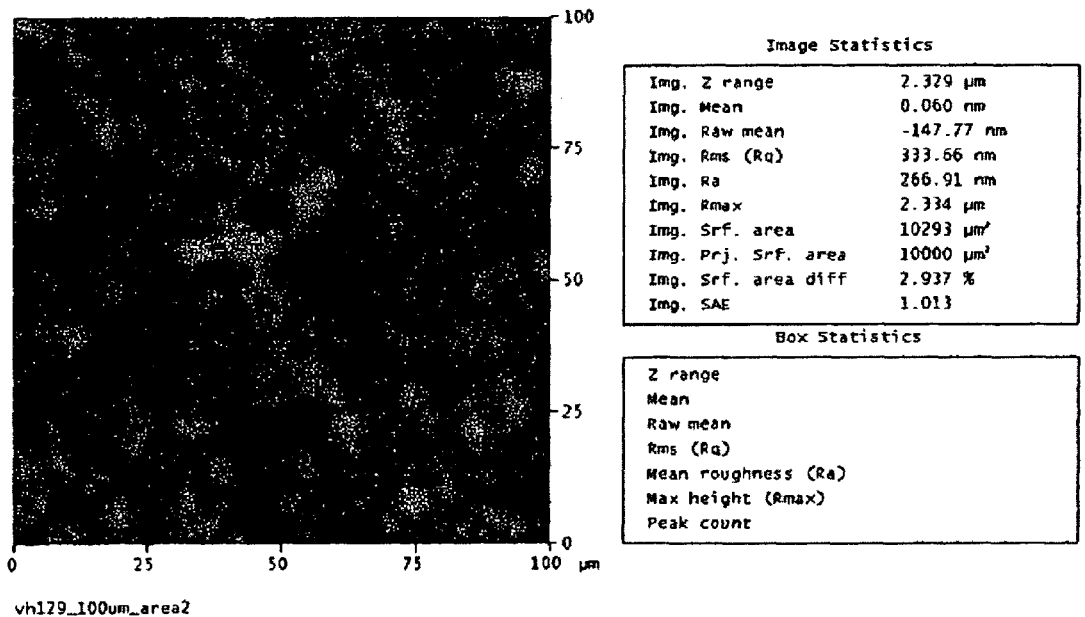

The reflectivity of the textured surface described in FIG. 23 is shown in FIG. 24. As can be seen from this figure, the reflectivity was below 1% between 325 nm and 700 nm.

EXAMPLE IX

Figure 28A:
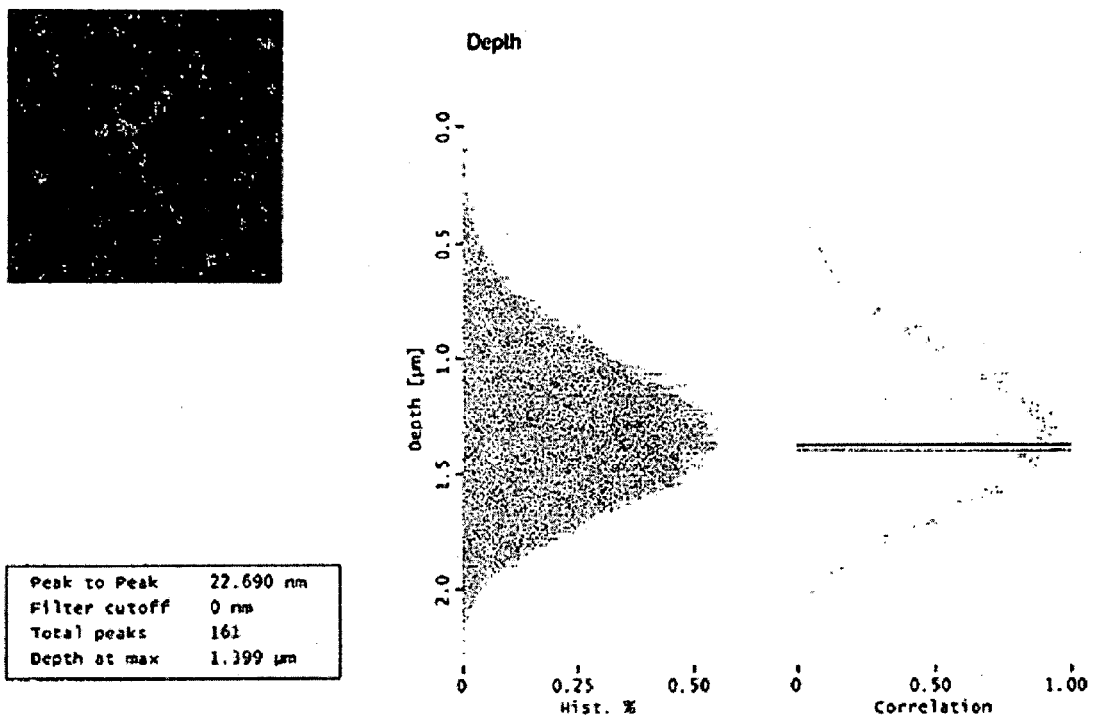
Figure 28B:
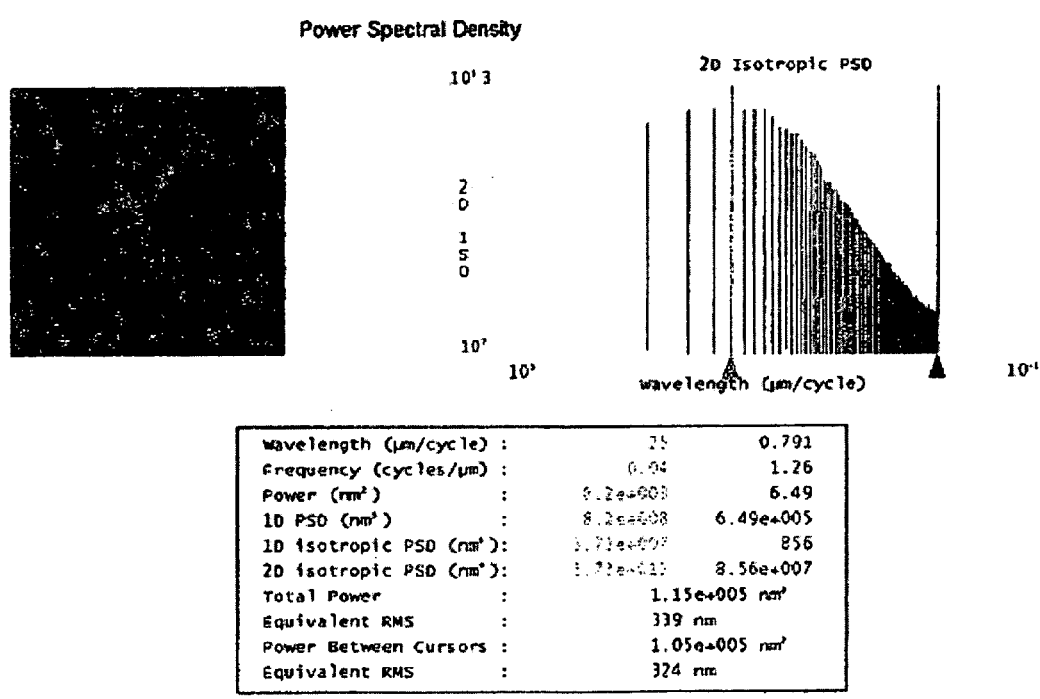
Figure 29A:
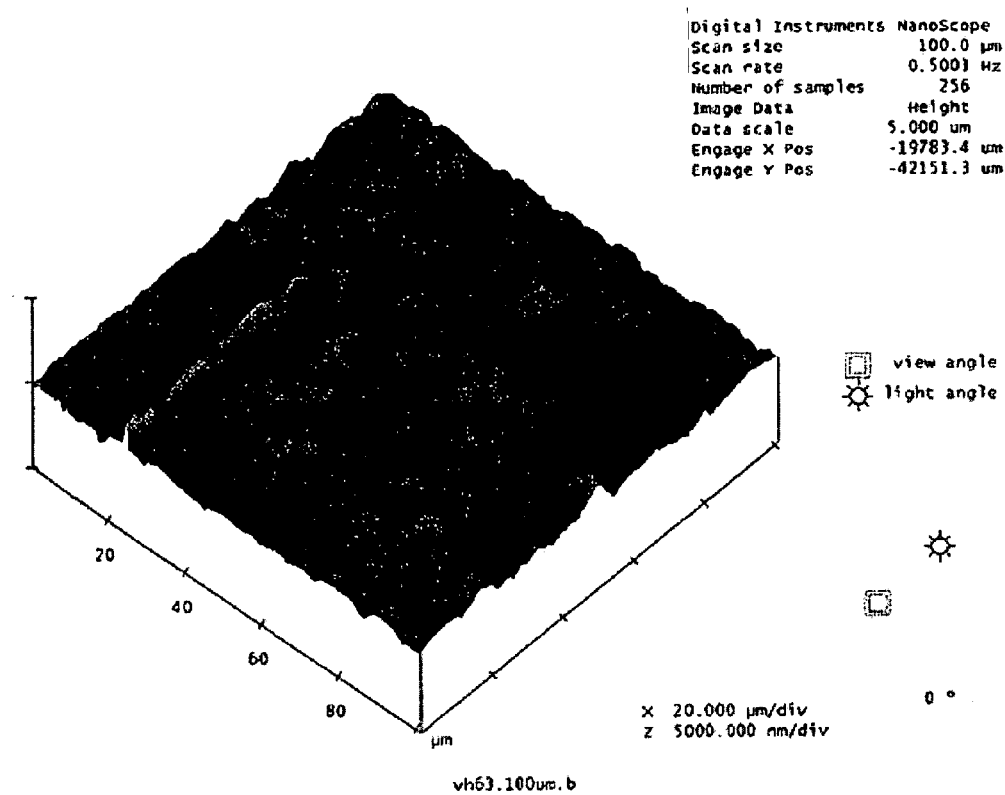
FIG. 29a shows the surface morphology of a textured GaN template (VH63) by AFM.
Figure 29B:
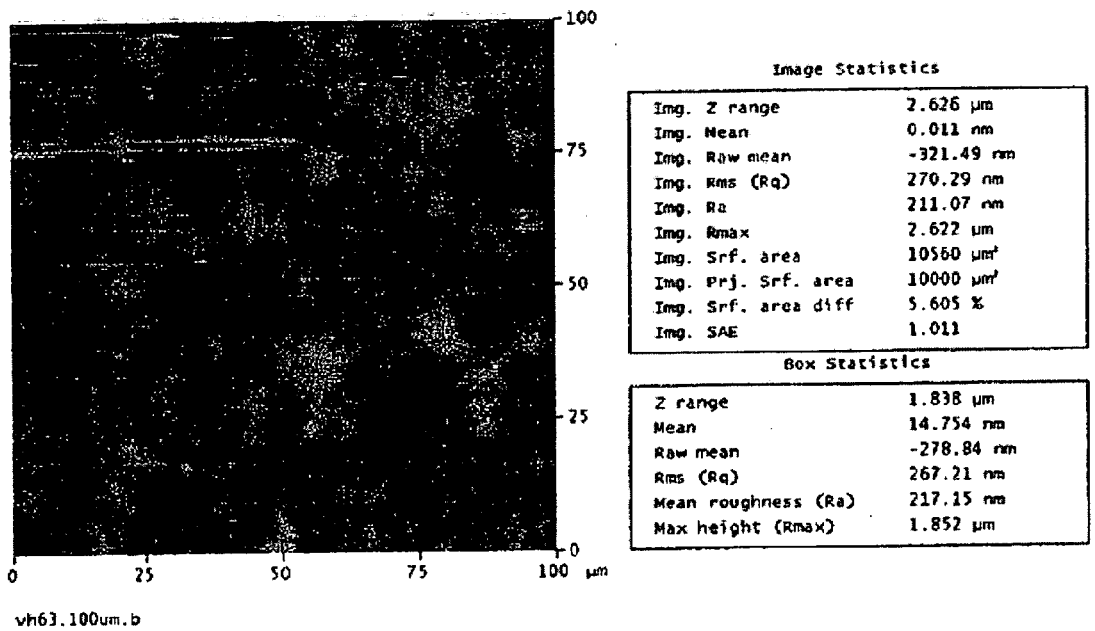
Figure 30A:
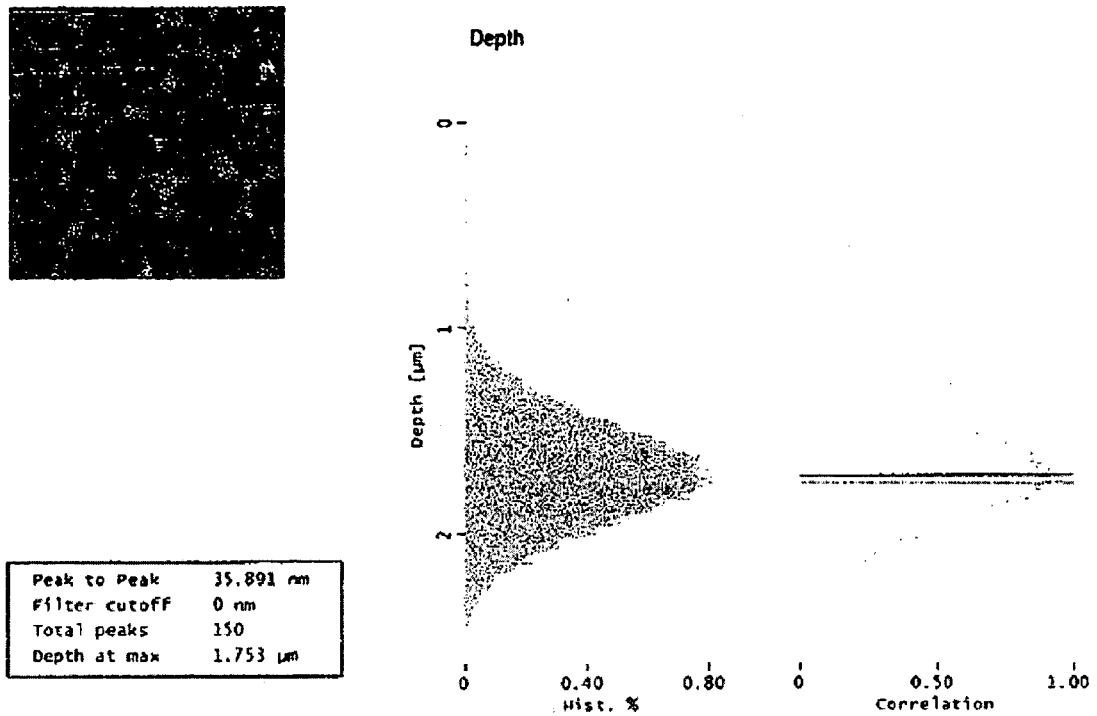
Figure 30B:
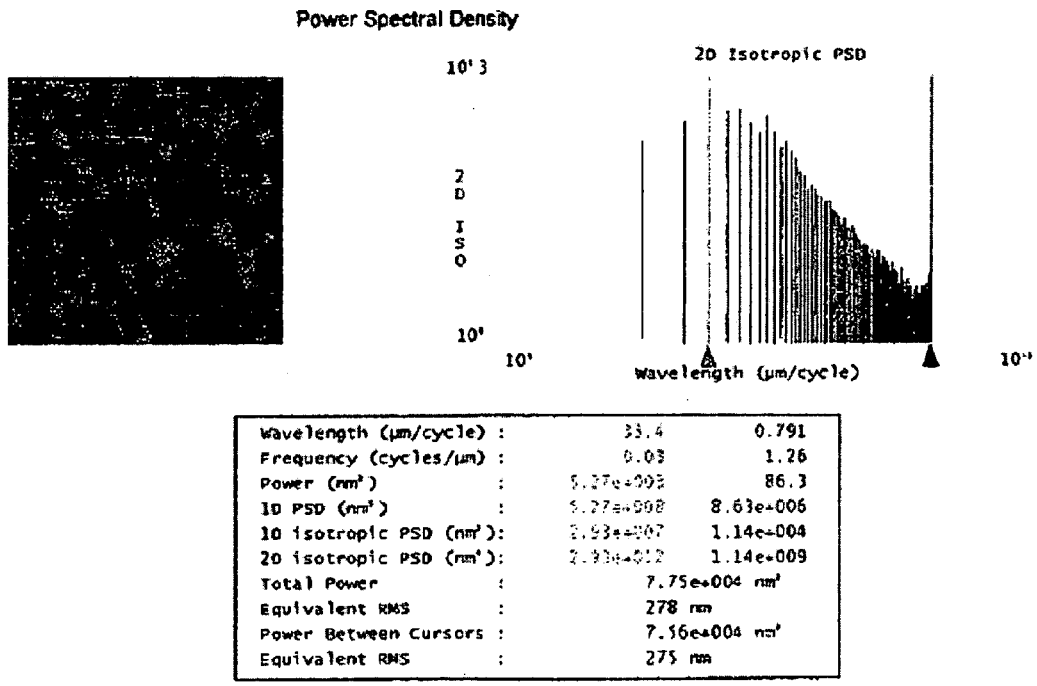
Figure 31A:
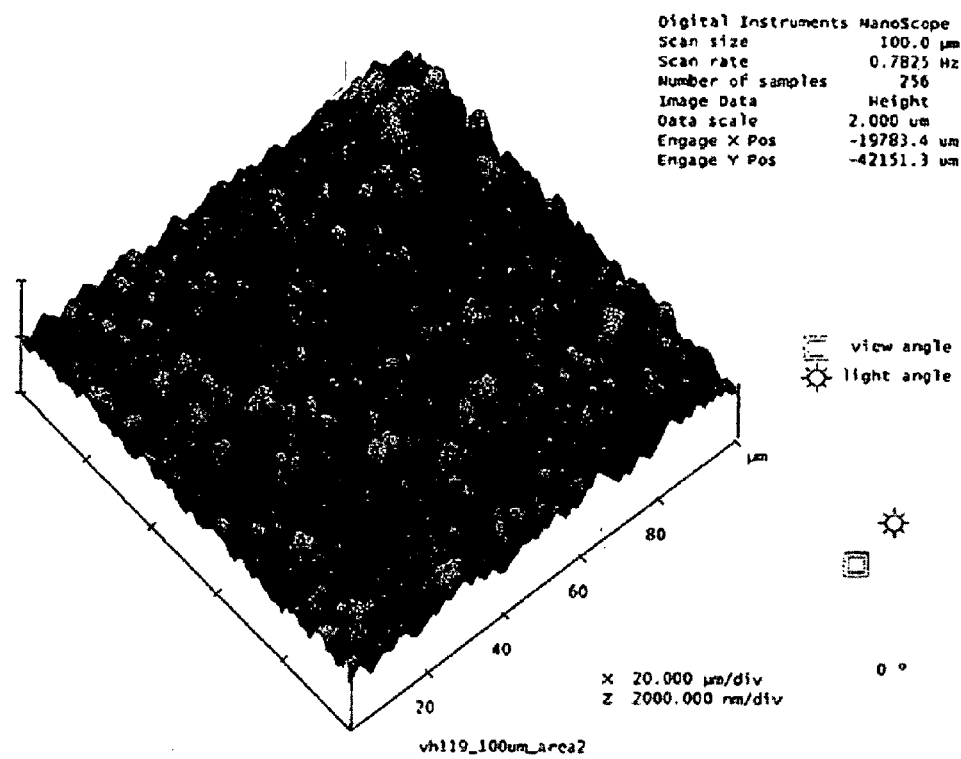
FIG. 31a shows the surface morphology of a textured GaN template (VH119) by AFM.
Figure 31B:
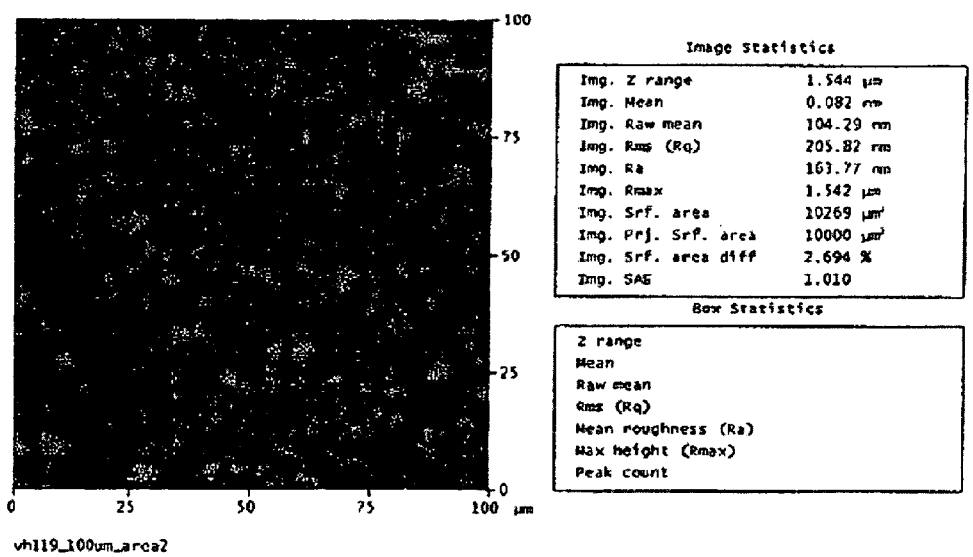
Figure 32A:
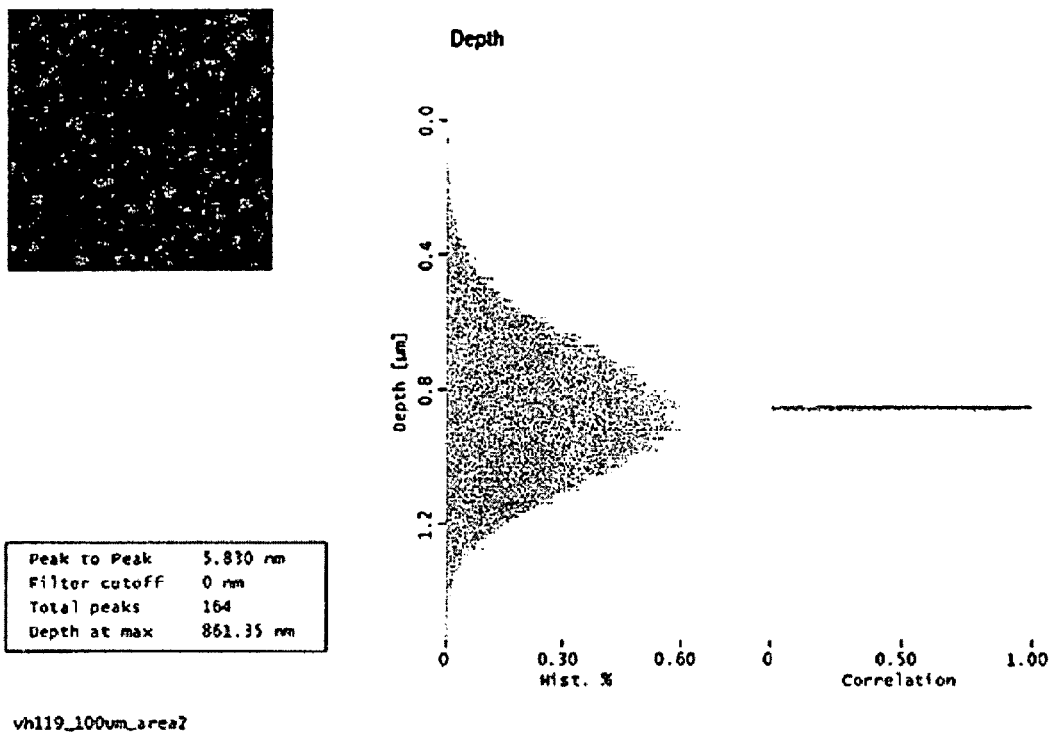
Figure 32B:
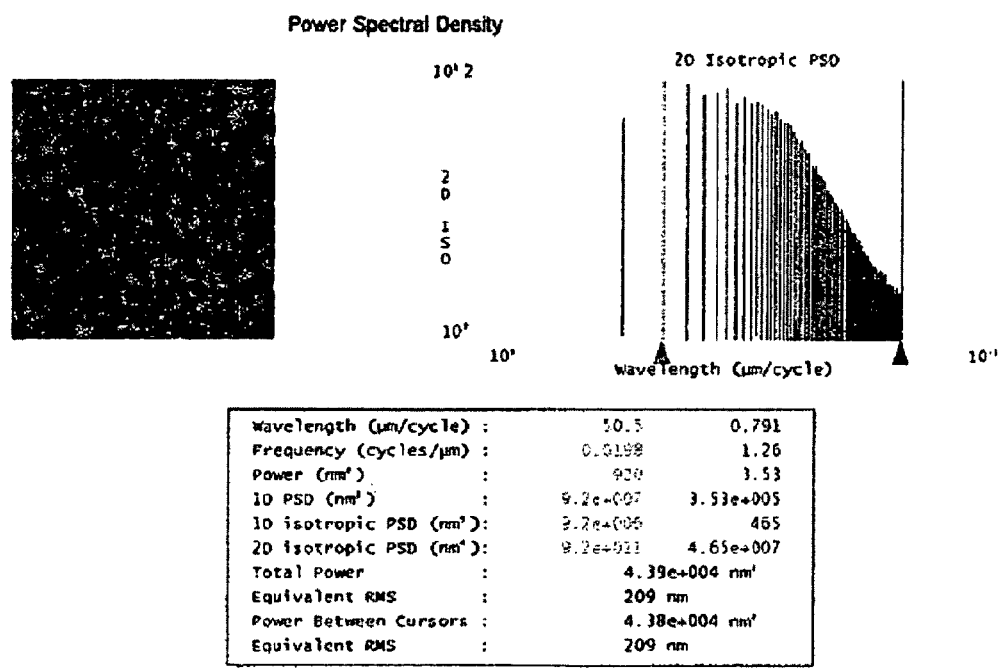
Figure 33A:
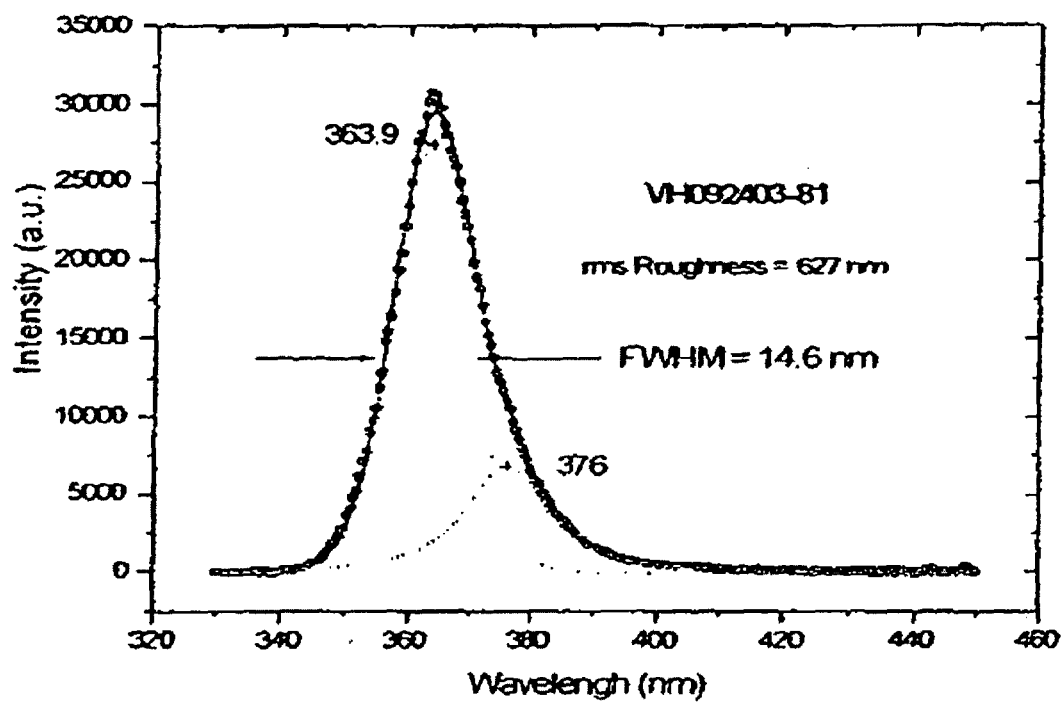
FIGS. 33a, 33b, 33c, and 33d show the photoluminescence spectra for GaN templates having different rms roughness as described in FIGS. 25a, 27a, 29a, and 31a, respectively.
Figure 33B:
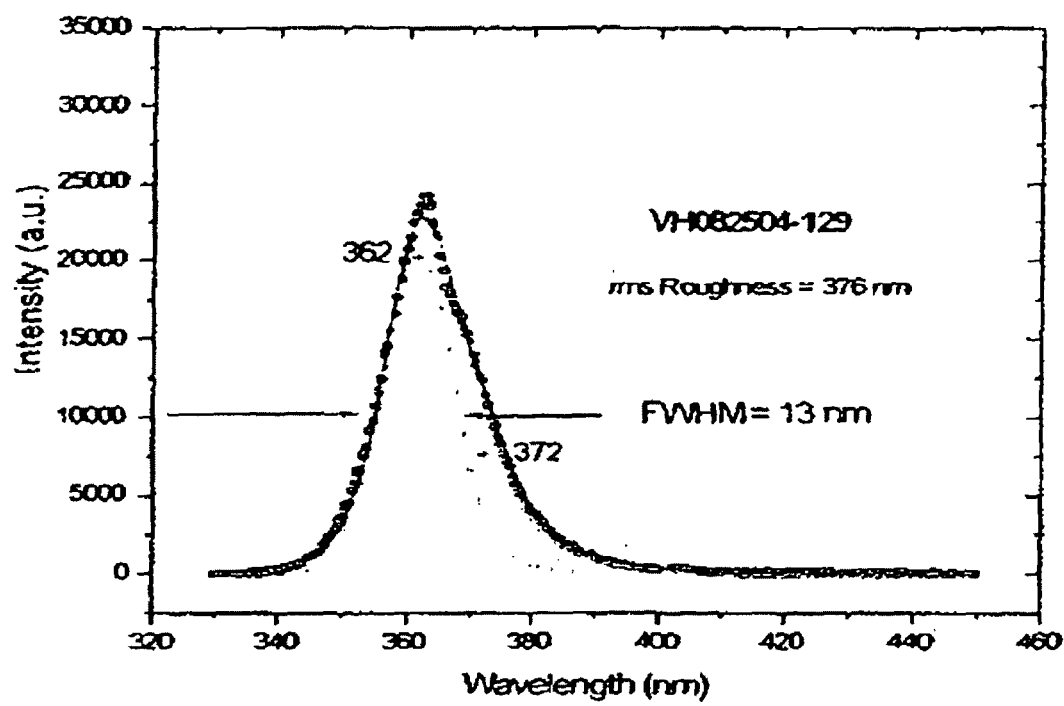
Figure 33C:
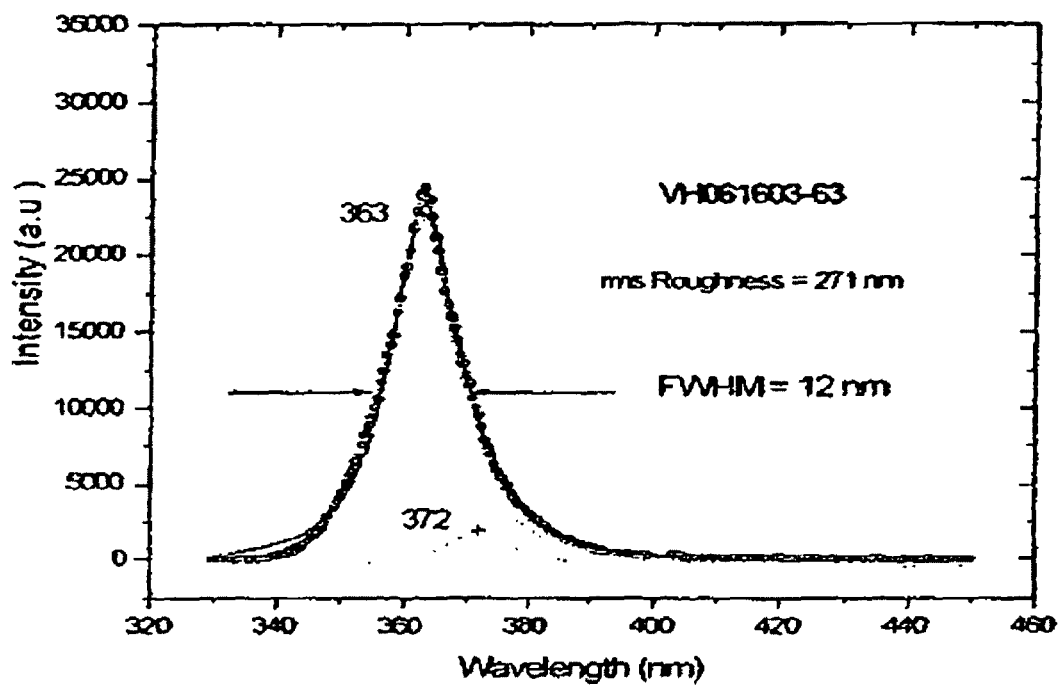
Figure 33D:
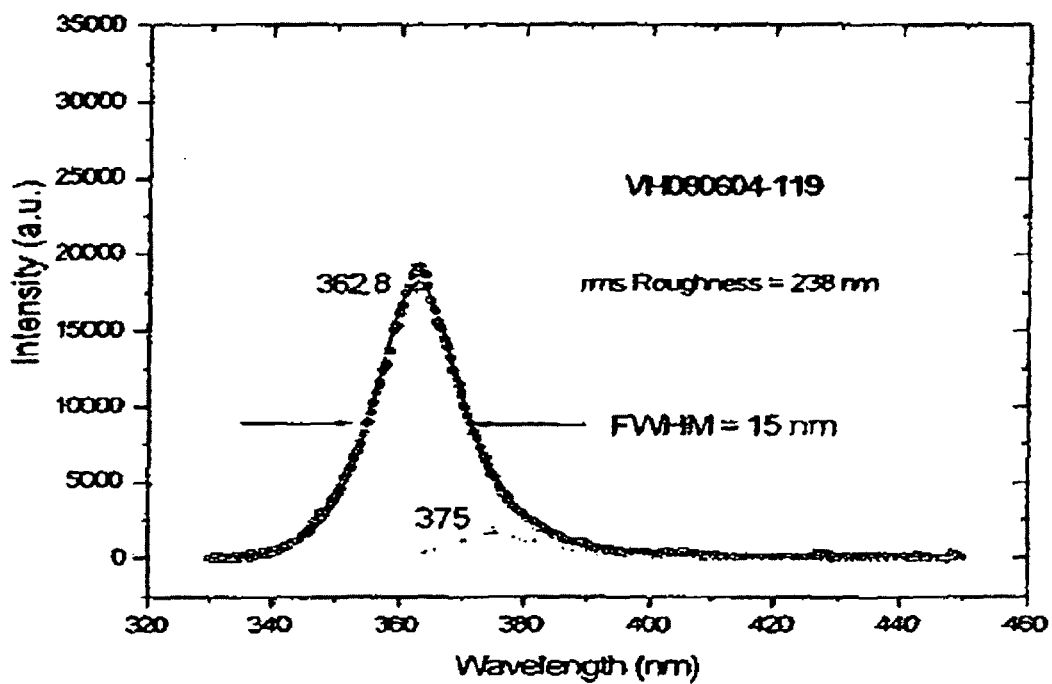
Figure 35:
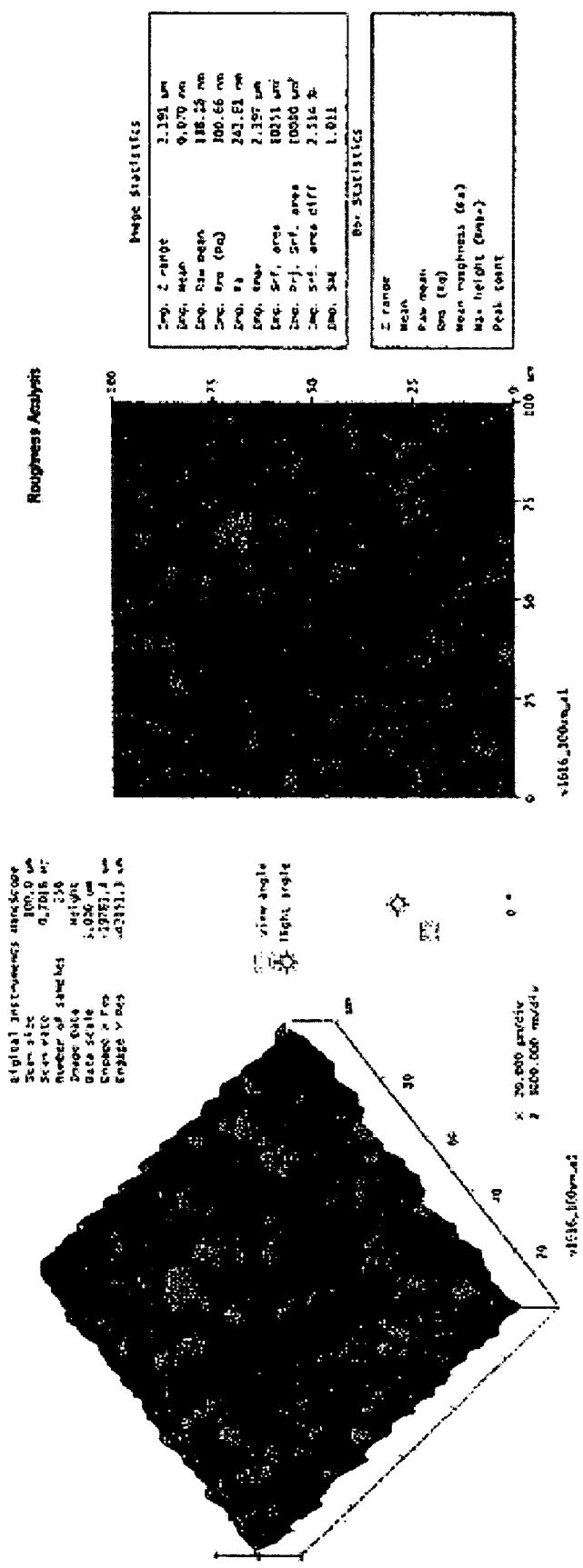
FIG. 35 shows the AFM surface morphology and roughness analysis of GaN/AlGaN MQWs grown on a GaN textured template (VH129)

Formation of GaN/AlGaN Multiple Quantum Wells (MQWs) on a Textured GaN Template Grown Along the Polar Direction To further test the ability to form LED structures on the textured GaN templates, 10 pairs of GaN/Al0.2Ga0.8N MQWs were deposited by MBE on GaN textured template VH129 (see FIG. 28). The MQWs were formed using an RF plasma source to activate molecular nitrogen and Knudsen effusion cells to evaporate the Ga and Al. Various MQWs were formed and doped n-type with Si introduced either in the quantum wells or the barriers or both. Alternatively, the MQWs could have been grown using NH3 as the nitrogen source. Similar MQW structures could also have been grown by the MOCVD method. Similar methods could also be used to grow InGaN/AlGaN MQWs with various compositions for emission in the near UV and the visible part of the electromagnetic spectrum. FIG. 35 shows the AFM surface morphology of the GaN/AlGaN MQWs grown on the GaN textured template VH129. The surface morphology and texture did not change upon the deposition of the MQWs. In other words, the MQWs coated the surface of the template conformally.

EXAMPLE X

Figure 36:
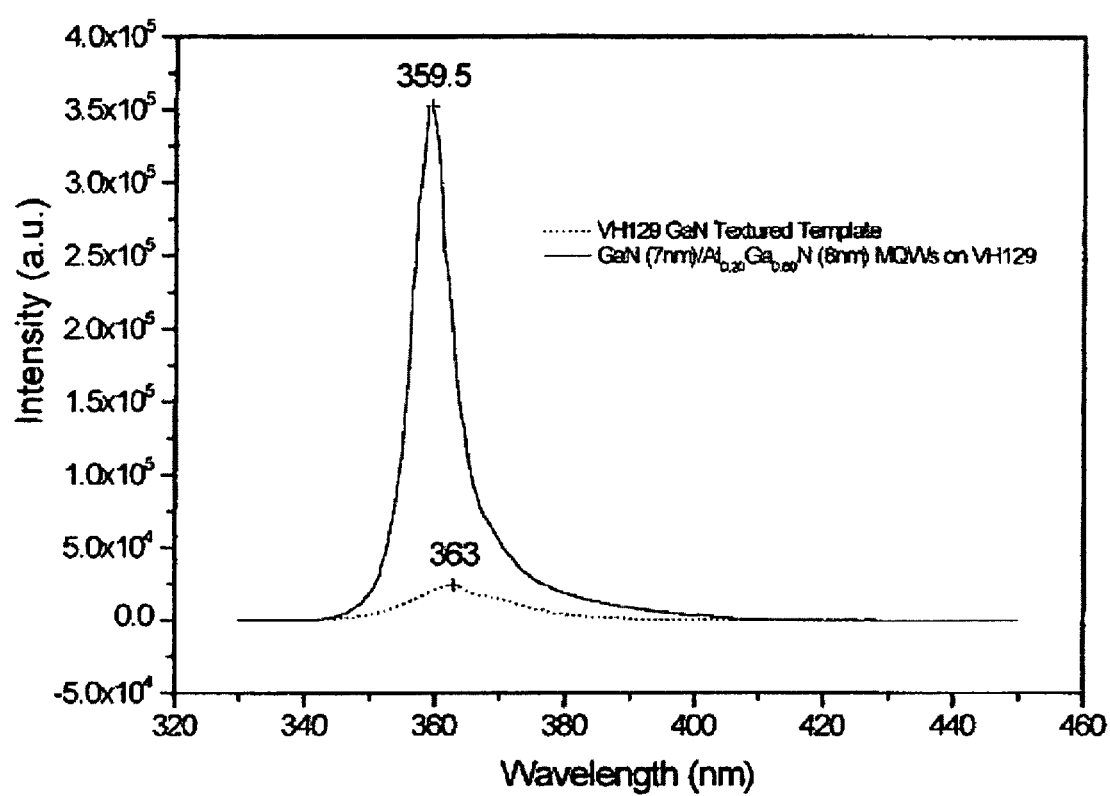
FIG. 36 shows the photoluminescence spectra for a GaN (7 nm)/Al0.2Ga0.8N (8 nm) MQW structure and the GaN textured template (VH129, see FIG. 28) used to grow the MQW structure.

Photoluminescence of GaN/AlGaN Multiple Quantum Wells on a Textured GaN Template Grown Along the Polar Direction The photoluminescence spectra for one GaN (7 nm)/Al0.2Ga0.8N (8 nm) MQW structure grown on GaN texture template VH082504-129 (FIG. 28) is shown in FIG. 36. As can be seen from the data, the luminescence intensity from the MQWs is significantly higher than that of the GaN textured template. Specifically, the ratio of the peak intensities is 14. Furthermore, the emission from the MQWs is blue shifted compared to the emission from the GaN textured template.

Figure 37:
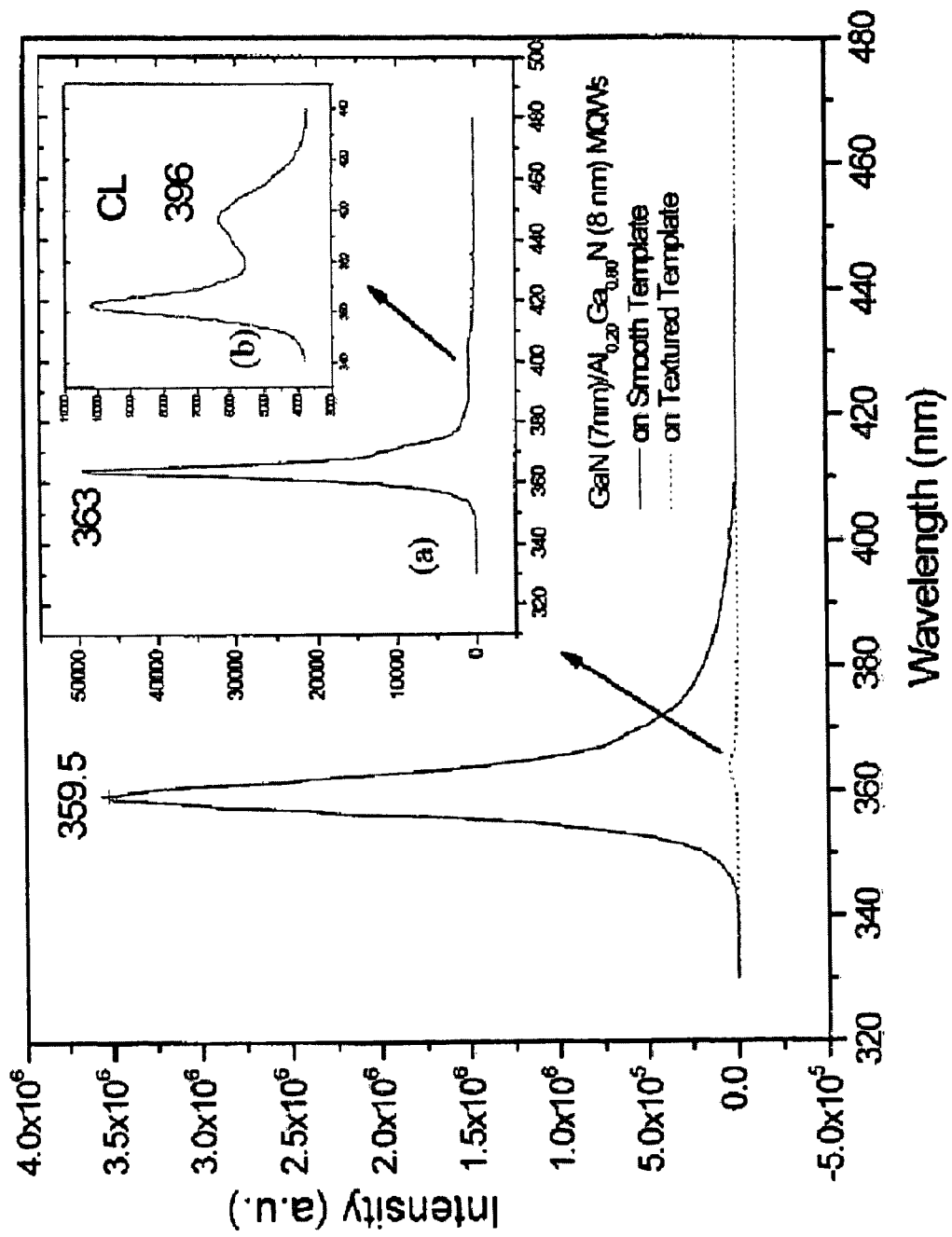
FIG. 37 shows photoluminescence spectra for identical GaN/AlGaN MQWs grown by MBE on textured and atomically smooth GaN templates.

In FIG. 37, photoluminescence spectra are shown for identical GaN/AlGaN MQWs grown by MBE on textured and atomically smooth GaN templates. Inset (a) shows in larger scale the photoluminescence spectrum from the MQWs grown on the smooth GaN template. The main peak in the photoluminescence spectrum from the smooth template is due to the photoluminescence from the template itself. The photoluminescence from the MQWs has been quenched due to the QCSE which is present in MQWs grown along the polar [0001] direction. The luminescence spectra from the MQWs on the smooth GaN template is shown in inset (b), in which low voltage (4 kV) cathodoluminescence (CL) was used to probe as near the surface as possible. From the inset, the luminescence peak of the MQWs is centered at 396 nm. Thus, if the number of counts from the MQWs on the smooth template is estimated at about 5000, and the peak intensity of the photoluminescence from the MQWs on the textured templates is $3.50 \times 10^6$, the ratio is around 700.

Figure 38:
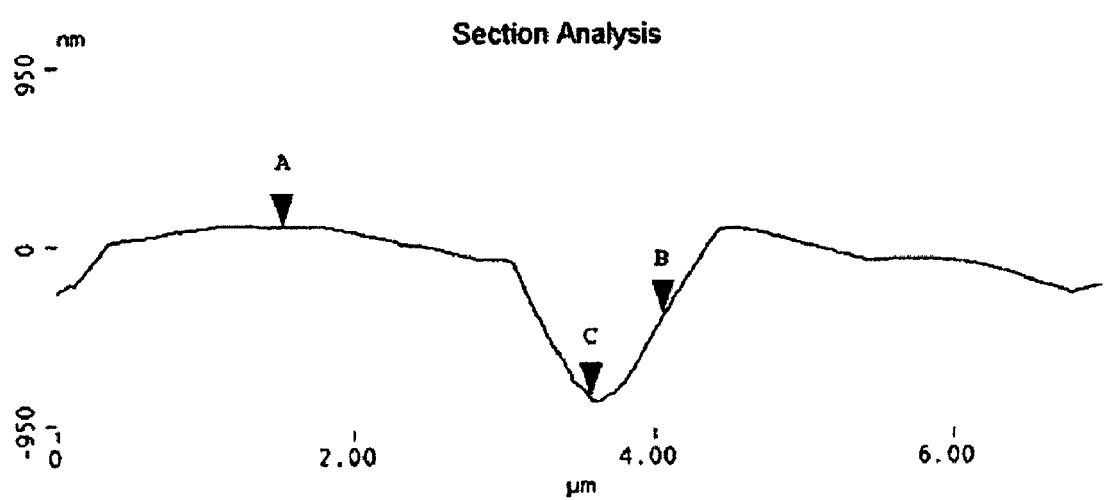
FIG. 38 shows schematically the types of surface positions used for the cathodoluminescence analysis shown in FIG. 39.
Figure 39:
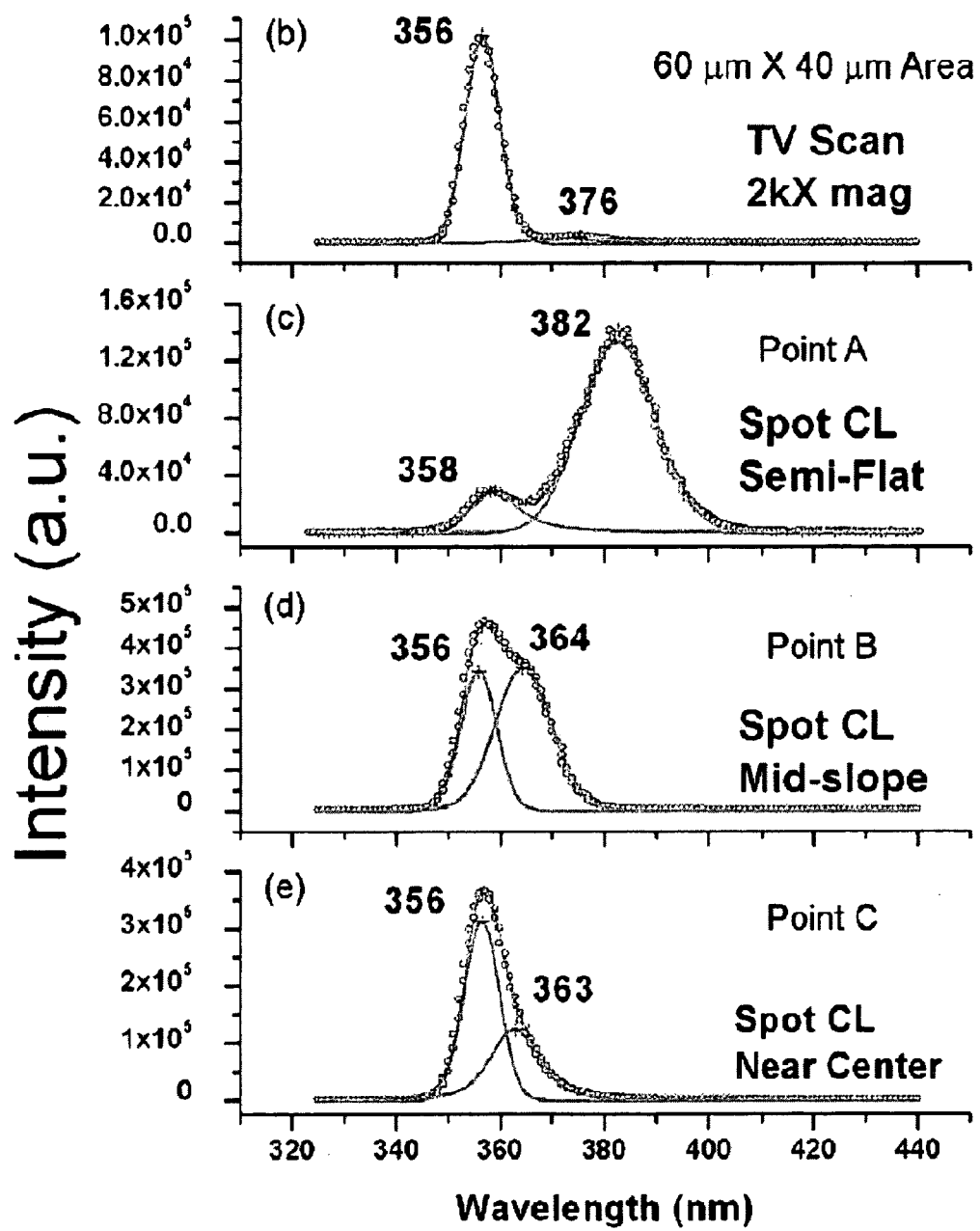
FIG. 39 shows cathodoluminescence spectra taken at points A to C indicated in FIG. 38.

To understand this very significant increase in photoluminescence intensity from GaN (5 nm)/Al0.2Ga0.8N (8 nm) MQWs grown on GaN textured templates, spot cathodoluminescence measurements were carried out from such a sample. Specifically, the cathodoluminescence spectra were measured by focusing the electron beam on flat areas of the sample (approximately [0001] orientation) and sloping areas as indicated in FIG. 38. This figure depicts the cross section of the surface along a certain direction. The cathodoluminescence spectra taken at points A to C indicated in FIG. 38 are shown in FIG. 39. FIG. 39(a) shows the cathodoluminescence spectra from a large illuminated area (60 µm×40 µm). The two peaks at 356 nm and 375 nm are attributed to luminescence from quantum wells which are not perpendicular to the [0001] polar direction (356 nm) and quantum wells which are almost perpendicular to the [0001] polar direction (375 nm). The 356 nm peak is blue-shifted with respect to the bulk GaN cathodoluminescence peak (364 nm) while the 375 nm is red-shifted. The red-shift of the 375 peak as well as its weak intensity can be accounted for by the internal electric fields due to polarization effects which distort the MQWs. This phenomenon is the QCSE. FIG. 39(b) show the spectra from a point illuminated area on a semi-flat area of the MQWs as shown in FIG. 38. As expected, the luminescence at 382 nm is from the distorted quantum wells due to QCSE. The smaller peak at 359 nm is attributed to miniature roughness in the flat surfaces and thus a small fraction of the quantum well surface is not perpendicular to the [0001]. FIG. 39(c) shows the cathodoluminescence spectra taken from point B in FIG. 38. In this case, the spectrum can be deconvoluted into two peaks, one from the MQW emission at 356 nm and another at 364 nm attributed to emission from the GaN template. Again the data support that MQWs whose surfaces are not perpendicular to the [0001] direction have emissions which are blue-shifted with respect to the bulk as well as intense luminescence due to the significant reduction of the QCSE. FIG. 39(d) shows the cathodoluminescence spectra from point C of FIG. 38. Again, the luminescence occurs at 356 nm consistent with QW emission not suffering from the QCSE.

EXAMPLE XI

Formation of GaN p-n Junction LED Structure on a Textured GaN Template Grown Along the Polar Direction A highly conductive Mg-doped p-GaN (hole concentration $\sim 10^{18}$ cm$^{-3}$) of thickness ~0.5 micrometers was deposited by MBE on top of the n-type auto-doped (electron concentration $\sim 10^{19}$ cm$^{-3}$ is typical) textured GaN template. The p-type GaN film was formed using an RF plasma source to activate molecular nitrogen and Knudsen effusion cells to evaporate the Ga and Mg. Growth took place at extreme Ga-rich conditions, which helps the incorporation of Mg at relatively high substrate temperatures (700° C.-800° C.). Alternatively, the p-type layer could have been grown using NH3 as the nitrogen source. A similar p-type layer could also have been grown by the MOCVD or the HVPE methods. FIG. 12 shows a wafer-level electroluminescence spectrum of a GaN p-n junction structure made on a textured GaN template. This spectrum was taken at room temperature under current injection of 80 mA.

EXAMPLE XII

Growth and Characterization of GaN/AlGaN MQW LEDs

The majority of the work on III-nitrides reported in the literature involves the heteroepitaxial growth of these materials on either (0001) sapphire or 6H—SiC substrates by various deposition methods. Materials and devices grown on these substrates contain a high density of threading defects (dislocations and inversion domain boundaries). Furthermore, the [0001] orientation is a polar direction in the noncentrosymmetric wurtzite structure, which gives rise to internal electric fields in heterostructures due to spontaneous and piezoelectric polarizations. While such polarization effects may be desirable in some type of devices (e.g. piezoelectric doping in FETs), they may be undesirable for emitters based on multiple quantum well (MQW) structures due to the QCSE. This effect causes a red-shift in QW emission due to the distortion of the quantum wells, and also results in reduced quantum efficiency because the electron and hole wave functions are separated in space (see FIG. 40a).

Homoepitaxial growth has been demonstrated for GaN/AlGaN MQWs on free-standing (19-10) GaN substrates (M-plane), as well as for similar MQWs grown on sapphire (19-12) (R-plane) which leads to films along the [11-20] direction. Both the [10-10] and the [11-20] directions have the polarization vectors in the planes of the MQWs. As indicated in FIG. 40b, photoluminescence peak position of AlGaN/GaN MQWs follows square-well behavior for those grown along the non-polar directions while similar MQWs with the polar direction show a significant red-shift. The luminescence emission efficiency was about 20 times larger for the QWs grown along non-polar directions for quantum wells more than 5 nm thick.

Growth and Characterization of GaN Templates by HVPE

Growth and characterization of GaN templates by the HVPE method was reported by Cabalu and co-workers, which is hereby incorporated by reference in its entirety.

GaN templates (both with smooth and randomly textured surfaces) were grown under high growth rate conditions ranging from 30-200 μm/hr, which was controlled by the NH3/Group III precursors flow ratios of 10 to 300. During the growth of the templates, a three-step growth method was employed. This consisted of a GaCl pretreatment step done at 1000° C., followed by growth of a low temperature GaN buffer at temperatures between 550° C. to 650° C., and finally growth of the high temperature GaN epilayer.

The templates were characterized by scanning electron microscopy (SEM), photoluminescence, reflectance and Hall-effect measurements. Photoluminescence measurements were done using a He—Cd laser as the excitation source, while the reflectivity measurements were done using a 150 W Xenon lamp as a broadband light source.

Figure 8C:
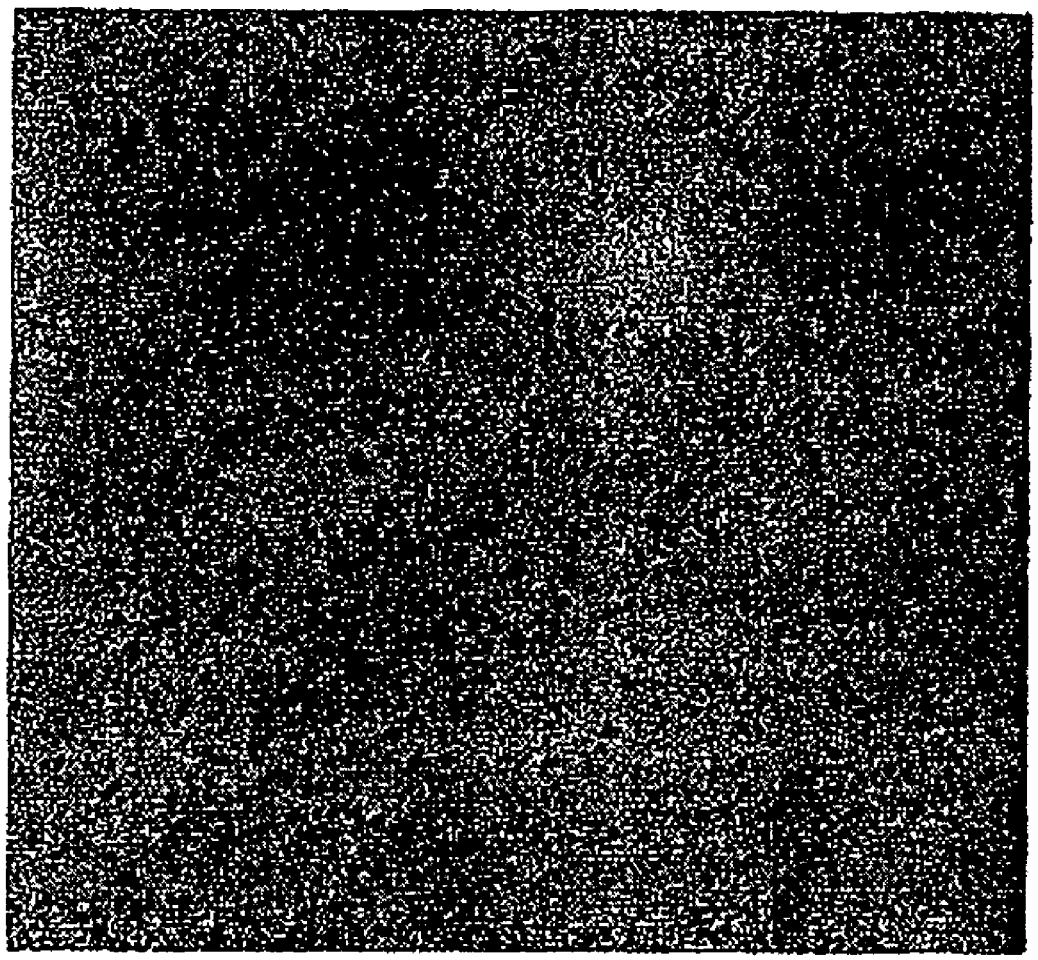
FIG. 8C shows surface morphology by AFM of the smooth GaN template of FIG. 8b.

FIG. 8 shows a SEM image of a smooth (FIG. 8b) and a textured (FIG. 8a) GaN template. These images were taken with the sample tilted 30° with respect to the electron beam. The degree of surface texture on the templates was found to depend on the amount of GaCl arriving at the growth front, which also controls the growth rate of the film. The atomic force microscopy surface morphology of the smooth GaN template is shown in FIG. 8c. As can be seen from these results, the film was atomically smooth and it was grown under the step-flow growth mode.

FIG. 41(a) shows a 100 μm² AFM scan of a textured template surface. Depth analysis of the AFM data (FIG. 41(b)) shows a Gaussian distribution (random distribution) of surface roughness. GaN templates with various degrees of surface texture were produced with average depths ranging from 800 nm to 3 μm.

The reflectivity of the textured template described in FIG. 8a was measured to be below 1% between 325 nm and 700 nm. That is, almost all the incident light from the broad band light source is coupled-in to the GaN textured template. This should be contrasted with the reflectivity of a smooth film, which is about 18%.

The electron mobility versus electron concentration for the investigated textured templates is shown in FIG. 42. As can be seen from the data, these GaN templates were all heavily auto-doped n-type and thus suitable for bottom contact layer in GaN LEDs.

The room temperature photoluminescence (PL) from two GaN templates, grown by the HVPE method, one with atomically smooth surface, and the other with a randomly textured surface is shown in FIG. 9. The two samples were measured under identical conditions using a 10 mW He—Cd laser. The peak photoluminescence intensity of the sample with the textured surface was approximately 55 times larger than the photoluminescence intensity of the sample with smooth surface.

Figure 43A:
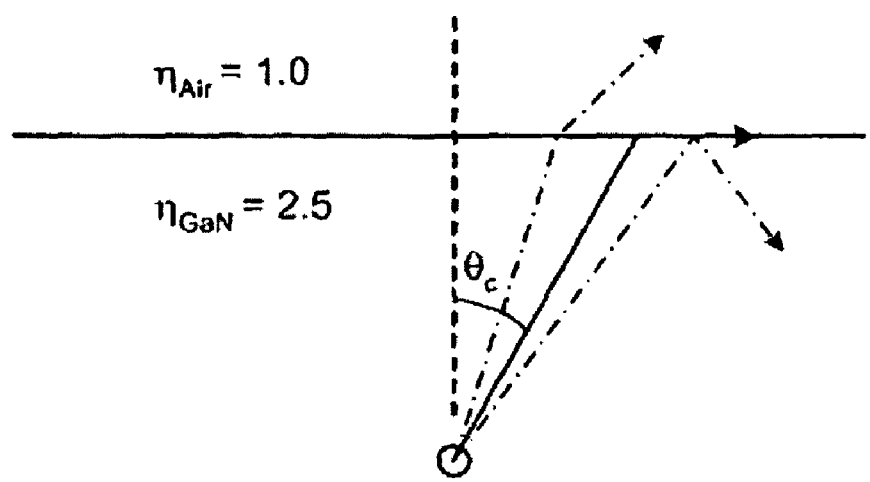
FIGS. 43a and 43b illustrate the analysis of photon escape probability for smooth (FIG. 43a) and textured (FIG. 43b) surfaces.
Figure 43B:
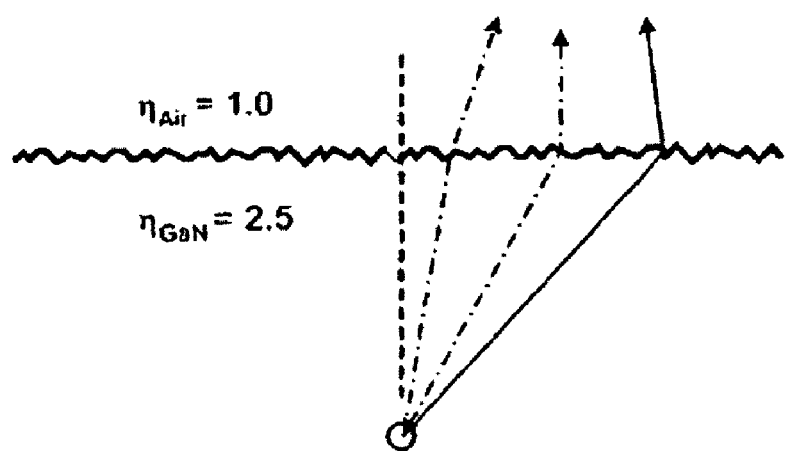

The significant enhancement of the photoluminescence intensity from the randomly textured GaN surface is attributed partly to the enhanced light extraction through the textured surface. Due to the random texturing of the surface, there is an increase in the escape probability of a single photon since the escape cone is not limited by the one defined by the indices of refraction of the semiconductor and air. This is because the index of refraction in the textured template varies gradually along the optical axis from the value of 2.5, corresponding GaN, to 1.0, corresponding to air. In other words, there are additional escape angles available for each emitted photon due to the random texture at the interface. This is analogous to the transmittance through a diffraction grating, wherein the grating imparts a phase shift to the incident wave and bends the wavefront at specific angles depending on the wavelength of the incident light [9]. In this case, the phase shift is controlled by the periodic variation of thickness (or periodic "surface texture") of the grating material at the grating/air interface. In the case of the textured GaN templates, the texture of the surface is not periodic, but random, and this creates random phase shifts across the interface. This leads to escape angle randomization that effectively increases the photon escape probability. Thus, the surface texture allows for more escape angles that are not within the critical angle as defined using a smooth interface as illustrated in FIG. 43b).

If the extraction efficiency of the emitted photoluminescence from the textured GaN template is 100%, then under the assumption of equal IQE of the smooth and texture templates, the ratio of the photoluminescence intensity from the textured and smooth templates should have been 25. However, the data shown here indicate that this ratio is equal to 55. This implies the IQE of the textured GaN template should be at least two times higher than that of the smooth GaN template. The IQE from the textured template actually should be more than a factor of two greater than that of the smooth template because it is unlikely that the extraction efficiency from the textured template is exactly 100%. In theory, the disorder associated with the textured surface leads to a certain degree of potential fluctuations and thus excitons are trapped in local potential minima. This leads to an enhanced spontaneous emission probability due to exciton localization.

Growth and Characterization of GaN/AlGaN MQWs by MBE on GaN Templates with Variable Surface Texture.

The growth and characterization of GaN/AlGaN MQWs on GaN templates with variable surface texture are described by Cabalu et al., which is hereby incorporated by reference in its entirety.

Ten pairs of GaN/Al0.2Ga0.8N MQWs were deposited by MBE on both textured as well as smooth GaN templates with thicknesses 7 nm for the wells and 8 nm for the barriers, at a substrate temperature of 750° C. AFM studies of the MQWs on the textured template indicate that the MQWs have coated the textured GaN template conformally.

Figure 44:
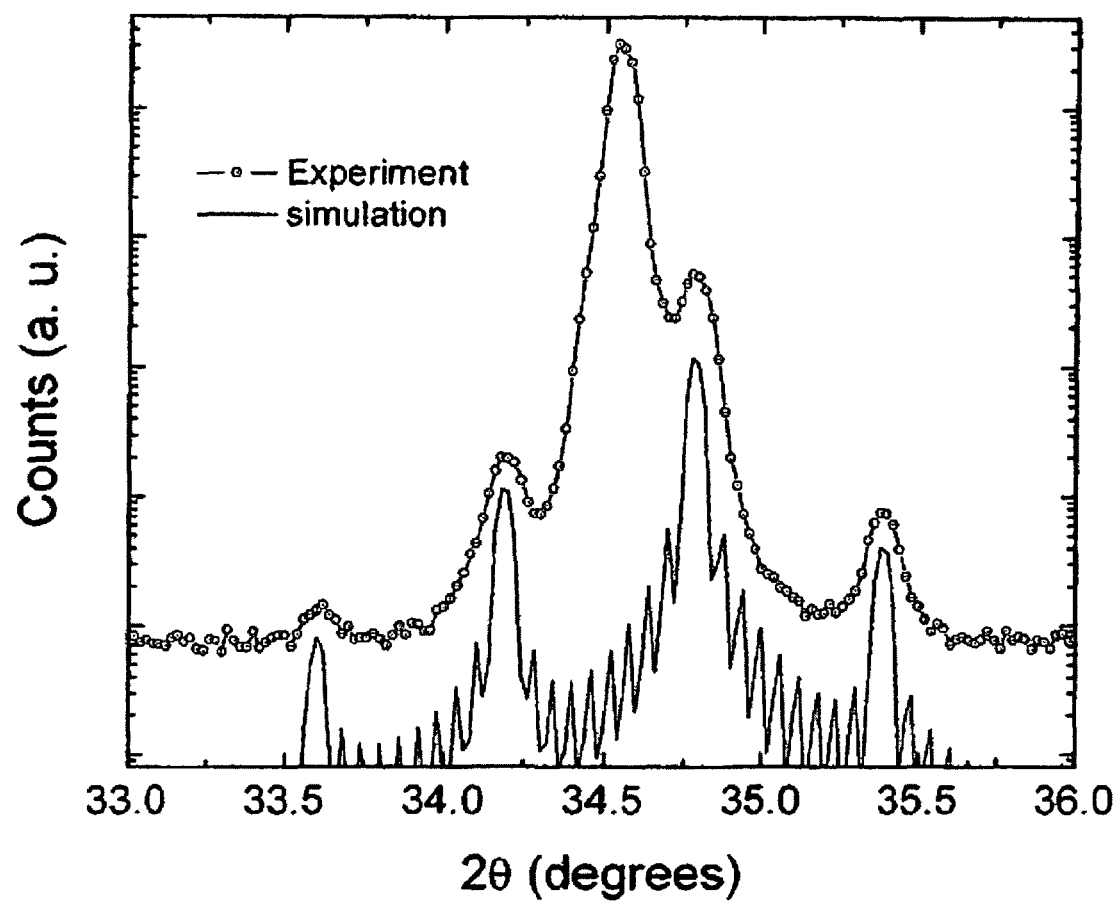
FIG. 44 shows the x-ray diffraction pattern around the (0002) Bragg peak for ten period GaN (7 nm)/Al0.2Ga0.8N (8 nm) MQWs grown on a GaN textured template.

The x-ray diffraction pattern around the (0002) Bragg peak for ten period GaN (7 nm)/Al0.2Ga0.8N (8 nm) MQWs grown on a GaN textured template is shown in FIG. 44. This figure shows further evidence that MQWs can be formed on such randomly textured templates as shown by the appearance of the primary and higher order superlattice peaks. Furthermore, observation of these peaks indicates an abrupt interface between the AlGaN barriers and the GaN wells. FIG. 44 also shows the simulation result using the kinematical scattering model. Assuming that the AlGaN barriers and GaN wells have equal growth rates, simulation results determined a period of 15.4 nm, corresponding to 8.2 nm barrier width and 7.2 nm well width. From the position of the zeroth order superlattice peak and assuming the validity of Vegard's law in this material system, the Al composition in the AlGaN barriers was determined to be ~20%. These values are in agreement to the aimed thicknesses (8 nm barrier and 7 nm well widths) and alloy composition (20% Al) during the growth.

The photoluminescence spectra from the MQWs grown on the smooth and textured GaN templates are shown in FIGS. 11 and 12, respectively. The photoluminescence spectra from the MQWs grown on the smooth GaN template (FIG. 11) showed primarily the photoluminescence from the GaN template at 364 nm and an extremely small and broad luminescence peak at about 396 nm. Further verification that this small peak is due to luminescence from the QWs was produced by measuring the cathodoluminescence spectra of the same sample using low acceleration voltage (4 kV) in order to probe the QWs. These data are shown in the inset of FIG. 11. Indeed the data show, in addition to luminescence from the GaN template at 364 nm, a broad peak occurring at 396 nm which corresponds to cathodoluminescence from the QWs. Thus the luminescence from the QWs is red-shifted with respect to the bulk and is significantly reduced in magnitude. Both of these results are consistent with the quantum confined Stark-effect (QCSE) since these QWs are perpendicular to the [0001] polar direction.

FIG. 12 shows the photoluminescence spectra from the MQWs grown on the textured GaN template. For comparison, the photoluminescence spectrum from the textured GaN template is shown in the same figure. It is important to note that the photoluminescence spectra from the MQWs were blue-shifted with respect to the bulk GaN photoluminescence spectra and also the luminescence intensity was significantly higher than that from the textured GaN template. Both of these results are consistent with square quantum wells. In other words, because the quantum wells on the textured GaN templates are not perpendicular to the [0001] direction, they are not distorted by internal fields associated with polarization.

A direct comparison of the peak photoluminescence of the MQWs in FIG. 11 and FIG. 12 indicates that the photoluminescence intensity from the "wrinkled" MQWs is ~700 times higher than that from the smooth MQWs. This significant enhancement of the photoluminescence from the "wrinkled" QWs is attributable partly to enhancement in light extraction through the textured surface and partly to enhanced spontaneous emission rate. If the enhancement due to light extraction from the textured surface is assumed to be a factor of 25 higher than that from the smooth surface, then there is an additional factor approximately 30 which must be due to the enhancement of the spontaneous emission rate. The evidence discussed earlier suggests that the increase in the IQE is due to the reduction of the QCSE, since the quantum wells are not perpendicular to polar [0001] direction. Further enhancement in IQE is also expected due to quantum carrier confinement from "wedge" electronic eigen-modes. The latter has its origin to the transition in the carrier behavior from 2D to 1D due the V-shaped intersecting planes of the quantum wells, and thus the "wedges" behave as quantum wires, which cause localization and trapping of excitons.

EXAMPLE XIII

Phosphorless White LEDs

This example describes a method of making GaN-base white LEDs or LEDs of various colors without using an emitter such as phosphorus.

Figure 14A:
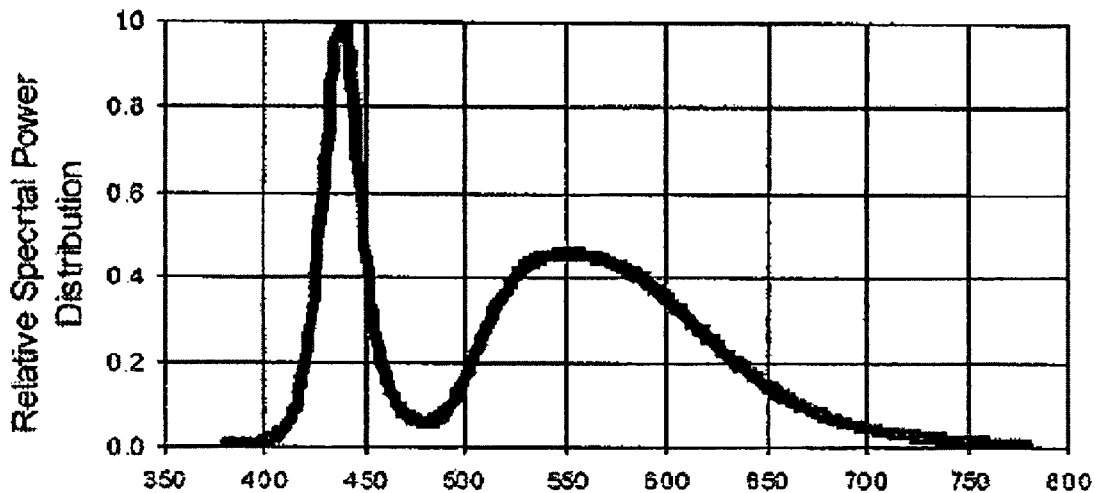
FIG. 14a shows the emission spectrum of a commercially available white LED (Lumileds LXHL-BW02; Technical Data Sheet DS25)

FIG. 14a shows the spectrum of commercially available white LEDs taken from LumiLeds Technical Data Sheet DS25. This white LED is based on a nitride LED structure emitting approximately at 430 nm and exciting a YAG phosphor emitting a broad spectrum with a peak at 550 nm. Fabricated LED structures based on textured InGaN/GaN MQWs were grown on textured GaN templates produced by HVPE. These LEDs have similar spectra as the one shown in FIG. 14a without the employment of phosphor.

Figure 14B:
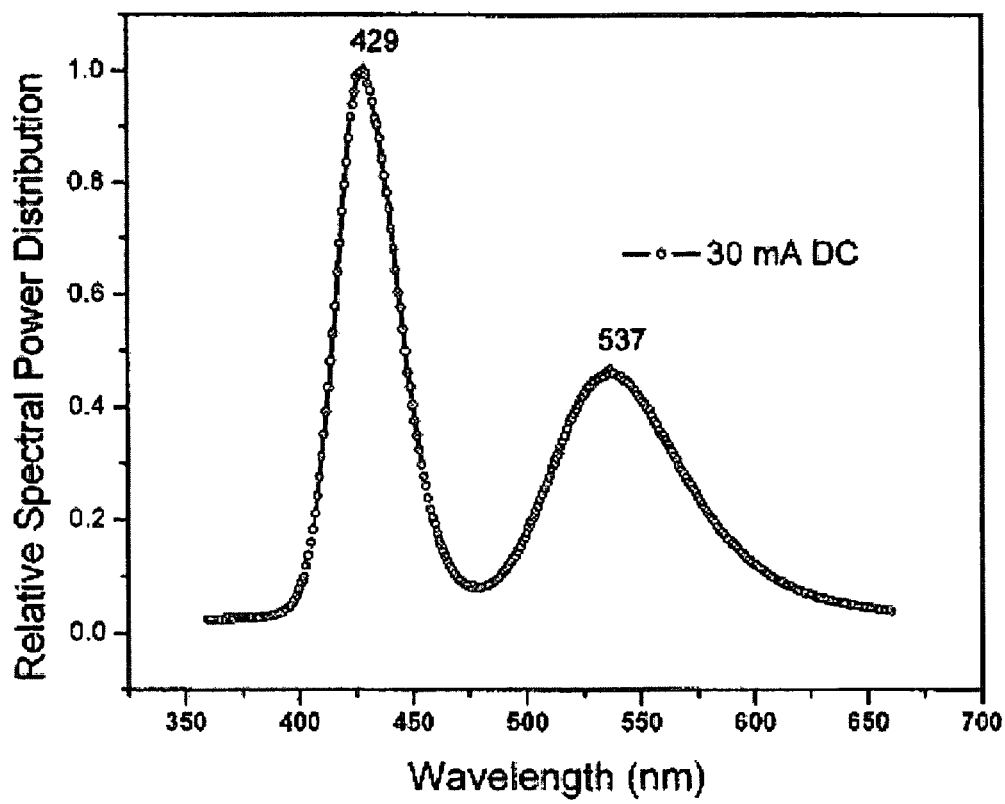
FIG. 14b shows the electroluminescence spectrum of an LED of the invention (textured InGaN/GaN MQWs grown on a textured GaN template produced by HVPE), measured under a DC injection current of 30 mA.
Figure 14C:
FIG. 14c shows the radiating white GaN LED of FIG. 14b under a DC injection current of 25 mA.

FIG. 14b shows the electroluminescence spectra of such an LED. The spectra were measured under DC injection current of 30 mA. These spectra have remarkable similarity to that of the commercially available white LEDs shown in FIG. 14a although no phosphor was used for the generation of the broad emission at 537 nm. FIG. 14c shows the LED whose spectrum is shown in FIG. 14b using a DC injection current of 25 mA.

Figure 15A:
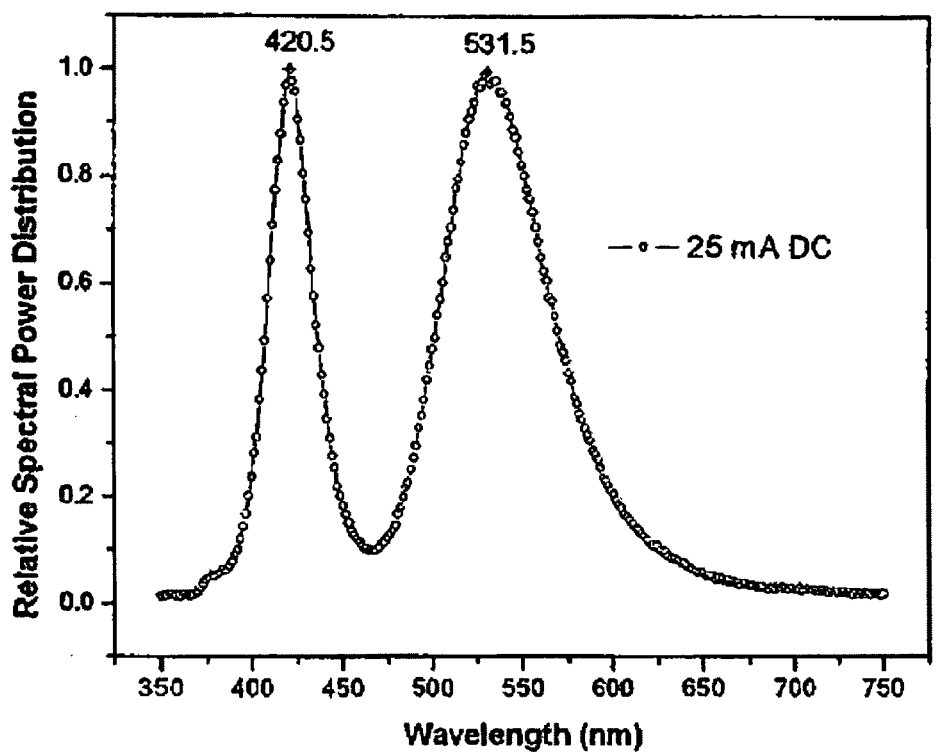
FIGS. 15a-15c show the electroluminescence spectra of LEDs similar to that used to obtain the data of FIG. 14b, using the indicated values of DC injection current.
Figure 15B:
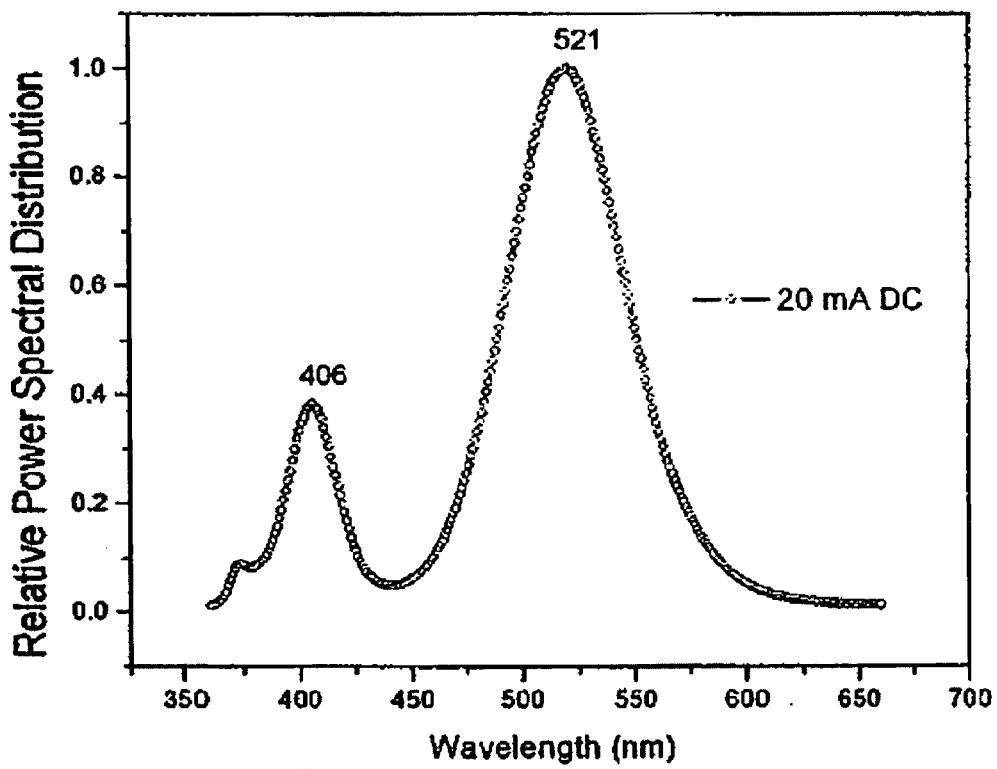
Figure 15C:
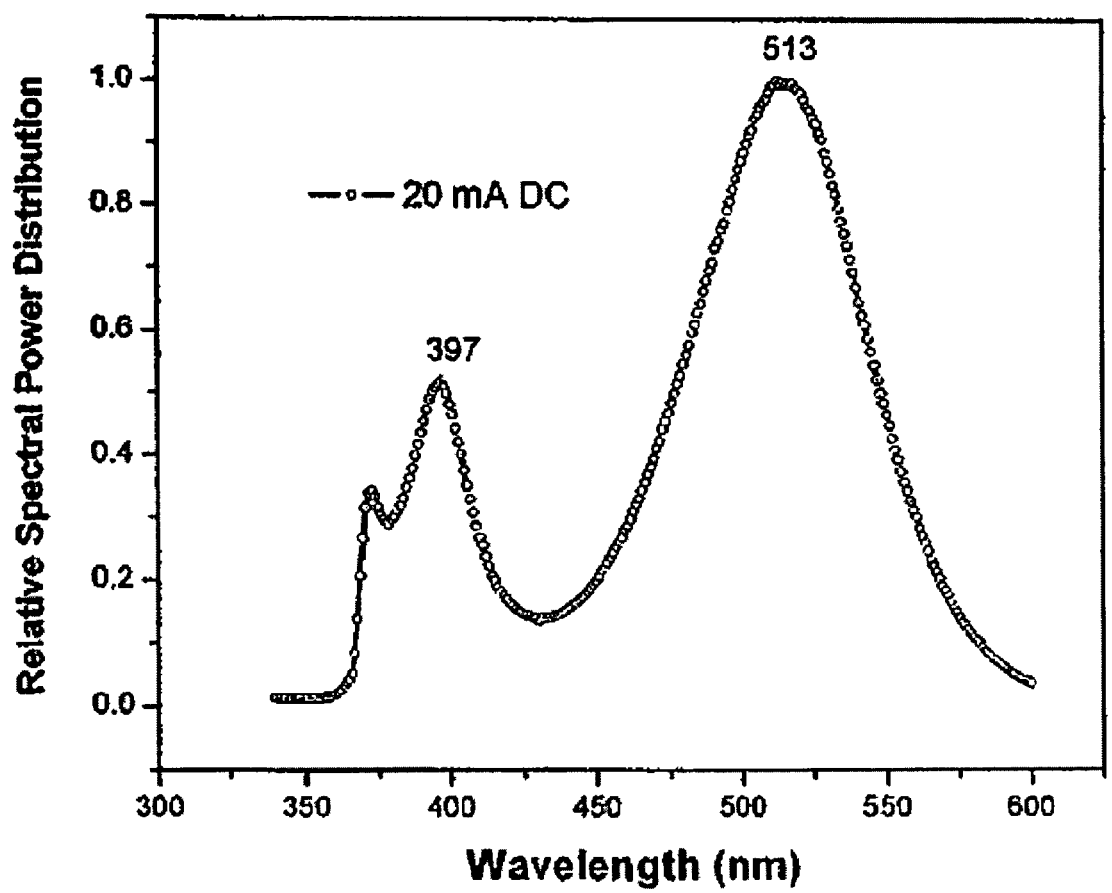

Relative intensity between these two peaks depended on the level of current injection. The high-energy band increased with the bias current. The same LED could produce different colors, since the color depends on the relative ratio of the two bands. In FIG. 15a-15c, the spectra of other LED devices showing similar behavior are presented.

Figure 16:
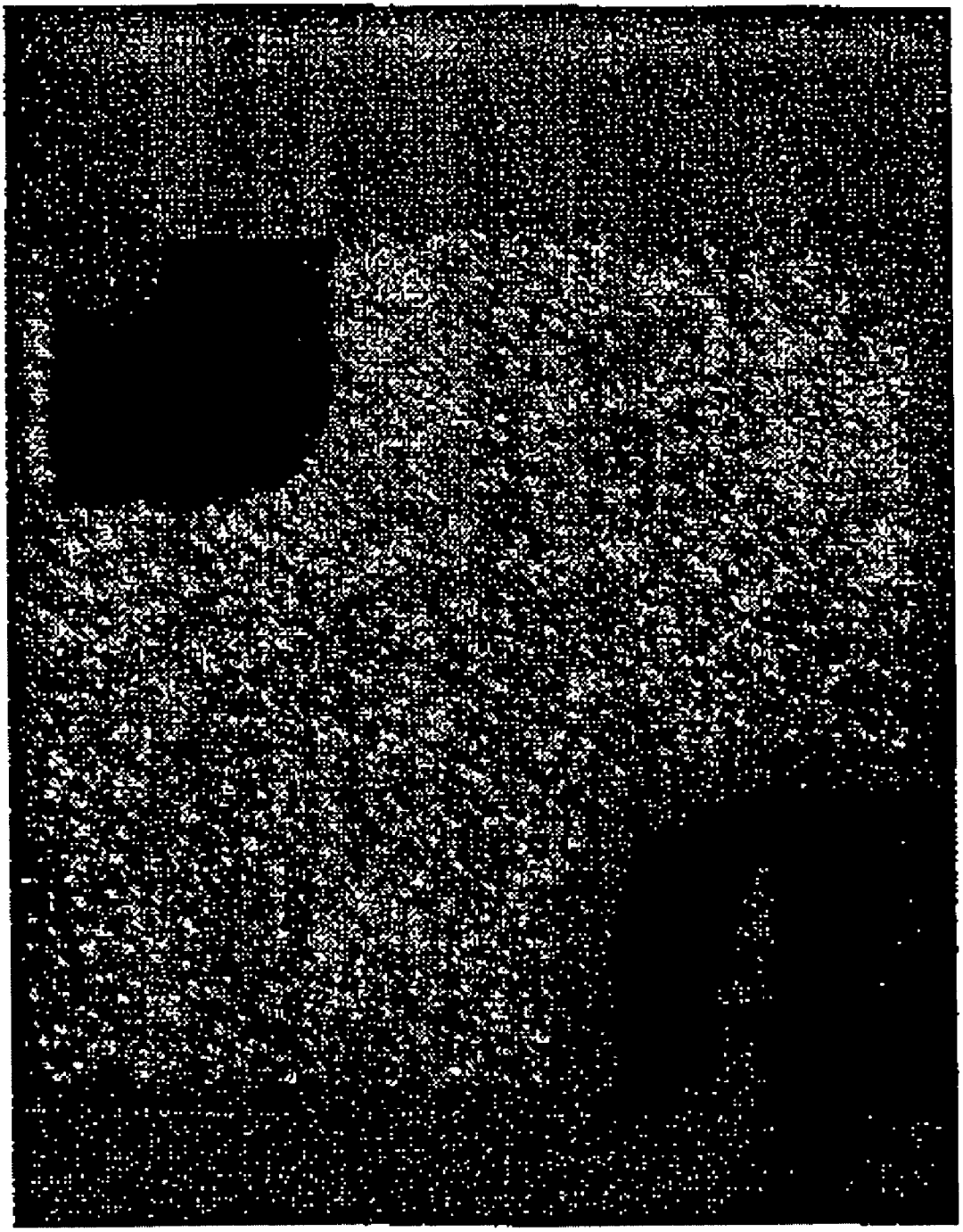
FIG. 16 is a photograph of an LED under conditions described in FIG. 15b, showing that much of the wafer emits green light, whereas certain parts emit blue light.

FIG. 16 shows a photograph of an LED structure taken under DC injection as described in FIG. 15b. As expected, the LED has a greenish color since the green band is the more dominant one. However, certain parts of the wafer emitted blue light.

Figure 17:
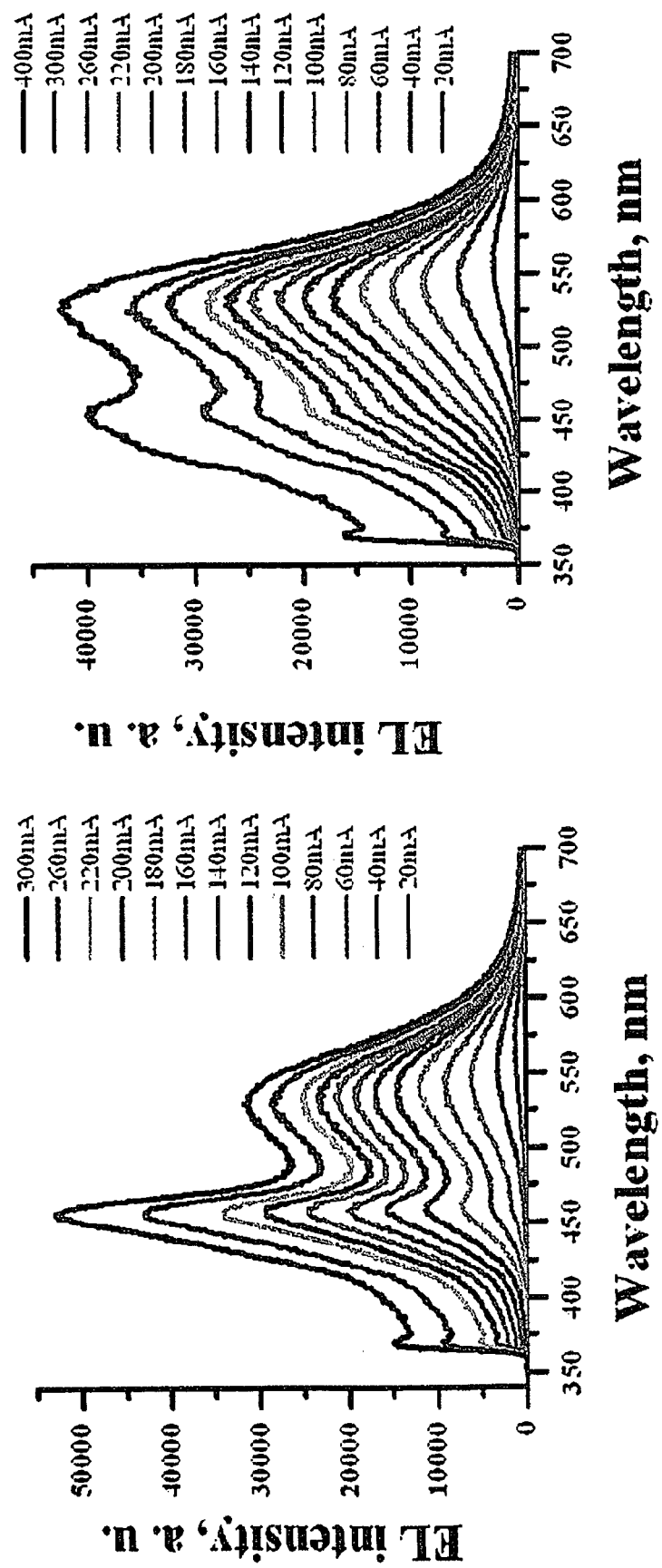
FIG. 17 shows electroluminescence spectra of LED structures taken from parts of a wafer having different texture; The DC injection current is listed on the right side of each graph in the same order as the corresponding curves.
Figure 18:
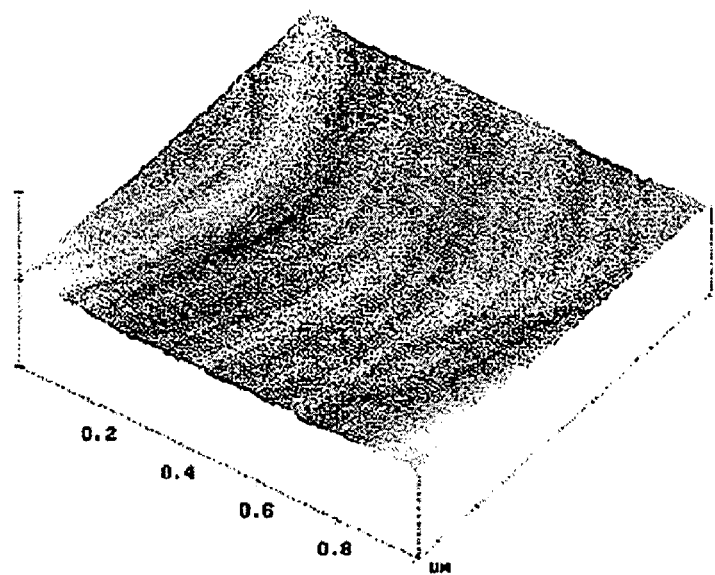
FIG. 18 is an atomic force microscope (AFM) image of a 50 micron thick atomically smooth GaN template grown by HVPE; The visible striations are steps corresponding to a change in thickness of approximately 2 Å.

In FIG. 17, the dependence of electroluminescence spectrum on the DC injection current is demonstrated for two different LEDs. The LED on the right has a greater proportion of flat surface.

EXAMPLE XIV

Fabrication of Textured Templates Using MBE

Figure 45A:
FIGS. 45a and 45b are smooth (45a) and randomly textured (45b) GaN templates prepared by MBE; The random surface texturing of FIG. 45b was produced by growing the GaN film under nitrogen-rich conditions.
Figure 45B:
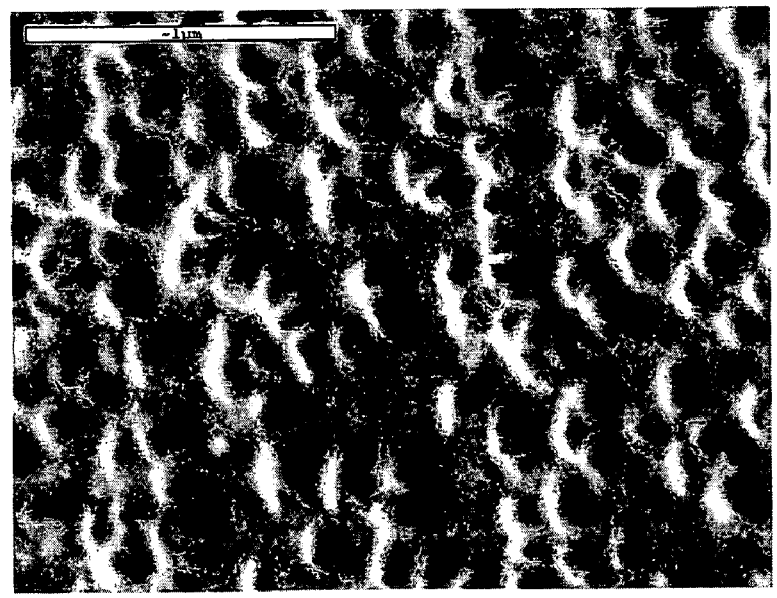

GaN templates were made by plasma-assisted MBE, in which gallium is reacted with atomic nitrogen obtained by passing molecular nitrogen through a plasma source. Both samples were grown at 825° C. The nucleation was identical, except that growth under gallium-rich conditions (flux of gallium much greater than flux of active nitrogen) resulted in a smooth surface (FIG. 45a) and growth under nitrogen-rich conditions (flux of active nitrogen much larger than the flux of gallium) resulted in a randomly textured surface (FIG. 45b).

EXAMPLE XV

Dependence of QCSE on Quantum Well Layer Thickness

Figure 46A:
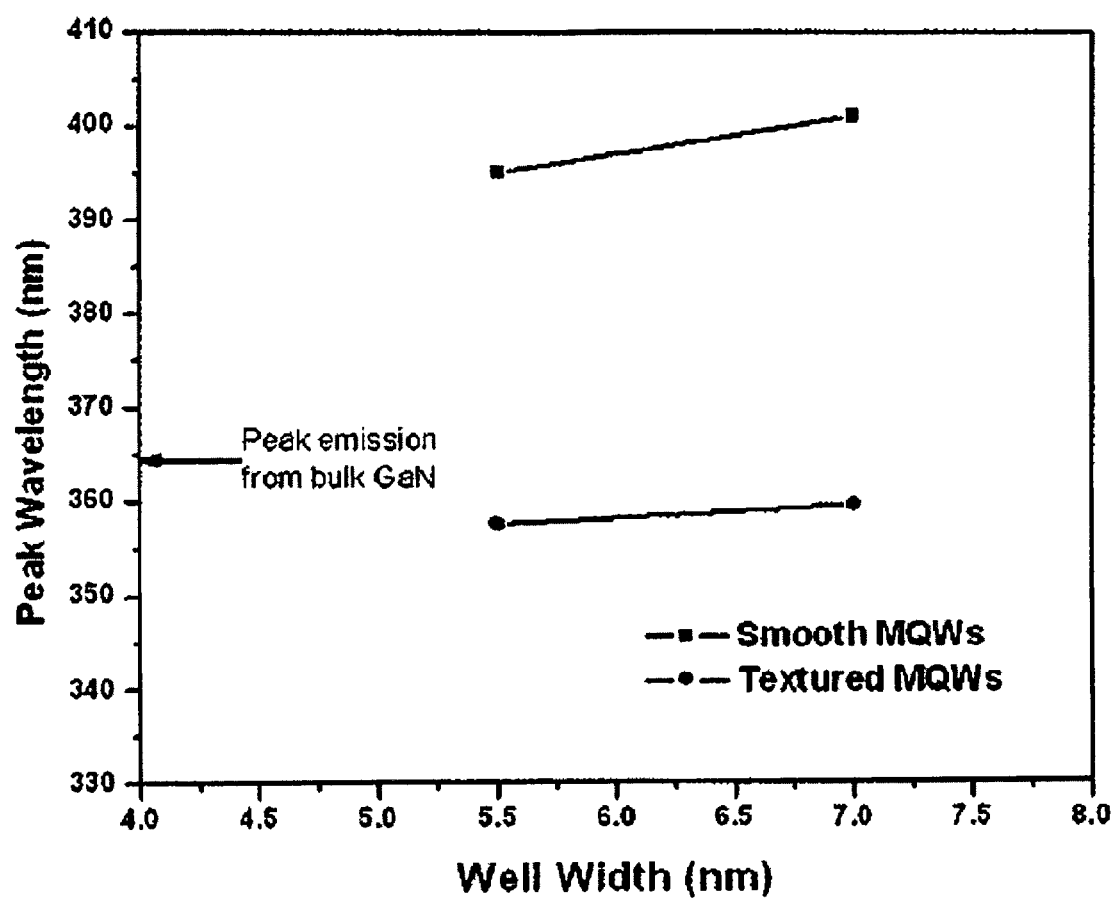
FIGS. 46a and 46b show the photoluminescence emission peak (46a) and luminescence intensity (46b) for quantum well layers of different thickness.
Figure 46B:
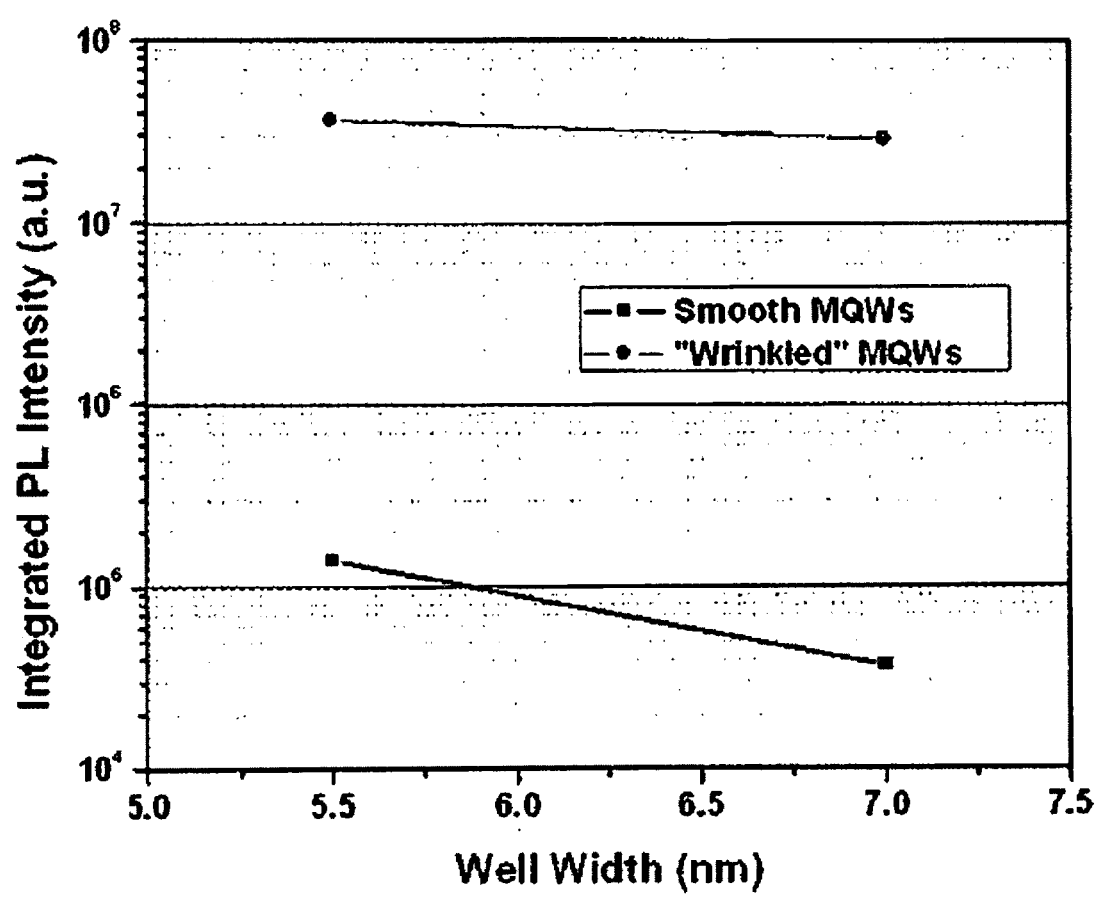

Since the QCSE is expected to depend on the width of the quantum well layers, the PL spectra of quantum well layers with thicknesses of 5.5 and 7.0 nm were investigated. FIGS. 46a and 46b show the dependence of the emission peak and the luminescence intensity, respectively, versus well width for both smooth and textured GaN/Al0.2Ga0.8N MQWs. As seen in FIG. 46a, the PL spectra from the smooth MQWs were redshifted, while those from the textured MQWs were slightly blue-shifted with respect to the bulk GaN emission. Correspondingly, the PL intensity from the smooth MQWs increased as the well width became narrower, while there was only a slight increase from the textured MQWs, as shown in FIG. 46b. These results are qualitatively consistent with the QCSE.

EXAMPLE XVI

Effects of Internal Electric Fields and Polarization in Quantum Well Layers

Figure 47A:
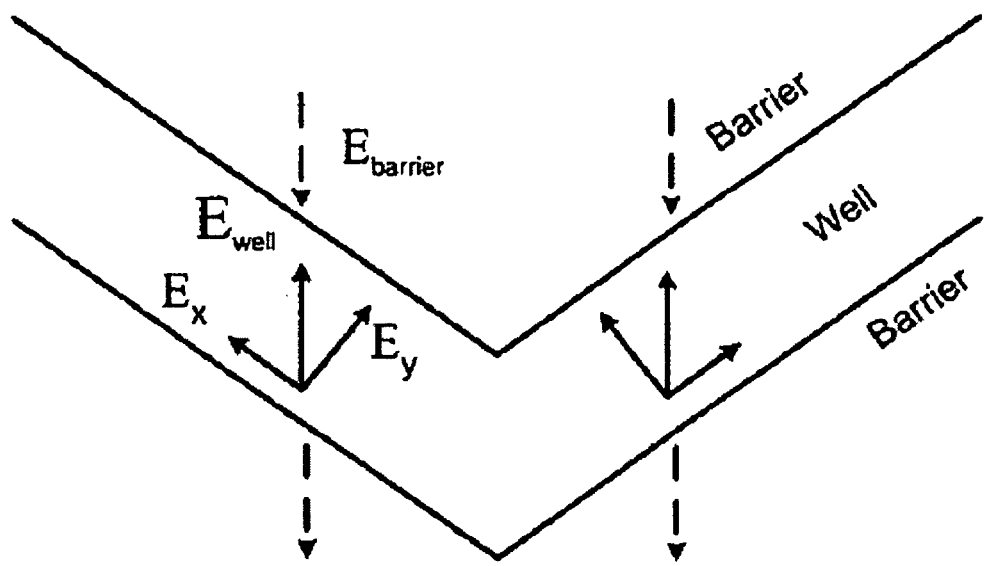
FIG. 47a shows polarization and internal electric field effects in a wrinkled quantum well layer.
Figure 47B:
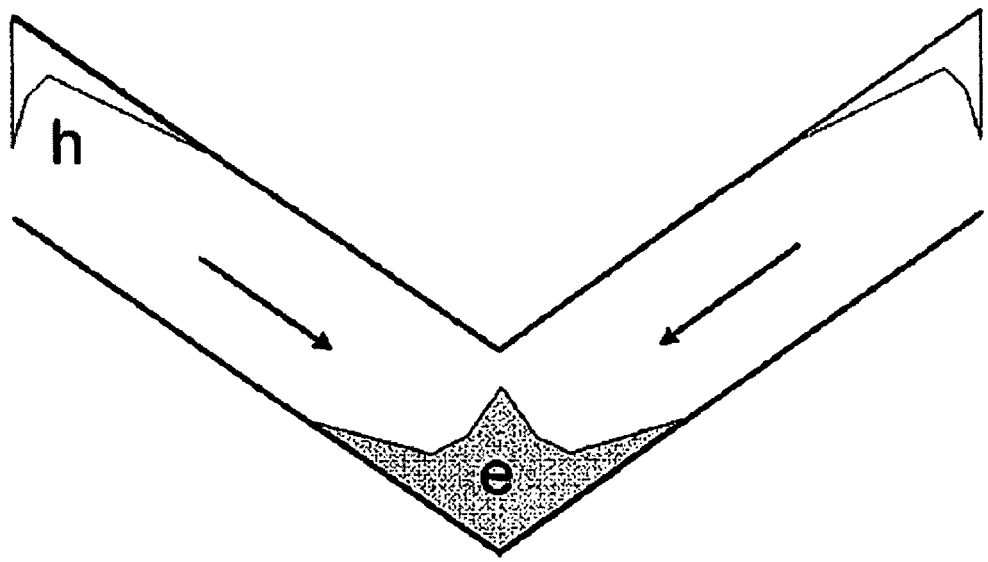
FIG. 47b shows electron accumulation at the base of inclined sections of a wrinkled quantum well layer.
Figure 48:
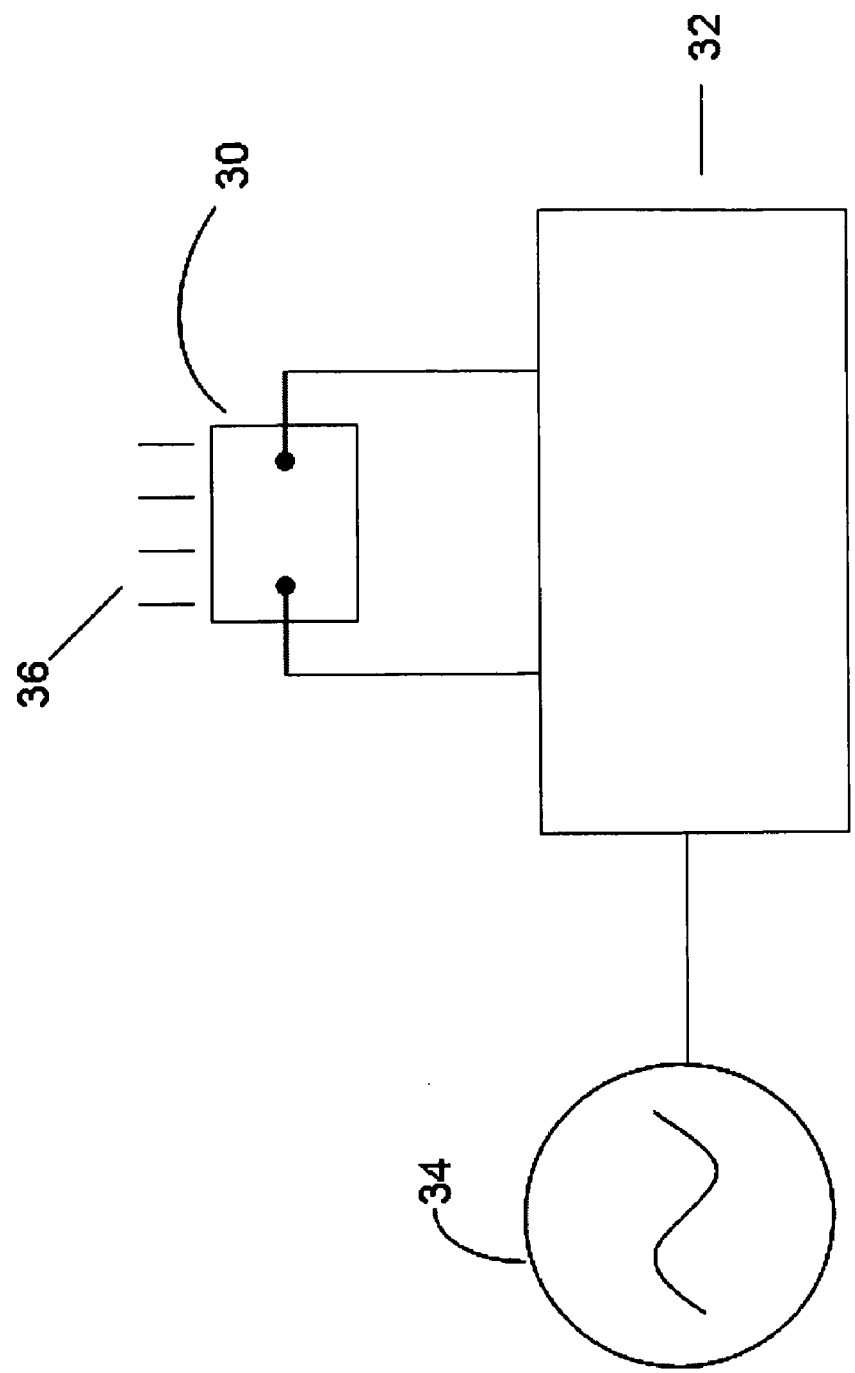
FIG. 48 is a schematic representation of a variable color indicator embodiment.
Figure 49:
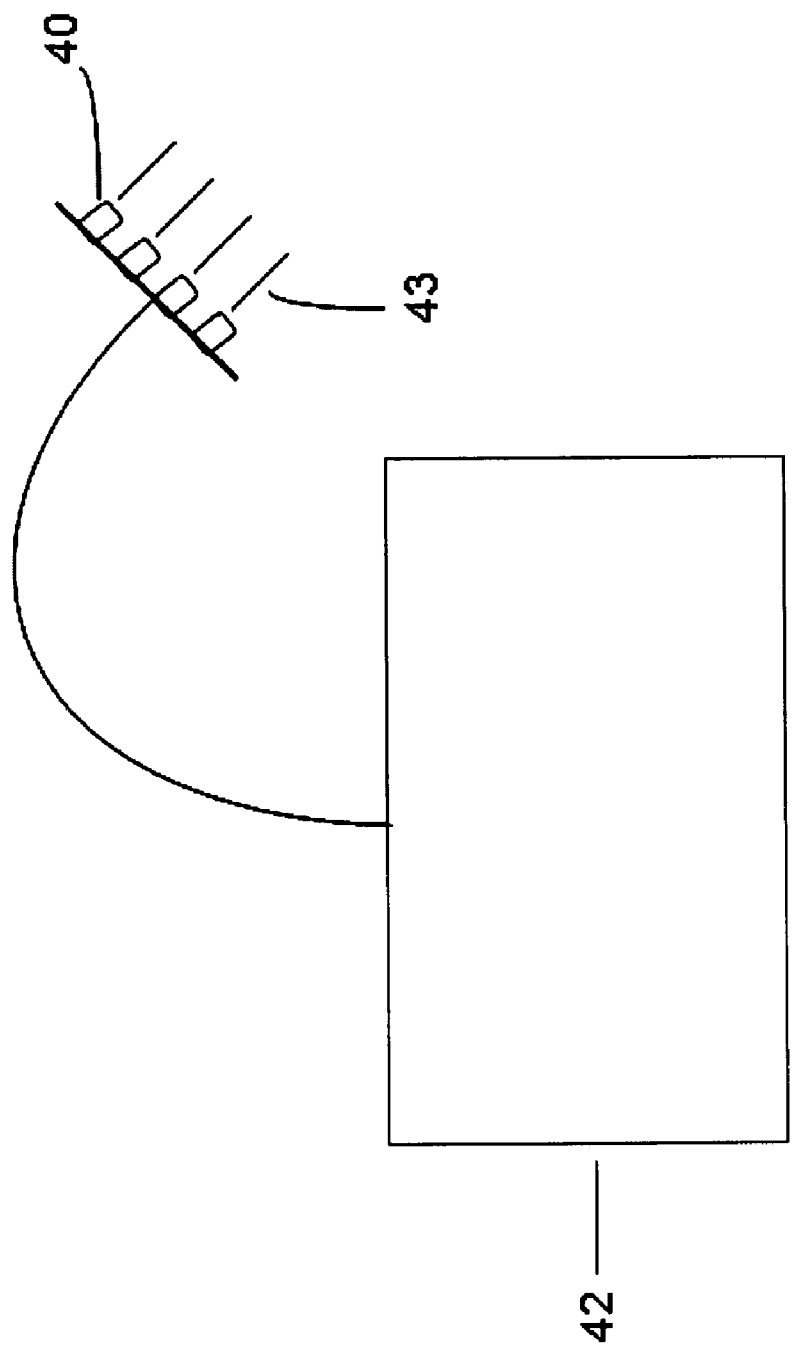
FIG. 49 is a schematic representation of a variable color illumination device embodiment.
Figure 50:
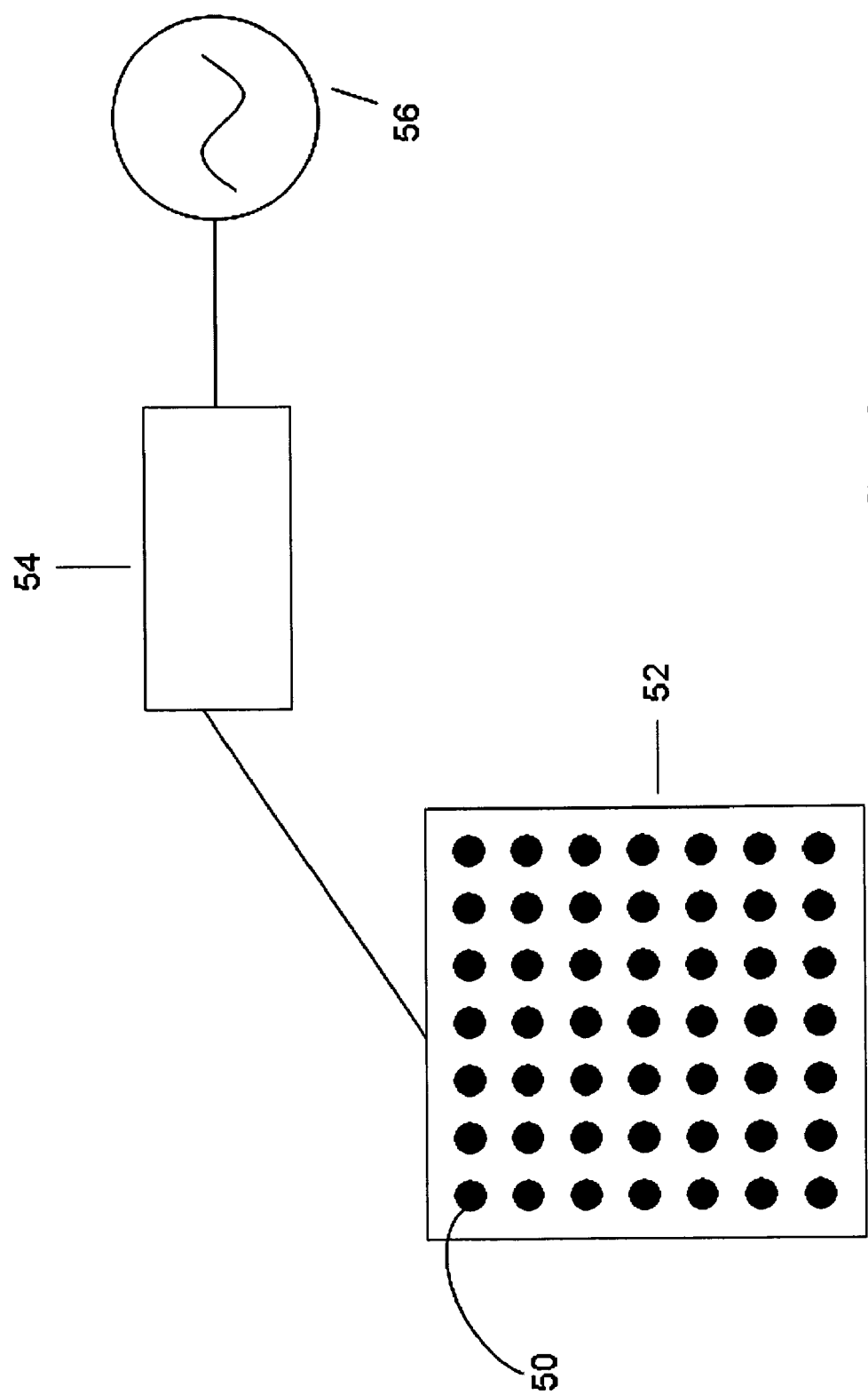
FIG. 50 is a schematic representation of a color display embodiment.
Figure 51:
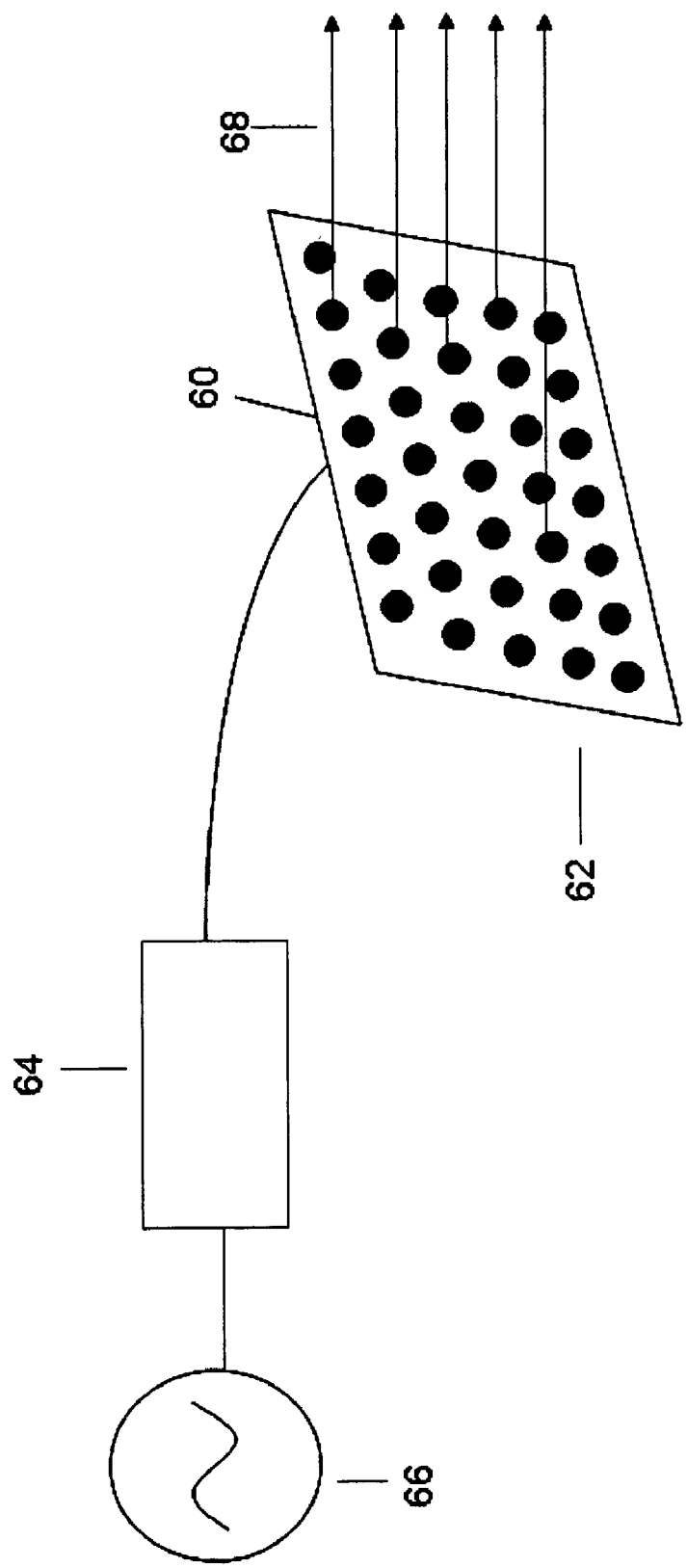
FIG. 51 is a schematic representation of a color projector embodiment.

The enhancement in spontaneous emission at the inclined sections of the quantum well layers can be explained by the transition in carrier behavior from 2D to 1D (and potentially 0D) due the V-shaped intersecting planes of the quantum wells. Thus, the inclined sections can behave as quantum wires (or quantum dots), causing localization and trapping of excitons. In addition, due to polarization component parallel to the quantum well layers, as shown in FIG. 47a, electron accumulation at the wedges can be expected, as shown in FIG. 47b. Depending on the equilibrium charge density at these wedges, enhancement in spontaneous emission may result from plasmonic effects.

While the present invention has been described herein in conjunction with a preferred embodiment, a person of ordinary skill in the art, after reading the foregoing specification, will be able to effect changes, substitutions of equivalents and other alterations to the devices and methods that are set forth herein. Each embodiment described above can also have included or incorporated therewith such variations as disclosed with regard to any or all of the other embodiments. It is therefore intended that protection granted by Letter Patent hereon be limited in breadth only by the definitions that are contained in the appended claims and any equivalents thereof.

REFERENCES

Cabalu et al., "Enhanced Light Extraction and Spontaneous Emission From Textured GaN Templates Formed During Growth by the HVPE Method", State of the Art Program on Compound Semiconductors XLI and Nitride and Wide Bandgap Semiconductors, Sensors and Electronics V, Electrochemical Society Proceedings, Vol. 2004-06, pp. 351.

Cabalu et al., "Enhanced Light Extraction and Spontaneous Emission From "Wrinkled" Quantum Wells Grown By Plasma-Assisted Molecular Beam Epitaxy (PAMBE)", Presented at the 22nd North America-Molecular Beam Epitaxy Conference, Banff, Alberta, Canada, Oct. 10-13, 2004, p. 110.

Iyer et al., "Growth and Characterization of Non-polar (11-20) GaN and AlGaN/GaN MQWs on R-plane (10012 Sapphire", Mater. Res. Soc. Symp. Proc., Vol. 743, pp. L3.20 (2003).

Ryu et al., "", IEEE Journal of Selected Topics in Quantum Electronics, Vol. 8, No. 231 (2002).

Tsao, J., "Light Emitting Diodes (LEDs) for General Illumination", An OIDA Technology Roadmap Update (2002).

Windish et. al., "40% efficient thin film surface textured LEDs by optimization of natural lithography", IEEE Trans. Electron Devices, Vol. 47, No. 1492 (2000).

What is claimed is:

1. A semiconductor device for use as an emitter, the device comprising:
a substrate having a smooth surface and comprising a material selected from the group consisting of sapphire, silicon carbide, zinc oxide, silicon, gallium arsenide, gallium nitride, aluminum nitride and aluminum gallium nitride;
a first layer grown on said substrate, said first layer having upper and lower surfaces, the lower surface grown onto and contacting the smooth surface of said substrate,
the first layer comprising a III-nitride semiconductor, wherein the upper surface of the first layer is textured as grown, the texture resulting from the growth process, and
the first layer being n-type doped;
a first contact electrically connected to the first layer;
one or more quantum well layers on respective barrier layers deposited directly on said first layer and textured by the upper surface of the first layer,
the barrier layers comprising a III-nitride semiconductor and the quantum well layers comprising a III-nitride semiconductor; and
an upper layer on said quantum well layers comprising a III-nitride semiconductor separated from the quantum well layers by a further barrier layer, wherein the upper layer and further barrier layer are surface textured by the surface of the adjacent quantum well layer;
the upper layer being p-type doped and having a second contact electrically connected thereto; wherein an electroluminescence spectrum of emissions from the device is controlled in wavelength by passing a varying current through the device between said first and second contacts.

2. The semiconductor device of claim 1, wherein the substrate comprises a material selected from the group consisting of (0001) sapphire, (10-12) sapphire, (10-10) sapphire, (11-20) sapphire, (0001) silicon carbide, (0001) zinc oxide, (111) silicon, (111) gallium arsenide, (0001) gallium nitride and (0001) aluminum nitride and (0001) AlGaN.

3. The semiconductor device of claim 1, wherein the substrate comprises a textured surface on a side away from said first layer.

4. The semiconductor device of claim 1, wherein the substrate comprises a polished surface on a side facing said first layer.

5. The semiconductor device of claim 1, wherein the first layer is a deposition on the substrate resulting from one of hydride vapor phase epitaxy, metal-organic chemical vapor deposition, molecular beam epitaxy, liquid phase epitaxy, laser ablation or a combination of such methods.

6. The semiconductor device of claim 5, wherein the first layer is a result of hydride vapor phase epitaxy of the III-nitride semiconductor material thereon in the presence of excess HCl.

7. The semiconductor device of claim 6, wherein the molar ratio of $NH_3$ to HCl in the hydride vapor phase epitaxy process is from 5:1 to 10:1.

8. The semiconductor device of claim 6, wherein the quantum well layers and barrier layers are the result of molecular beam epitaxy.

9. The semiconductor device of claim 5, wherein the first layer is a result of molecular beam epitaxy in the presence of a molar excess of N over Ga.

10. The semiconductor device of claim 1, wherein one or more quantum well layers are grown by one of hydride vapor phase epitaxy, metal-organic chemical vapor deposition, molecular beam epitaxy, liquid phase epitaxy, laser ablation or a combination of these methods.

11. The semiconductor device of claim 1, wherein the electroluminescence spectrum of the device comprises two or more peaks.

12. The semiconductor device of claim 11, having regions of different thickness interspersed within each quantum well layer.

13. The semiconductor device of claim 11, wherein one of said peaks is in the range of 390-450 nm and the other peak is in the range of 500-600 nm.

14. The semiconductor device of claim 11, wherein increasing the current through the device between said first and second contacts increases the electroluminescence at one of said peaks relative to the other.

15. The semiconductor device of claim 14, wherein the peak that increases is in the range of 390-450 nm.

16. The semiconductor device of claim 14, wherein the color temperature of the electroluminescence is blue-shifted by increasing the current through the device between said first and second contacts.

17. The semiconductor device of claim 1 whose electroluminescence is white.

18. The semiconductor device of claim 1 whose electroluminescence is characterized by a color temperature in the range of 2500° K-7500° K.

19. The semiconductor device of claim 1 further comprising a phosphor.

20. The semiconductor device of claim 19, wherein the phosphor has an emission peak in the range of 500-700 nm.

21. A variable color indicator, comprising:
the semiconductor device of claim 1; and
a controller for setting the current through the device between said first and second contacts in response to an input signal, wherein a change in the input signal results in a change in the color of light emitted by the device.

22. A variable color illumination device comprising:
one or more semiconductor devices of claim 1; and
a controller for setting the current through each of the devices between said first and second contacts in response to one or more input signals, wherein a change in the input signals results in a change in the intensity and color of the light emitted by the semiconductor device.

23. The illumination device of claim 22, wherein a plurality of said semiconductor devices are arranged in an array.

24. The illumination device of claim 22 comprising a plurality of said semiconductor devices, wherein each semiconductor device is independently controlled.

25. The illumination device of claim 22 comprising a plurality of said semiconductor devices, wherein the semiconductor devices are controlled in unison.

26. A two-dimensional color display, comprising:
a two-dimensional array comprising a plurality of the semiconductor devices of claim 1; and
a controller for setting the current through each semiconductor device between said first and second contacts in response to an input signal, wherein the input signal results in the formation of a color pattern of light emitted by the semiconductor devices.

27. The color display of claim 26, wherein the color pattern forms an image viewable by looking at the array.

28. The display of claim 27 which forms a still image.

29. The display of claim 27 which forms a moving image.

30. A projector, comprising:
a two-dimensional array comprising a plurality of the semiconductor devices of claim 1; and
a controller for setting the current through each semiconductor device between said first and second contacts in response to an input signal, wherein the input signal results in the formation of a color pattern of light emitted by the semiconductor devices and projected onto a viewing screen.

31. The projector of claim 30, wherein the color pattern forms an image on the viewing screen.

32. The projector of claim 30 which is a still-image projector.

33. The projector of claim 30 which is a motion picture projector.

34. The device of claim 1, wherein the one or more layers having quantum wells are arrayed in a plane having undulations corresponding to the surface texturing of said first layer.

35. The device of claim 1, wherein the texture of the upper surface of the first layer is characterized by an approximately Gaussian distribution of surface depth.

36. The device of claim 35, wherein the average surface depth is in the range of 200 nm to 1.5 µm.

* * * * *

UNITED STATES PATENT AND TRADEMARK OFFICE
CERTIFICATE OF CORRECTION

PATENT NO. : 8,035,113 B2  
APPLICATION NO. : 11/590687  
DATED : October 11, 2011  
INVENTOR(S) : Theodore D. Moustakas et al.

Page 1 of 1

It is certified that error appears in the above-identified patent and that said Letters Patent is hereby corrected as shown below:

In the Specification:

Column 12, line 57, "(19-12)" should read --(10-12)--;

Column 12, line 57, "(19-10)" should read --(10-10)--;

Column 13, line 32, "A" should read --Å--;

Column 23, line 11, "(19-10)" should read --(10-10)--;

Column 23, line 13, "(19-12)" should read --(10-12)--; and

Column 24, line 37, "43b)." should read --43b.--.

Signed and Sealed this  
Eleventh Day of June, 2013

Teresa Stanek Rea  
*Acting Director of the United States Patent and Trademark Office*